(12) United States Patent
Duncan et al.

(10) Patent No.: US 10,810,728 B2
(45) Date of Patent: Oct. 20, 2020

(54) METHOD FOR USING A VISION SYSTEM TO EVALUATE SHIELD TRIMS ON SHIELDED CABLES

(71) Applicant: The Boeing Company, Chicago, IL (US)

(72) Inventors: Grace L. Duncan, Seattle, WA (US); Bradley J. Mitchell, Snohomish, WA (US); Damien O. Martin, Everett, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/195,421

(22) Filed: Nov. 19, 2018

(65) Prior Publication Data

US 2020/0160504 A1    May 21, 2020

(51) Int. Cl.
| | | |
|---|---|---|
| *G06T 7/00* | (2017.01) | |
| *G06T 3/40* | (2006.01) | |
| *G06T 7/90* | (2017.01) | |
| *H01B 13/22* | (2006.01) | |
| *H05K 9/00* | (2006.01) | |
| *H01B 13/00* | (2006.01) | |
| *H04N 5/247* | (2006.01) | |
| *H01B 11/10* | (2006.01) | |

(52) U.S. Cl.
CPC .......... *G06T 7/0004* (2013.01); *G06T 3/4038* (2013.01); *G06T 7/90* (2017.01); *H01B 13/0036* (2013.01); *H01B 13/228* (2013.01); *H05K 9/0098* (2013.01); *G06T 2207/20212* (2013.01); *H04N 5/247* (2013.01)

(58) Field of Classification Search
CPC ....... G06T 7/0004; G06T 7/90; G06T 3/4038; G06T 2207/20212; G06T 2207/30168; H01B 13/0036; H01B 13/228; H05K 9/0098; H04N 5/247; G01N 21/88; G01N 2223/645; H01R 13/6592; H01R 9/032; G01R 31/08
See application file for complete search history.

(56) References Cited

U.S. PATENT DOCUMENTS

| | | |
|---|---|---|
| 4,685,636 A | 8/1987 | Eaton |
| 5,125,154 A | 6/1992 | Cross |
| 5,152,395 A | 10/1992 | Cross |
| 6,512,536 B1 * | 1/2003 | Ross .................... G01B 11/105 348/61 |
| 6,857,550 B2 | 2/2005 | Wright et al. |

(Continued)

*Primary Examiner* — Alexander Gee
(74) *Attorney, Agent, or Firm* — Ostrager Chong Flaherty & Broitman P.C.

(57) ABSTRACT

Semi-automated (with manual feeding) and fully automated (with automated feeding) solutions for using a vision system to evaluate shield trim quality on shielded cables. The vision system uses a multiplicity of cameras and a corresponding multiplicity of mirrors in order to achieve a 360-degree view of the cable segment to be inspected. Cables to be inspected are positioned in a repeatable location based on the strip length of the cable (where the edge of the cable jacket is located relative to the end of the cable). The processing system receives a live image feed from the camera system and then uses color and dimensional analysis of the acquired images to determine whether the shield trim meets quality control specifications or not.

24 Claims, 32 Drawing Sheets

(56) References Cited

U.S. PATENT DOCUMENTS

| | | | |
|---|---|---|---|
| 7,513,357 B2 | 4/2009 | Abbestam et al. | |
| 8,430,229 B2 | 4/2013 | Abbestam | |
| 8,739,964 B2 | 6/2014 | Ek | |
| 8,794,432 B2 | 8/2014 | Ek | |
| 9,612,210 B2 | 4/2017 | Ray et al. | |
| 9,966,742 B2 | 5/2018 | Evans et al. | |
| 2003/0202694 A1* | 10/2003 | Shima | G06T 7/0004 382/173 |
| 2011/0266274 A1 | 11/2011 | Ebata et al. | |
| 2015/0062328 A1* | 3/2015 | Lauffer | G06T 7/0004 348/125 |
| 2015/0332452 A1* | 11/2015 | Tsuchiya | G06T 7/0008 382/147 |
| 2015/0353196 A1* | 12/2015 | van Cruyningen | G01R 31/40 701/2 |
| 2016/0036208 A1* | 2/2016 | Evans | H02G 1/1256 83/56 |
| 2016/0276065 A1* | 9/2016 | Yaworski | H01B 7/1855 |
| 2016/0356142 A1* | 12/2016 | Natali | E21B 21/068 |
| 2017/0314385 A1* | 11/2017 | Hori | E21B 17/20 |

* cited by examiner

METHOD FOR USING A VISION SYSTEM TO EVALUATE SHIELD TRIMS ON SHIELDED CABLES

BACKGROUND

This disclosure relates generally to wire inspection techniques and, more specifically, to apparatus and method that facilitate efficient inspection of the processed end of a wire or multi-wire cable (e.g., a multi-conductor shielded cable). Many modern technological assemblies include electrical cables that must undergo a series of processing steps prior to their installation within the assembly. More specifically, electrical cables are generally delivered in large spools, such that each portion of electrical cable is measured and cut and each end of the cut electrical cable is processed. Errors may occur during one or more processing steps.

Shielded cables incorporate shielding in an attempt to prevent electromagnetic interference. For example, the conductors may be surrounded by braided shielding made of metal. Because the shielding is made of metal, it may also serve as a path to ground. Usually a shielded cable incorporates a grounding wire that contacts the shield in an unjacketed portion of the shielded cable. Typically the grounding wire is attached to the unjacketed portion using a solder sleeve.

Currently, the process of trimming an exposed shield of a shielded cable is a mostly manual and labor-intensive process. The shield trimming process is performed prior to installing solder sleeves onto shielded cables. One current method for trimming the exposed shield is to manually bunch the shield together such that it balloons out circumferentially, and then trim the bunched shield strands using a diagonal cutter. because operators are performing each step, they are able to visually inspect the cable for damage, unacceptable processing, or other abnormalities that would render the cable unacceptable for use. This process is slow, labor-intensive, and risks nicking or otherwise damaging the cable.

It is important that a cable with trimmed shield be evaluated prior to solder sleeve installation, as the sleeve inhibits the ability to view the underlying portion of the cable, including the shield and underlying wires. The shield must be clearly viewable in order to validate that trim length meets quality control specifications. When anomalies are detected, it may cause delays in the production process as a replacement cable is made and shipped to the replacement site.

In a typical wire shop, operators manually perform a visual inspection of the shield prior to solder sleeve installation. This method relies on the operator's vision to be able to detect hard-to-see imperfections, such as broken shield strands. For an automated processing system, there is no current solution for visually inspecting trimmed shields on shielded cables.

SUMMARY

The subject matter disclosed in some detail below is directed to providing semi-automated (with manual feeding) and fully automated (with automated feeding) solutions for using a vision system to evaluate shield trim quality on shielded cables. The system includes a digital camera system and a processing system that receives information from the camera system. More specifically, the system uses a multiplicity of cameras and a corresponding multiplicity of planar reflective surfaces (hereinafter "mirrors") in order to achieve a 360-degree view of the area on the cable to be inspected. Cables to be inspected are positioned in a repeatable location based on the strip length of the cable (where the edge of the cable jacket is located relative to the end of the cable). The processing system is configured to use image analysis to determine if the shield trim meets all associated requirements.

The processing system receives a live image feed from the camera system and then uses color and dimensional analysis of the acquired images to determine whether the shield trim meets quality control specifications or not. This evaluation process is fed by shield processing specifications and acceptable features common to shielded cables, such as braided shielding and cable properties. For example, shield strands must be trimmed to a specific length from the edge of the cable jacket. Also, the shield must provide at least a minimum percentage of coverage selected to ensure that the shields ability to block electromagnetic radiation has not been compromised. In accordance with one embodiment, the method uses color and dimensional analysis to validate that the exposed shield has been trimmed to a length that meets specifications and does not have excessive gaps (e.g., due to the presence of broken shield strands) that may expose the wires inside the shield to electromagnetic radiation.

The method described in the immediately preceding paragraph enables the automated system. A fully automated processing system reduces cycle time, increases quality, and eliminates ergonomic issues related to the manual process. In particular, the automation of the shield trimming and shield trim evaluation operations enables repeatable and consistent quality across end products that is unachievable with a fully manual process.

The vision system disclosed herein may be adapted for use on a benchtop or incorporated in an automated production line that includes a cable delivery system and a multiplicity of workstations accessible to the cable delivery system. In the automated production line, each workstation is equipped with a respective cable processing module (including hardware and software) that performs a respective specific operation in a sequence of operations designed to produce a shielded cable having a solder sleeve installed on one end of the cable. Successive workstations have the shield trimming apparatus and the shield trim evaluation system disclosed in detail below.

Although various embodiments of vision systems and methods for using a vision system to evaluate shield trims on shielded cables will be described in some detail below, one or more of those embodiments may be characterized by one or more of the following aspects.

One aspect of the subject matter disclosed in detail below is a method for inspecting a cable segment having exposed shielding, the method comprising: (a) capturing an image of the cable segment, the image including pixel data representing color information acquired from the cable segment; (b) processing pixel data from an inspection image area in the image, which inspection image area corresponds to a zone of the cable segment; (c) calculating a percentage of the pixel data in the inspection image area which represent a color of the shielding; and (d) determining whether the percentage of the pixel data in the inspection image area which represent the color of the shielding is greater than a specified threshold. In accordance with some embodiments, steps (a) through (d) are performed multiple times with different views of the cable segment, the method further comprising triggering an indication that the cable segment has failed inspection if a determination is made in any one of the multiple steps (d) that the percentage of the pixel data in the inspection image area which represent the color of the shielding is less than the specified threshold. In accordance with other embodiments, the image captured in step (a) is formed by stitching together multiple images captured with different views of the cable segment.

Another aspect of the subject matter disclosed in detail below is a system for processing a cable comprising: a cable delivery system for delivering a cable segment having exposed shielding and wires that pass through the exposed shielding; a shield trimming module configured to automatically trim the exposed shielding; a shield trim inspection module situated downstream from the shield trimming module and comprising a camera having a field of view which encompasses a zone of the cable segment; and a computer system communicatively coupled for receiving images from the camera. The computer system is configured to perform the following operations: (a) receiving an image of the cable segment from the camera, the image including pixel data representing color information acquired from the cable; (b) processing pixel data from an inspection image area in the image, which inspection image area corresponds to a zone of the cable segment; (c) calculating a percentage of the pixel data in the inspection image area which represent a color of the shielding; and (d) determining whether the percentage of the pixel data in the inspection image area which represent the color of the shielding is greater than a specified threshold.

A further aspect of the subject matter disclosed in detail below is a method for inspecting a cable segment having exposed shielding and wires that pass through the exposed shielding, the method comprising: (a) capturing an image of the cable segment, the image including pixel data representing color information acquired from the cable segment; (b) processing pixel data from an inspection image area in the image, which inspection image area corresponds to a zone of the cable segment; (c) calculating a percentage of the pixel data in the inspection image area which represent colors of the wires; and (d) determining whether the percentage of the pixel data in the inspection image area which represent the colors of the wires is greater than a specified threshold. In accordance with some embodiments, steps (a) through (d) are performed multiple times with different views of the cable segment, the method further comprising triggering an indication that the cable segment has failed inspection if a determination is made in any one of the multiple steps (d) that the percentage of the pixel data in the inspection image area which represent the colors of the wires is less than the first specified threshold. In accordance with other embodiments, the image captured in step (a) is formed by stitching together multiple images captured with different views of the cable segment.

In accordance with some embodiments, steps (a) through (d) are performed multiple times with different views of the cable segment, the method further comprising triggering an indication that the cable segment has failed inspection if a determination is made in any one of the multiple steps (d) that the percentage of the pixel data in the first inspection image area which represent the color of the shielding is less than the first specified threshold. In accordance with other embodiments, the image captured in step (a) is formed by stitching together multiple images captured with different views of the cable segment.

Yet another aspect of the subject matter disclosed in detail below is a system for processing a cable comprising: a cable delivery system for delivering a cable segment having exposed shielding and wires that pass through the exposed shielding; a shield trimming module configured to automatically trim the exposed shielding; a shield trim inspection module situated downstream from the shield trimming module and comprising a camera having a field of view which encompasses a zone of the cable segment; and a computer system communicatively coupled for receiving images from the camera, The computer system is configured to perform the following operations: (a) receiving an image of the cable segment from the camera, the image including pixel data representing color information acquired from the cable; (b) processing pixel data from an inspection image area in the image, which inspection image area corresponds to a zone of the cable segment; (c) calculating a percentage of the pixel data in the inspection image area which represent colors of the wires; and (d) determining whether the percentage of the pixel data in the inspection image area which represent the colors of the wires is greater than a specified threshold.

A further aspect of the subject matter disclosed in detail below is a cable inspection system comprising: an enclosure having an interior with a center axis; a first camera located so that a first image of a cable segment disposed inside the enclosure along the center axis is within a field of view of the first camera; a second camera located so that a second image of the cable segment is within a field of view of the second camera; and a computer system communicatively coupled for receiving first pixel data of a first image from the first camera and second pixel data of a second image from the second camera, wherein the computer system is configured to perform the following operations: count a respective number of pixels in a first zone of the first image representing first, second and third colors; count a respective number of pixels in a first zone of the second image representing the first, second and third colors; calculate respective percentages of pixels in the first zones representing the first, second and third colors; determine whether the respective percentages of pixels in the first zones representing the first, second and third colors indicate that gaps in the shield in the first zones occupy a percentage of area in excess of a first specified threshold or not; and trigger an indication that the cable segment has failed inspection if a determination is made that the respective percentages of pixels in the first zones representing the first, second and third colors indicate that gaps in the shield in the first zones occupy a percentage of area in excess of the first specified threshold.

In accordance with some embodiments of the system described in the immediately preceding paragraph, the computer system is further configured to perform the following operations: count a respective number of pixels in a second zone of the first image representing the first, second and third colors; count a respective number of pixels in a second zone of the second image representing the first, second and third colors; calculate respective percentages of pixels in the second zones representing the first, second and third colors; determine whether the respective percentages of pixels in the first zones representing the first, second and third colors indicate that the shield in the second zones occupies a percentage of area in excess of a second specified threshold or not; and trigger an indication that the cable segment has failed inspection if a determination is made that the respective percentages of pixels in the second zones representing the first, second and third colors indicate that the shield in the second zones occupies a percentage of area in excess of the second specified threshold. The computer system may be further configured to trigger an indication that the cable segment has passed inspection if the following determinations are made: (a) the respective percentages of pixels in the first zones representing the first, second and third colors indicate that gaps in the shield in the first zones occupy a percentage of area not in excess of the first specified threshold; and (b) the respective percentages of pixels in the second zones representing the first, second and third colors indicate that the shield in the second zones occupies a percentage of area not in excess of the second specified threshold. In one proposed implementation, the first and second colors are wire colors and the third color is a color of shielding.

Another aspect of the subject matter disclosed in detail below is a cable inspection system comprising: an enclosure having an interior with a center axis; a first camera located so that a first image of a cable segment disposed inside the enclosure along the center axis is within a field of view of the first camera; a second camera located so that a second image of the cable segment is within a field of view of the second camera; and a computer system communicatively coupled for receiving first pixel data of the first image from the first camera and second pixel data of the second image from the second camera, wherein the computer system is configured to perform the following operations: count a number of pixels in a zone of the first image having a color indicative of light reflected by a shield; count a number of pixels in a zone of the second image having a color indicative of light reflected by a shield; determine whether the percentage of pixels in the zones having a color indicative of light reflected by a shield is greater than a specified threshold; and trigger an indication that the cable segment has passed inspection if a determination is made that the percentage of pixels in the zones having a color indicative of light reflected by a shield is greater the specified threshold.

A further aspect of the subject matter disclosed in detail below is a cable inspection system comprising: an enclosure having an interior with a center axis; a first camera located so that a first image of a cable segment disposed inside the enclosure along the center axis is within a field of view of the first camera; a second camera located so that a second image of the cable segment is within a field of view of the second camera; and a computer system communicatively coupled for receiving first pixel data of the first image from the first camera and second pixel data of the second image from the second camera, wherein the computer system is configured to perform the following operations: count a number of pixels in a zone of the first image having a color indicative of light reflected by a wire; count a number of pixels in a zone of the second image having a color indicative of light reflected by a wire; determine whether the percentage of pixels in the zones having colors indicative of light reflected by wires is greater than a specified threshold; and trigger an indication that the cable segment has failed inspection if a determination is made that the percentage of pixels in the zones having colors indicative of light reflected by wires is greater the specified threshold.

Yet another aspect of the subject matter disclosed in detail below is a method for evaluating a quality of a trimmed shield on a shielded cable, the method comprising: capturing a multiplicity of images of a cable segment that includes an exposed shield that has been trimmed from different angles to acquire multiple views of the exposed shield; counting a respective number of pixels in a first zone of each of the multiplicity of images representing first, second and third colors; calculating respective percentages of pixels in the first zones representing the first, second and third colors; determining whether the respective percentages of pixels in the first zones representing the first, second and third colors indicate that gaps in the shield in the first zones occupy a percentage of area in excess of a first specified threshold or not; and triggering an indication that the cable segment has failed inspection if a determination is made that the respective percentages of pixels in the first zones representing the first, second and third colors indicate that gaps in the shield in the first zones occupy a percentage of area in excess of the first specified threshold.

In accordance with some embodiments of the method described in the immediately preceding paragraph, the method further comprises: counting a respective number of pixels in a second zone of each of the multiplicity of images representing first, second and third colors; calculating respective percentages of pixels in the second zones representing the first, second and third colors; determining whether the respective percentages of pixels in the second zones representing the first, second and third colors indicate that the shield in the second zones occupies a percentage of area in excess of a second specified threshold or not; and triggering an indication that the cable segment has failed inspection if a determination is made that the respective percentages of pixels in the second zones representing the first, second and third colors indicate that the shield in the second zones occupies a percentage of area in excess of the second specified threshold.

Yet another aspect of the subject matter disclosed in detail below is a method for evaluating a quality of a trimmed shield on a shielded cable, the method comprising: capturing a multiplicity of images of a cable segment that includes an exposed shield that has been trimmed from different angles to acquire a 360-degree view of the exposed shield; constructing pixel color histograms for a first zone of the cable segment; counting a number of pixels having a color indicative of light reflected by a shield in the first zone of the cable segment; determining whether the percentage of pixels in the first zone having a color indicative of light reflected by a shield is not equal to or greater than a specified threshold; and triggering an indication that the cable segment has failed inspection in response to a determination that the percentage of pixels in the first zone having a color indicative of light reflected by a shield is not equal to or greater than the specified threshold.

In accordance with one embodiment of the method described in the immediately preceding paragraph, the method further comprises: constructing pixel color histograms for a second zone of the cable segment; counting a number of pixels having a color indicative of light reflected by a shield in the second zone of the cable segment; determining whether the percentage of pixels in the second zone having a color indicative of light reflected by a shield is nearly zero; triggering an indication that the cable segment has failed inspection in response to a determination that the percentage of pixels in the second zone having a color indicative of light reflected by a shield is not nearly zero; and triggering an indication that the cable segment has passed inspection in response to determinations that the percentage of pixels having a color indicative of light reflected by a shield is equal to or greater than the specified threshold in the first zone and zero in the second zone.

Other aspects of vision systems and methods for using a vision system to evaluate shield trims on shielded cables are disclosed below.

BRIEF DESCRIPTION OF THE DRAWINGS

The features, functions and advantages discussed in the preceding section may be achieved independently in various embodiments or may be combined in yet other embodiments. Various embodiments will be hereinafter described with reference to drawings for the purpose of illustrating the above-described and other aspects. None of the diagrams briefly described in this section are drawn to scale.

In addition, the depiction of shielded cabling in the drawings has been simplified by assuming that the cable being viewed in the drawing has a circular outer profile of constant diameter along its length, although some shielded cabling having a jacket that conforms to the undulations in the electrical wires has an outer profile that varies along its length.

Reference will hereinafter be made to the drawings in which similar elements in different drawings bear the same reference numerals.

DETAILED DESCRIPTION

Illustrative embodiments of vision systems and methods for using a vision system to evaluate shield trims on shielded cables are described in some detail below. However, not all features of an actual implementation are described in this specification. A person skilled in the art will appreciate that in the development of any such actual embodiment, numerous implementation-specific decisions must be made to achieve the developer's specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

For the purpose of illustration, cable processing equipment in the form of a vision system for evaluating shield trims on shielded cables will be described below. That cable processing equipment may be one of a multiplicity of modules at separate workstations in a fully automated production line or may be benchtop cable processing equipment (e.g., equipment mounted on a workbench and accessible to a human operator).

As used herein, the term "tip of a cable" means a portion of a cable exposed by cutting the cable in a cross-sectional plane. As used herein, the term "end of a cable" means a section of cable having a tip and a length of cable extending from the tip. For example, removal of a length of the jacket of a cable that extends to the cable tip creates an end of the cable in which the shielding is exposed.

As used herein, the term "sleeve" means a tube made of shrinkable material, such as a solder sleeve made of thermoplastic material (which shrinks) and a solder ring (which melts) or a dead end sleeve made of thermoplastic material and having no solder ring. Installation of a solder sleeve involves shrinking of the thermoplastic material and melting of the solder ring; installation of a dead end sleeve involves shrinking of the thermoplastic material. As used herein, "melting a solder sleeve" includes shrinking the thermoplastic material with melting of a solder ring, while "shrinking a sleeve" includes shrinking the thermoplastic material with (e.g., solder sleeve) or without (e.g., dead end sleeve) melting of a solder ring.

Figure 1:
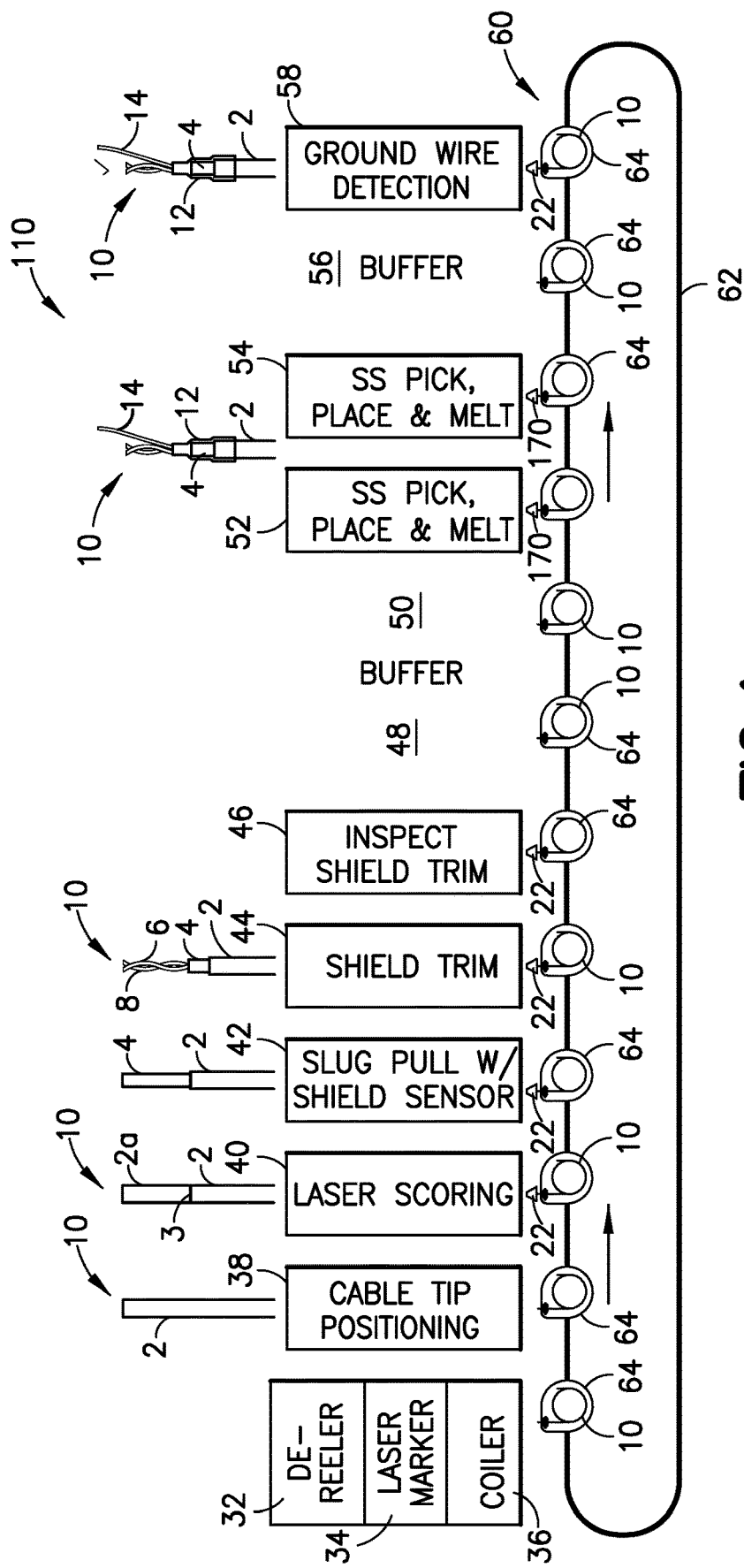
FIG. 1 is a diagram representing and identifying components of an automated system for performing respective operations on an end of a cable at a plurality of cable processing modules in accordance with one embodiment.

FIG. 1 is a diagram representing and identifying components of a system 110 for performing respective operations on an end of a cable 10. The system 110 includes a cable delivery system 60. For example, the cable delivery system 60 may take the form of a conveyor system with locating modules (not shown in FIG. 1). Locating modules are components for positioning pallets in preparation for performance of an automated operation. In accordance with the embodiment depicted in FIG. 1, the cable delivery system 60 includes a conveyor track 62 in the form of an endless belt or chain. The entire conveyor track 62 is continuously moving. In alternative embodiments, the cable delivery system 60 is not endless, in which case pallets 64 arriving at the end of a linear conveyor track may be transported to the starting point by other means. In accordance with alternative embodiments, the cable delivery system 60 may be a gantry robot or a robotic arm.

The system 110 depicted in FIG. 1 further includes a multiplicity of automated workstations situated adjacent to and spaced at intervals along the conveyor track 62. Each workstation is equipped with hardware that performs a respective specific operation in a sequence of operations designed to produce a shielded cable 10 having a solder sleeve 12 installed on one end of the cable 10. The locating modules (not shown in FIG. 1) of the system 110 are used to lift each pallet 64 off of the conveyor track 62 when an operation has to be performed at a workstation on the coil carried by that pallet 64 and later place the pallet 64 back on the conveyor track 62 after the operation has been completed so that the pallet 64 can move onto the next workstation.

Each pallet 64 carries a respective coil of cable 10. Pallets 64 move intermittently along the conveyor track 62 in the forward direction indicated by the arrows in FIG. 1, advancing from one automated workstation to the next and then stopping. (This aspect of the cable delivery system 60 will be referred to hereinafter as "pulsing".) A respective bar code reader (not shown in the drawings) is mounted on the side of the conveyor track 62 opposite to each workstation. Each pallet 64 has a bar code printed on a forward side portion thereof. When the bar code reader detects the arrival of a pallet 64, each workstation has a respective controller (e.g., a computer programmed to execute computer numeric control (CNC) commands) that activates the cable processing module of that workstation to begin an automated cable processing operation.

Each shielded cable 10 to be processed is carried on a respective pallet 64 that is conveyed along the conveyor track 62. The pallets 64 pulse down the conveyor track 62 and the end of each shielded cable 10 is inserted into a series of cable processing modules in sequence, each cable processing module including cable processing equipment for performing successive operations of a solder sleeve installation process. In accordance with the embodiment depicted in FIG. 1, the cable processing modules include the following: a de-reeler module 32, a laser marker 34, a coiler module 36, a cable tip positioning module 38, a laser scoring module 40, a jacket slug pulling module 42, a shield trimming module 44, a shield trim inspection module 46, two solder sleeve installation modules 52 and 54 (also referred to herein as "solder sleeve pick, place and melt modules"), and a ground wire detection module 58. In accordance with the proposed implementation depicted in FIG. 1, there are three open positions where cable processing does not occur. These open positions, where a pallet may be parked, are referred to herein as buffers 48, 50 and 56.

As indicated in FIG. 1 by triangle symbols, some of the workstations include funnels 22 which center the inserted end of the cable 10 in the cable processing equipment at the respective workstation. Other workstations, such as the workstation where the cable tip positioning module 38 is located, do not have a funnel. The workstations where the two solder sleeve installation modules 52 and 54 are located have open-top or split funnels 170, which also guide the end of the cable 10, but differ in structure from the funnels 22 in that the cable may be lifted vertically out of the open or split funnel 170 upon completion of the solder sleeve melting operation.

Each of the automated cable processing operations identified in FIG. 1 will now be briefly described in some detail. The respective cable processing modules will be described in the order in which the respective cable processing operations are performed on one cable.

The starting material is a continuous length of multi-conductor shielded cable of a particular type wound on a reel. The de-reeler module 32 de-reels the continuous length of cable and then cuts the cable to a specified length, which length of cable will be referred to hereinafter as "cable 10". Preferably a multi-spool de-reeler is used so that multiple cable types can be selected for processing off of a single machine. For each length of cable 10, the laser marker 34 laser marks the outer jacket 2 of the cable 10 with pertinent information (bundle number, wire number, gauge).

The coiler module 36 receives each length of cable 10 from the de-reeler module 32 and laser marker 34 and coils the cable 10. This creates a repeatable configuration for the cable that is easy to transport and maintain as it goes through the system. The coiler module 36 coils cables 10 and applies a sticker label. This label contains information about the cable (airplane effectivity, bundle, dash, wire identification, etc.), as well as a bar code. In accordance with one proposed implementation, the coiler module 36 ensures that one end of the coiled cable 10 has seven inches of "free" cable.

The coil of cable 10 is taken off of the coiler and placed on a pallet 64. The pallet 64 is then transferred from the coiler module 36 to the cable tip positioning module 38. This may be done manually by an operator or automatically by a robotic end effector (or some other apparatus).

The cable tip positioning module 38 serves to initially position the tip of the cable 10 at a preset cable tip position prior to the cable 10 continuing through the system 110. It is the first "stop" along the conveyor track 62, and is where the cable 10 is first placed onto the system. The preset cable tip position is selected to prevent the cable end from being too long as it travels along the conveyor track (hitting other objects within the system, being crushed or otherwise damaged, etc.). After the cable tip positioning module 38 has positioned the cable tip 10b at the preset cable tip position, the pallet 64 leaves the cable tip positioning module 38.

In accordance with the embodiment depicted in FIG. 1, after the cable tip positioning module 38 has positioned the cable tip 10b, the pallet 64 moves to the laser scoring module 40. The workstation where the laser scoring module 40 is located also includes a funnel 22 for guiding a cable 10 into the cable processing equipment of the laser scoring module 40. The laser scoring module 40 lightly scores the jacket 2 of the cable 10 along a score line 3 which extends circumferentially in a plane that intersects an annular region of the jacket 2. The presence of the laser score line 3 prepares the applicable segment of jacket 2 (hereinafter "the jacket slug 2a") to be removed.

After the laser scoring module 40 has scored the jacket 2 of the cable 10, the pallet 64 moves to the jacket slug pulling module 42. The workstation where the jacket slug pulling module 42 is located also includes a funnel 22 for guiding a cable 10 into the cable processing equipment of the jacket slug pulling module 42. The jacket slug pulling module 42 removes the jacket slug 2a to reveal the shield 4 in the unjacketed portion of the cable 10. An electrical continuity shield sensor (not separately depicted in FIG. 1) may be integrated with the jacket slug pulling module 42 to detect that the jacket slug 2a was removed prior to retracting the cable 10 from the jacket slug pulling module 42.

After the jacket slug pulling module 42 has pulled off the jacket slug 2a of the cable 10, the pallet 64 moves to the shield trimming module 44. The workstation where the shield trimming module 44 is located also includes a funnel 22 for guiding a cable 10 into the cable processing equipment of the shield trimming module 44. The shield trimming module 44 trims off a portion of the exposed portion of the shield 4 to reveal respective portions of the wires 6 and 8 of the cable 10. In accordance with one proposed implementation, the shield trimming module 44 trims the shield 4 of the cable 10 about 0.25" from the edge of the jacket 2.

After the shield trimming module 44 has trimmed the shield 4 of the cable 10, the pallet 64 moves to the shield trim inspection module 46. The workstation where the shield trim inspection module 46 is located also includes a funnel 22 for guiding a cable 10 into the cable processing equipment of the shield trim inspection module 46. The shield trim inspection module 46 performs a quality check of the trimmed shield using a vision system and image analysis. The quality check ensures that the shield 4 meets the specifications for the particular type of cable 10 (e.g., shield strands are not too long or too short, not damaged, etc.) prior to installing a solder sleeve 12. In accordance with one embodiment, the shield trim inspection module 46 includes a vision system (described in more detail below with reference to FIGS. 17, 18A-18E, and 19-21) that is configured to use image analysis to determine if the shield trim meets all associated quality control specifications.

After the shield trim inspection module 46 has inspected the trimmed shield 4 of the cable 10, the pallet 64 moves to one of two solder sleeve installation modules 52 and 54. The workstations where the solder sleeve installation modules 52 and 54 are located also include an open funnel 170 for guiding a cable 10 into the cable processing equipment of the solder sleeve installation modules 52 and 54. The solder sleeve installation modules 52 and 54 are configured to install a solder sleeve 12 with a ground wire 14 onto the cable 10 using automated picking, placing and melting operations. Each solder sleeve installation modules preferably includes a sensor system that actively measures the diameter of the cable with solder sleeve and monitors the shrinking diameter of the solder sleeve during the melting process using dimensional analysis. The sensor system activates or deactivates the heating element based on the dimensional analysis of the solder sleeve; this may also control the transportation of the cables through the device.

Solder sleeves are limited in how quickly they are able to fully melt without burning due to their design and materials. The type of heat source used (hot air, infrared) has no significant impact on the melt time. This creates a bottleneck on the moving line, due to the fact that all processes prior to the solder sleeve melting operation take much less time to complete, and limits the lowest achievable cycle time of the overall line.

In accordance with one proposed implementation, two cables 10 may have solder sleeves installed concurrently using the two solder sleeve installation modules 52 and 54. After the solder sleeve 12 has been installed on the cable 10 by one of the solder sleeve installation modules 52 and 54, the pallet 64 moves to ground wire detection module 58. The workstation where the ground wire detection module 58 is located also includes a funnel 22 for guiding a cable 10 into the cable processing equipment of the ground wire detection module 58. The ground wire detection module 58 detects the ground wire 14 of the solder sleeve 12. This may be done through physical sensing or an electrical continuity test, all of which are commercially available off the shelf.

As seen in FIG. 1, the cable delivery system 60 includes multiple pallets 64 that travel on the conveyor track 62, each pallet 64 carrying a respective coil of cable 10. In accordance with some embodiments, the apparatus on the pallet 64 includes a pair of cable-displacing wheels (e.g., a motor-driven drive wheel and a spring-loaded idler wheel that is movable between positions that are respectively in contact with and not in contact with the motor-driven drive wheel) designed to push and pull cables through a cable-guiding funnel which centers the cable for insertion into the cable processing equipment. The ability of the drive and idler wheels to move apart enables wires or cables of varying diameters and cross-sectional profiles to be placed between the drive and idler wheels. This apparatus is intended to be universal, i.e., to be able to be used on any equipment (including benchtop equipment) that processes wires and/or cables. Additionally, a user would be able to define the amount (length) of cable that is fed into the equipment, depending on the cable that is to be processed and its related requirements.

Figure 2A:
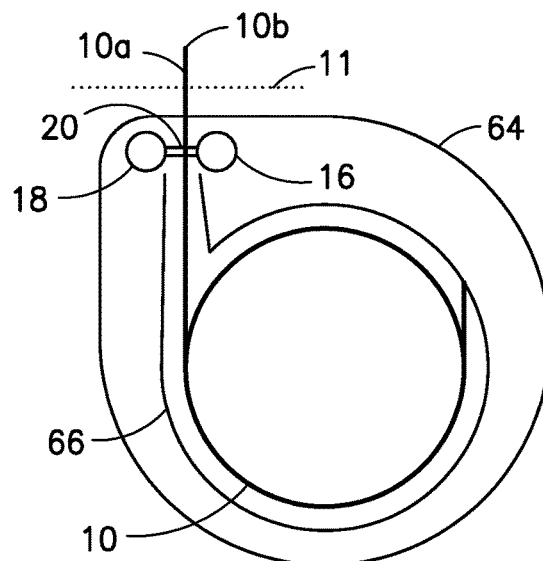
FIGS. 2A and 2B are diagrams representing top views of a cable-carrying, drive wheel-equipped pallet in two states: when the drive wheel is separated from an idler wheel (FIG. 2A) and when the drive wheel is in contact with the idler wheel (FIG. 2B).
Figure 2B:
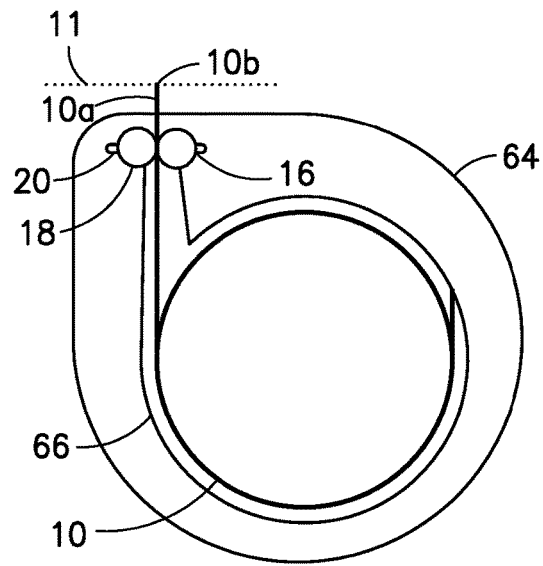

Some features of a pallet 64 in accordance with one embodiment will now be described with reference to FIGS. 2A and 2B; other features of the pallet 64 not shown in FIGS. 2A and 2B will be described later with reference to other drawings. As seen in FIGS. 2A and 2B, each pallet 64 has a drive wheel 16 and an idler wheel 18 which are rotatably coupled to the pallet 64. The drive wheel 16 and idler wheel 18 are preferably padded with a compliant material capable of conforming to different cross-sectional profiles (e.g., single-versus multi-conductor cable). An encoder may be attached to one or both of the wheels in order to more accurately track how far the cable 10 has been moved by the wheels. The encoder tracks the "distance traveled" of a drive roller by multiplying the number of rotations by the circumference of the drive roller 16.

The pallet 64 also includes a corral 66 in the form of a curved wall that is contoured to guide the cable end 10*a* toward the drive wheel 16 and idler wheel 18. The drive wheel 16 and idler wheel 18 cooperate to move the cable end 10*a* into and out of an adjacent cable processing module 30. FIGS. 2A and 2B show the pallet 64 in two states: when the drive wheel 16 is separated from the idler wheel 18 (FIG. 2A) and when the drive wheel 16 is in contact with the idler wheel 18 (FIG. 2B).

As seen in FIG. 2A, the free end 10*a* of the cable 10 is placed between the drive wheel 16 and idler wheel 18 so that the cable tip 10*b* is at a position in front of the nip, while the cable 10 is intersected by a vertical scanning plane 11 (indicated by a dashed line in FIGS. 2A and 2B) located at a known position. This known position is a known distance from a preset cable tip position. Although FIG. 2A shows the cable tip 10*b* located beyond the vertical scanning plane 11, the starting position of the cable tip 10*b* may be either beyond or short of the vertical scanning plane 10.

The force holding the idler wheel 18 apart from drive wheel 16 is then discontinued, following which the idler wheel 18 is urged by springs (not shown in FIGS. 2A and 2B) into contact with the drive wheel 16, thereby forming a nip that squeezes the cable 10. As will be described in further detail below, the drive wheel 16 and idler wheel 18 are configured so that sufficient frictional forces are produced that enable the cable 10 to be either pushed or pulled through the nip depending on the directions of wheel rotation. Upon detection of the presence of the cable tip 102*b* at a position beyond the vertical scanning plane 11, the drive wheel 16 and idler wheel 18 are rotated in a cable pulling direction to cause the cable end 10*a* to retract and the cable tip 10*b* to move toward the vertical scanning plane 11. Conversely, if the cable tip 102*b* were at a position short of the vertical scanning plane 11 (hereinafter "scanning plane 11"), the drive wheel 16 and idler wheel 18 would be rotated in a cable pushing direction to cause the cable end 10*a* to extend and the cable tip 10*b* to move toward the scanning plane 11. The remainder of the description of FIGS. 2A and 2B will discuss the case wherein the cable end 10*b* is initially placed in a position such that the cable tip 102*b* is beyond (not short of) the scanning plane 11.

The movement of the cable tip 10*b* is monitored by detecting when the cable tip 10*b* reaches the scanning plane 11. This is accomplished by a photoelectric sensor (not shown in FIGS. 2A and 2B, but see photoelectric sensor 28 in FIGS. 4A and 4B) mounted to the pallet 64 and configured to function as a light gate. In accordance with some embodiments, the photoelectric sensor 28 is configured to act as a light gate that detects when there is no portion of the cable 10 blocking a light beam propagating in the scanning plane 11 from one side of the light gate to the other side. FIG. 2B shows the state wherein the cable tip 10*b* is aligned with the scanning plane 11 following retraction of the cable end 10*a*. In response to the photoelectric sensor 28 detecting a transition between a state of light being interrupted (e.g., blocked) in the scanning plane 11 and a state of light not being interrupted, the photoelectric sensor 28 issues a cable tip position signal indicating the transition between interruption and no interruption of transmitted light at the scanning plane. In response to issuance of the cable tip position signal, the computer of the cable positioning module activates a motor (not shown in FIGS. 2A and 2B, but see motor 72 in FIGS. 4A and 4B) to rotate the drive wheel 16 an amount and in a direction such that at the end of the rotation, the cable 10 does not extend beyond a preset cable tip position. This preset cable tip position is a known distance from the scanning plane 11. The preset cable tip position may be selected to ensure that the cable tip 10*b* may travel along the conveyor track 62 with sufficient clearance to avoid damage from stationary objects.

Figure 5:
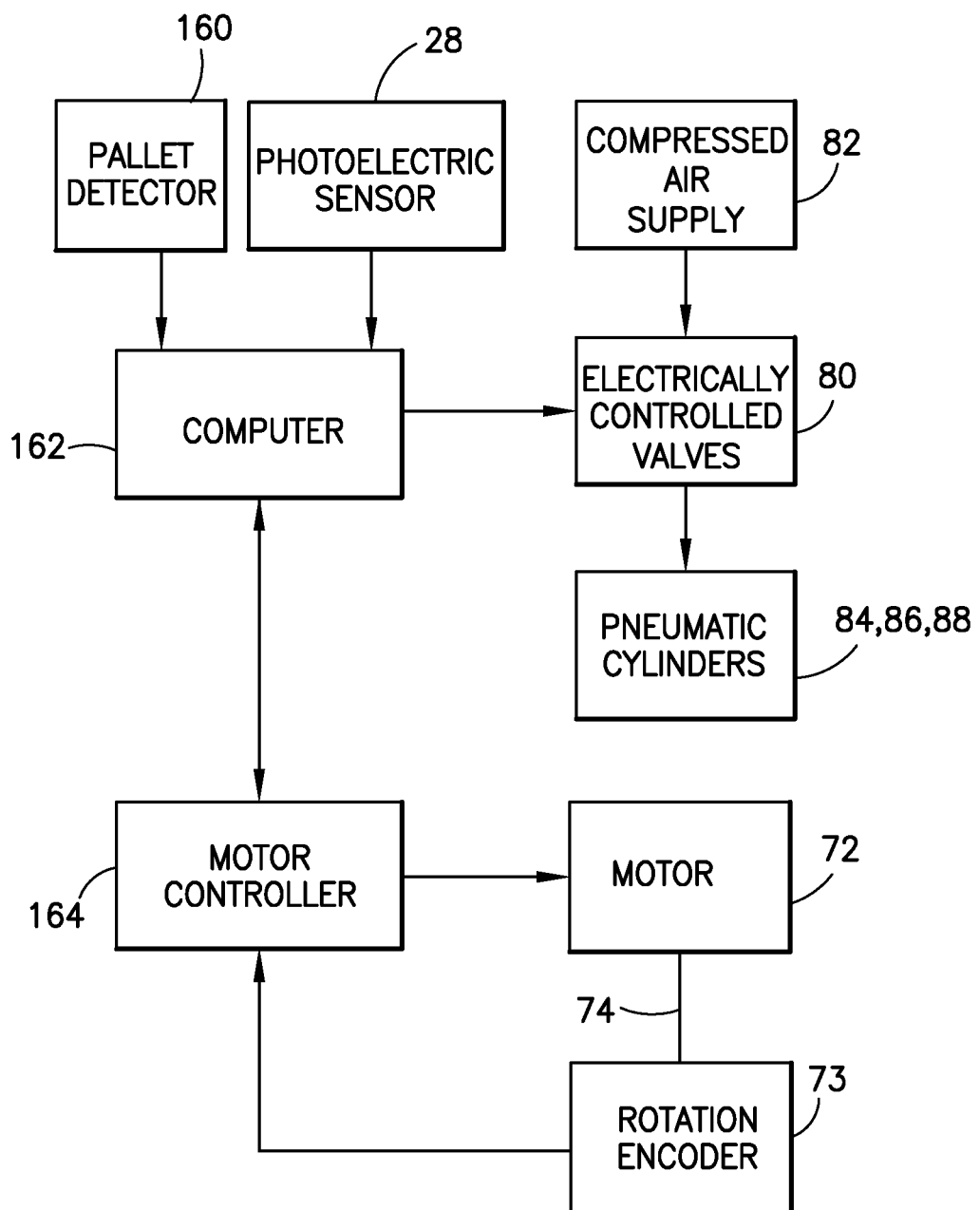
FIG. 5 is a block diagram identifying components of a cable processing workstation in accordance with one embodiment.

The cable tip positioning module 38 includes a computer (not shown in FIG. 1, but see computer 162 in FIG. 5). The cable tip positioning signal from the photoelectric sensor 28 is received by the computer 162. The computer 162 is configured to de-activate the motor 72 that drives rotation of the drive wheel 16 (thereby ceasing driving rotation of the drive wheel 16 in the cable pulling direction) after a predetermined angular rotation of the drive wheel 16 subsequent to issuance of the cable tip position signal. In other words, there is a time delay during which the drive wheel 16 and idler wheel continue to move the cable end 10*a*, causing the cable tip 10*b* to move from the current position depicted in FIG. 2B (in this instance, corresponding to the position of the scanning plane 11) to a preset cable tip position a short distance (e.g., 0.5 inch) from the scanning plane 11. More specifically, the computer 162 is configured to start a count of pulses output by a rotation encoder (mounted on the drive wheel shaft 88 or the motor output shaft, for example) in response to issuance of the cable tip position signal and then de-activate the motor 72 in response to the count reaching a specified value representing the distance separating the preset cable tip position from the scanning plane 11.

In accordance with an alternative embodiment, the preset cable tip position and the position of the scanning plane may be one and the same, provided that the movement of the cable 10 can be stopped precisely at the instant in time when the sensor 28 issues the cable tip position signal.

The above-described cable tip positioning process ensures that the cable tip 10*b* is in a repeatable position and does not extend beyond the preset cable tip position prior to continuing down the conveyor track 62. At this juncture, the conveyor track 62 pulses forward, causing the pallet to move to the next workstation.

Figure 3:
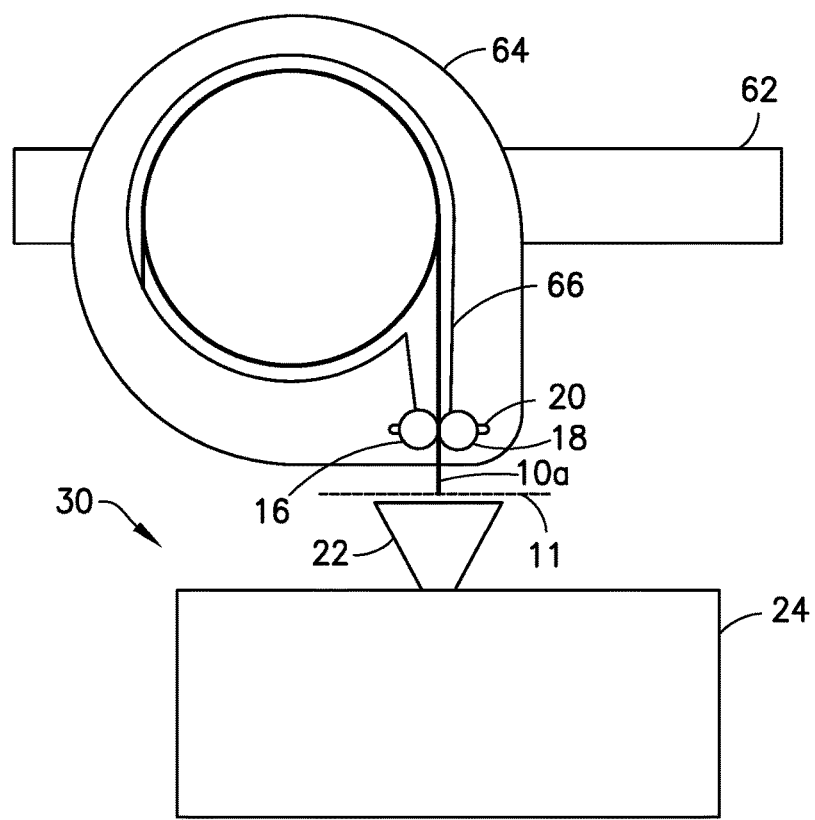
FIG. 3 is a diagram representing a top view of the pallet depicted in FIG. 2B in a position adjacent a cable processing module where a tip of the cable is positioned in front of a funnel.

FIG. 3 is a diagram representing a top view of the pallet 64 in a position adjacent a cable processing module 30. The apparatus includes a drive wheel 16 and an idler wheel 18 configured for driving the cable 10 forwards or backwards between the wheels and a funnel 22 capable of capturing the cable end 10*a*. While the wheels control the motion of the cable 10, the funnel 22 serves to center the cable 10 for insertion into the cable processing equipment. This function will be used to insert and position the cable 10 into different modules for processing as the cable 10 is transported through the system.

More specifically, the cable tip 10*b* is positioned in front of a funnel 22 that is configured to center a cable end 10*a* as it is fed into the cable processing equipment 24 of a cable processing module 30. Each cable processing module 30 is equipped with a funnel 22 (or an open-top funnel not shown) and a photoelectric sensor (not shown in FIG. 3, but see photoelectric sensor 28 in FIG. 5) for detecting the presence of the cable tip 10*b* in a scanning plane 11 (indicated by a dashed line in FIG. 3). It is important that the interior surface of the funnel 22 be smooth and devoid of any rough or sharp edges that may abrade, tear, or otherwise damage the cable 10. Preferably the funnel 22 is made of a thermoplastic material with a low coefficient of friction to prevent the funnel 22 from slowing the cable 22 down as it is moved by the drive wheel 16 and idler wheel 18 (preventing slippage). The funnel 22 may be configured in different ways. In lieu of a basic hole on the exit side of the funnel 22 (small diameter side), the funnel 22 may have a flexible piece of material featuring an X-shaped cut centered within the funnel 22. This helps to provide a repeatable, centered position for the cable 10 as it is either pushed forward or pulled back. It also permits the cable-guiding funnel to accurately center cables with varying diameters and cross sectional profiles. Other cable-guiding funnels may also be split and/or feature an open top.

Figure 4A:
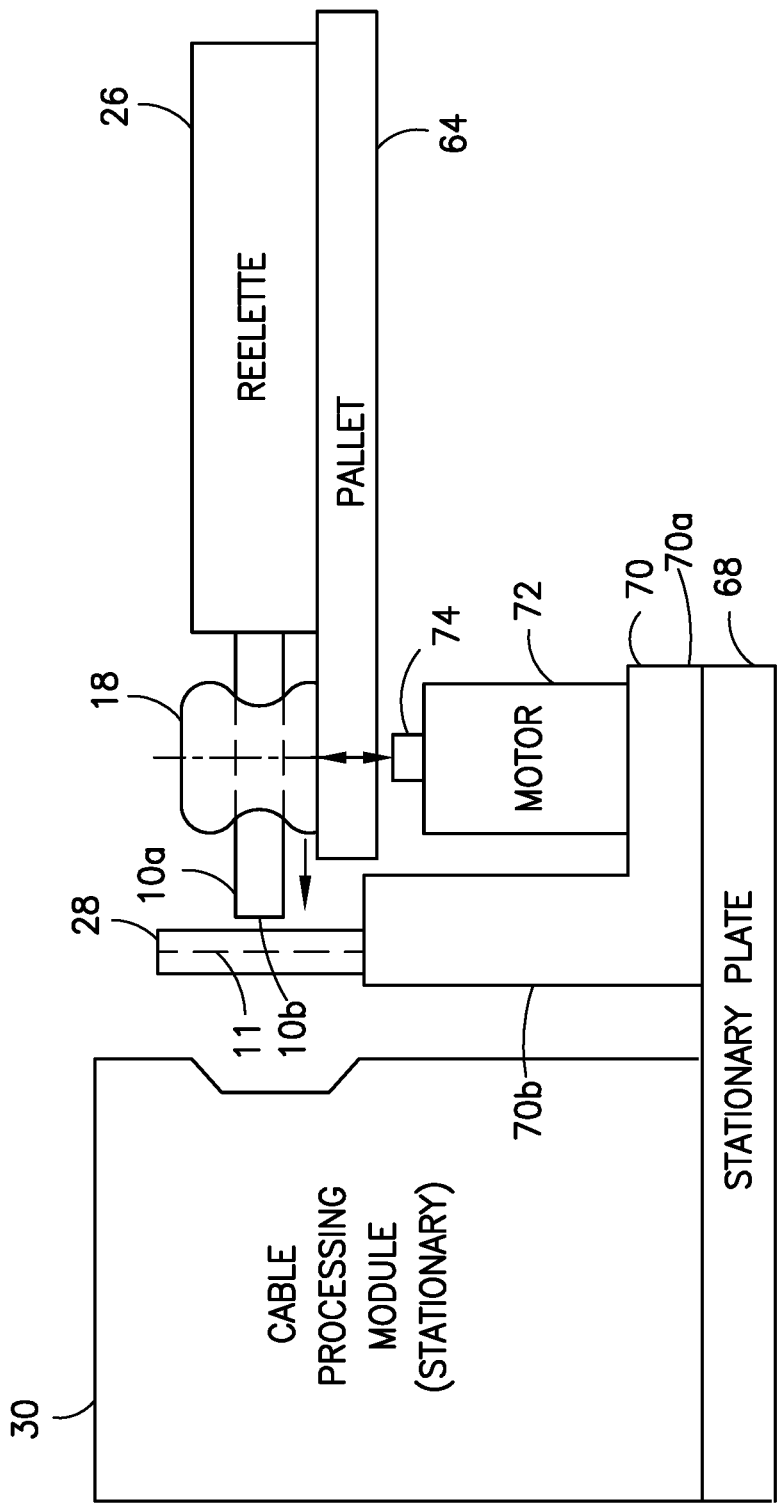
FIG. 4A is a diagram representing a side view of a cable-carrying, drive wheel-equipped pallet in a position adjacent a cable processing module.
Figure 4B:
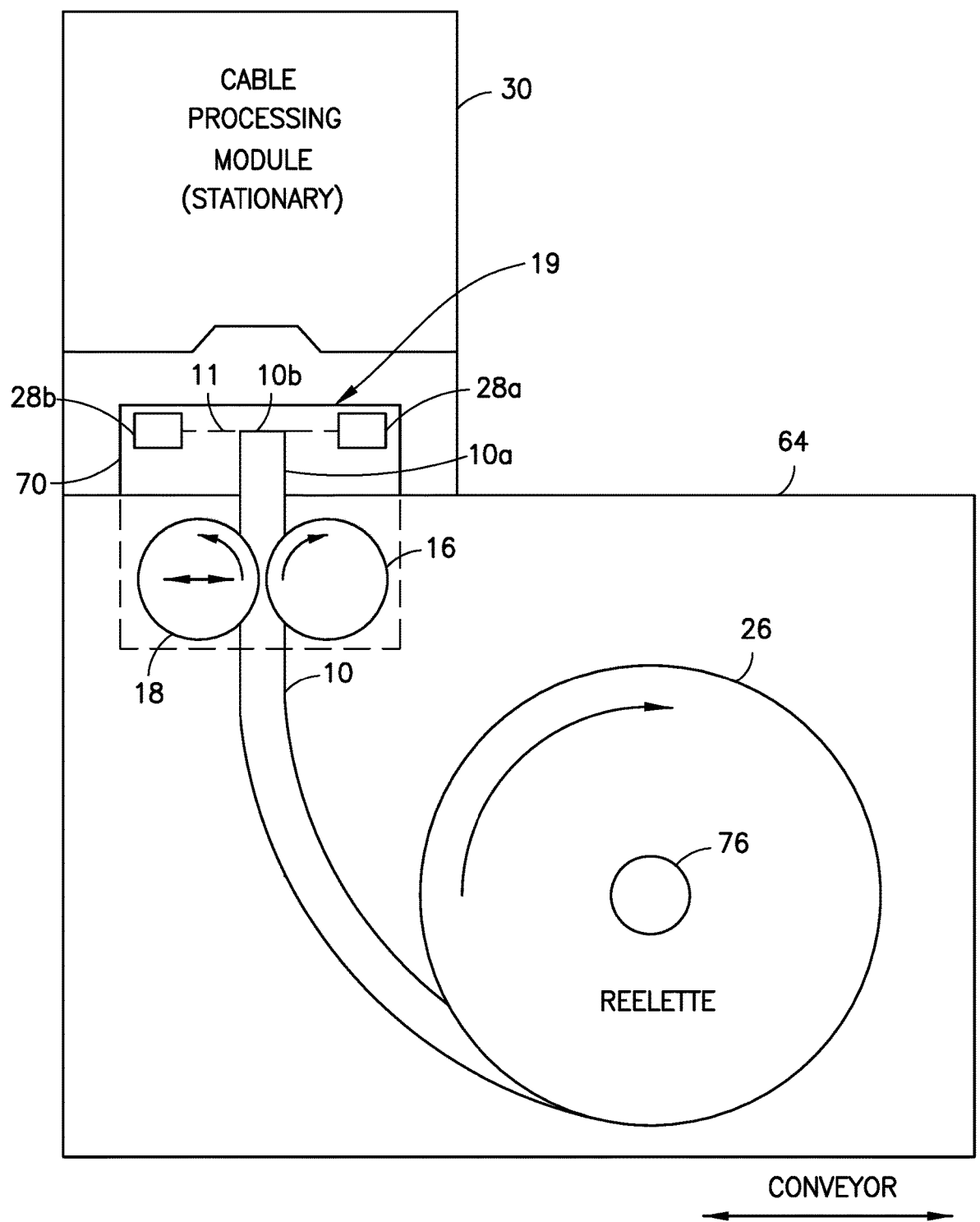
FIG. 4B is a diagram representing a top view of the apparatus depicted in FIG. 4A.

In accordance with some embodiments, each workstation includes a stationary motor (not shown in FIG. 3, but see motor 72 in FIGS. 4A and 4B). In accordance with one proposed implementation, the motor 72 is an electric stepper motor. The motor shaft speed will control how fast the drive wheel rotates (the speed at which the end of the cable 10 is moved), as well as which directions the wheels rotate in. The motor 72 is configured to rotate either clockwise or counterclockwise.

In response to detection of the arrival of the pallet 64 at the cable processing module 30 by a pallet detector (not shown in FIG. 3, but see pallet detector 160 in FIG. 5), the motor 72 is operatively coupled to the drive wheel 16. Subsequently the motor 72 is activated to drive the drive wheel 16 to rotate in the cable pushing direction. The shaft of the motor 72 is optionally equipped with a rotary encoder 73 (see FIG. 5) for determining the angular rotation of the drive wheel 16. During rotation of the drive wheel 16 in the cable pushing direction, the rotary encoder 73 tracks the rotation of the motor shaft to generate digital position information representing the length of cable 10 which has been fed past the scanning plane 11.

When a pallet 64 stops at the cable processing module 30, the drive wheel 16 and idler wheel 18 are driven to rotate in a cable pushing direction to cause the cable tip 10b to pass the photoelectric sensor 28, through the funnel 4, and into the cable processing equipment 24. Once the photoelectric sensor 28 is triggered, the rotation encoder 73 will begin to record the position of the cable tip 10b. This provides a way to track the inserted length of the cable 10 in real time, and subsequently cause the motor 72 to stop once the correct length of cable 10 has been fed into the cable processing equipment 24. The drive wheel 16 and idler wheel 18 continue to rotate in the cable pushing direction until a specified length of cable 10 has been inserted into the cable processing equipment 24 via the funnel 22.

FIG. 4A is a diagram representing a side view of a pallet 64 in a position adjacent a cable processing module 30, which pallet 64 is equipped with a reelette 26 for holding a coil of cable 10 and a drive wheel 16 (not visible in FIG. 4A) for feeding an end of the cable 10 into the cable processing module 30 in accordance with a further embodiment. FIG. 4B shows a top view of the pallet 64 in a position adjacent the cable processing module 30. The pallet 64 further includes a cable positioning mechanism 19 that is controlled to place the tip 10b of the cable 10 at a repeatable position at each cable processing module 30.

As seen in FIG. 4A, the cable processing module 30 is mounted on a stationary plate 68. A stanchion 70 is affixed to the stationary plate 68 in a position in front of the cable processing module 30. A motor 72 is mounted to a base 70a of the stanchion 70. The motor 72 has an output shaft 74 which drives rotation of the drive wheel 16 (not visible behind the idler wheel 18 in FIG. 4A). In addition, a photoelectric sensor 28 is mounted to an upright portion 70b of the stanchion 70. The photoelectric sensor 28 is placed at an elevation such that the photoelectric sensor 28 is able to detect the cable tip 10b when it passes through a scanning plane 11 (indicated by a dashed line in FIGS. 4A and 4B) during cable pushing.

In accordance with the embodiment depicted in FIG. 4A, each coil of cable 10 is individually wound onto its own reelette 26, which reelette 26 is supported by and rotatably coupled to the pallet 64. The corral 66 (see in FIGS. 2A-2C) is not shown in FIG. 4A so that the reelette 26 is visible. The reelette 26 has an opening (not shown in FIG. 4A) on its outer periphery through which a portion of the cable 10 (including cable end 10a) passes. FIG. 4A shows a state in which the cable end 10a is disposed between rotating drive wheel 16 and idler wheel 18 (drive wheel 16 is located directly behind the idler wheel 18 and not visible in FIG. 4A), while the cable tip 10b is moving in a direction (indicated by an arrow in FIG. 4A) toward the cable processing module 30.

FIG. 4B shows a top view of the pallet 64 when the cable tip 10b is positioned at a scanning plane 11 of the photoelectric sensor 28. The double-headed straight arrow superimposed on the idler wheel 18 indicates that the idler wheel 18 is laterally movable away from and toward the drive wheel 18. Meanwhile the curved arrows superimposed on the drive wheel 16 and idler wheel 18 are intended to indicate that the drive wheel 16 and idler wheel 18 are rotating in a cable pushing direction. At the instant of time depicted in FIG. 4B, the cable tip 10b is positioned at the scanning plane 11 and is moving toward the cable processing module 30.

The cable processing module 30 includes a computer (not shown in FIGS. 4A and 4B). FIG. 5 is a block diagram identifying some components of a cable processing workstation in accordance with one embodiment. As previously described, each cable processing workstation includes a funnel 22 and cable processing equipment 24 (not shown in FIG. 5, but see FIG. 3). The cable processing workstation further includes a computer 162 that is configured to control various actuators and motors by executing pre-programmed sequences of machine control commands, such as computer numerical control commands. FIG. 5 depicts an example wherein the computer 162 is programmed to send control signals to various electrically controlled valves 80 which may be opened to supply compressed air from a compressed air supply 82 to one or more of a multiplicity of pneumatic cylinders 84, 86 and 88. The pneumatic cylinders 84, 86 and 88 may be used to move various components of the cable processing equipment 24. In alternative embodiments, the pneumatic cylinders may be replaced by electric motors.

The cable processing workstation depicted in FIG. 5 further includes a motor 72 and a rotation encoder 73 operatively coupled to the output shaft 74 of the motor 72. The rotation encoder 73 generates pulses which the computer 162 is configured to count for the purpose of determining the number of degrees of motor output shaft rotation, which angular measurement in turns represents a distance traveled by the cable tip 10b during that output shaft rotation. The computer 162 also receives sensor feedback from a photoelectric sensor 28 used to detect a cable tip position and a pallet detector 160 used to detect a pallet position. The computer 162 is configured to send commands to a motor controller 164 for controlling the motor 72 in accordance with feedback from photoelectric sensor 28, rotation encoder 73 and pallet detector 160.

The computer 162 of each cable processing module 30 is configured to perform the following operations: activate the motor 72 to drive rotation of the drive wheel 16 in a cable pushing direction to cause a specified length of cable 10 to be inserted into the cable processing equipment 24; activate the cable processing equipment 24 to perform an operation on the inserted cable end 10*a*; and activate the motor 72 to drive rotation of the drive wheel 16 in a cable pulling direction to cause the specified length of cable 10 to be removed from the cable processing equipment 14.

Each workstation comprises a rotation encoder 73 configured to output pulses representing the incremental angular rotations of an output shaft of the motor 72. The photoelectric sensor 28 is positioned and configured to issue a cable tip position signal indicating that interruption of transmitted light in the scanning plane 11 has started. In other words, the cable tip position signal is issued in response to the photoelectric sensor 28 detecting that a state of light not being blocked in the scanning plane 11 has transitioned to a state of light being blocked. The computer 162 is further configured to start a count of pulses output by the rotation encoder 73 in response to the cable tip position signal and then de-activate the motor 72 in response to the count reaching a specified value corresponding to a specific target length of cable 10 having been inserted in the cable processing equipment 24.

The photoelectric sensor 28 that detects the position of the cable tip 10*b* in each cable processing module 30 may be of the same type as the photoelectric sensor 28 incorporated in the cable tip positioning module 38. For example, digital laser sensors of various types are suitable. Many adaptable options are available off the shelf, such as proximity sensors and vision sensors.

In accordance with some embodiments, the photoelectric sensor 28 used to detect cable tip position is of a type that is also capable of measuring the diameter of the cable 10 to ensure that false positives are not caused by fingers or other objects larger than the typical cable diameter. The diameter measurement may also be used to confirm that the cable 10 is of the type expected by the computer 162 of the cable processing module 30.

In accordance with one proposed implementation, the photoelectric sensor 28 is a laser sensor of the "position recognition" type (a.k.a. a laser scan micrometer). In a laser scanner of this type, a scanning laser beam is emitted from a scanning light beam transmitter 28*a*, which scanning light beam scans in the scanning plane 11 and is then received by the light-detecting sensor 28*b*. In accordance with one embodiment, the light-detecting sensor 28*b* includes a linear array of light-detecting elements (e.g., a column of pixels in a charge coupled device). The area where the scanning laser beam is interrupted is identified clearly on the light-detecting sensor 28*b*. This type of laser sensor may be used for in-line cable tip position detection or cable outer diameter measurement.

The computer 162 of the cable processing module 30 is further configured to perform the following operations: compute a length of an interruption in light received by the light-detecting sensor 28*b* from the scanning light beam transmitter 28*a*; compare the computed length of the interruption to reference data representing a diameter of the type of cable 10 to be processed; and issue an alert signal when a difference of the computed length of the interruption and the reference data exceeds a specified threshold.

In accordance with other embodiments, the above-described cable positioning system may be used to position the tip of the cable at multiple positions within any given processing module. Such feature allows multi-step processing within a single module. The tip of the cable, for example, could be positioned at multiple positions within the laser scoring module 40 to allow the laser to score the cable in multiple locations. For very long strip lengths (four inches for example) the cable could be laser scored every inch. The jacket slug pulling module 42 would then pull of each one-inch slug one at a time (again using multi-step insertion). Thus the jacket puller only needs to overcome pull-off friction forces for one inch of jacket instead of four inches of jacket.

Referring again to FIG. 1, after the jacket slug pulling module 42 has pulled off the jacket slug 2*a* of the cable 10, the pallet 64 moves to the shield trimming module 44. The shield trimming module 44 incorporates equipment for trimming off a portion of the exposed portion of the shield 4 to reveal respective end portions of the wires 6 and 8 of the cable 10. This equipment will be referred to hereinafter as "shield trimming apparatus".

Figure 6:
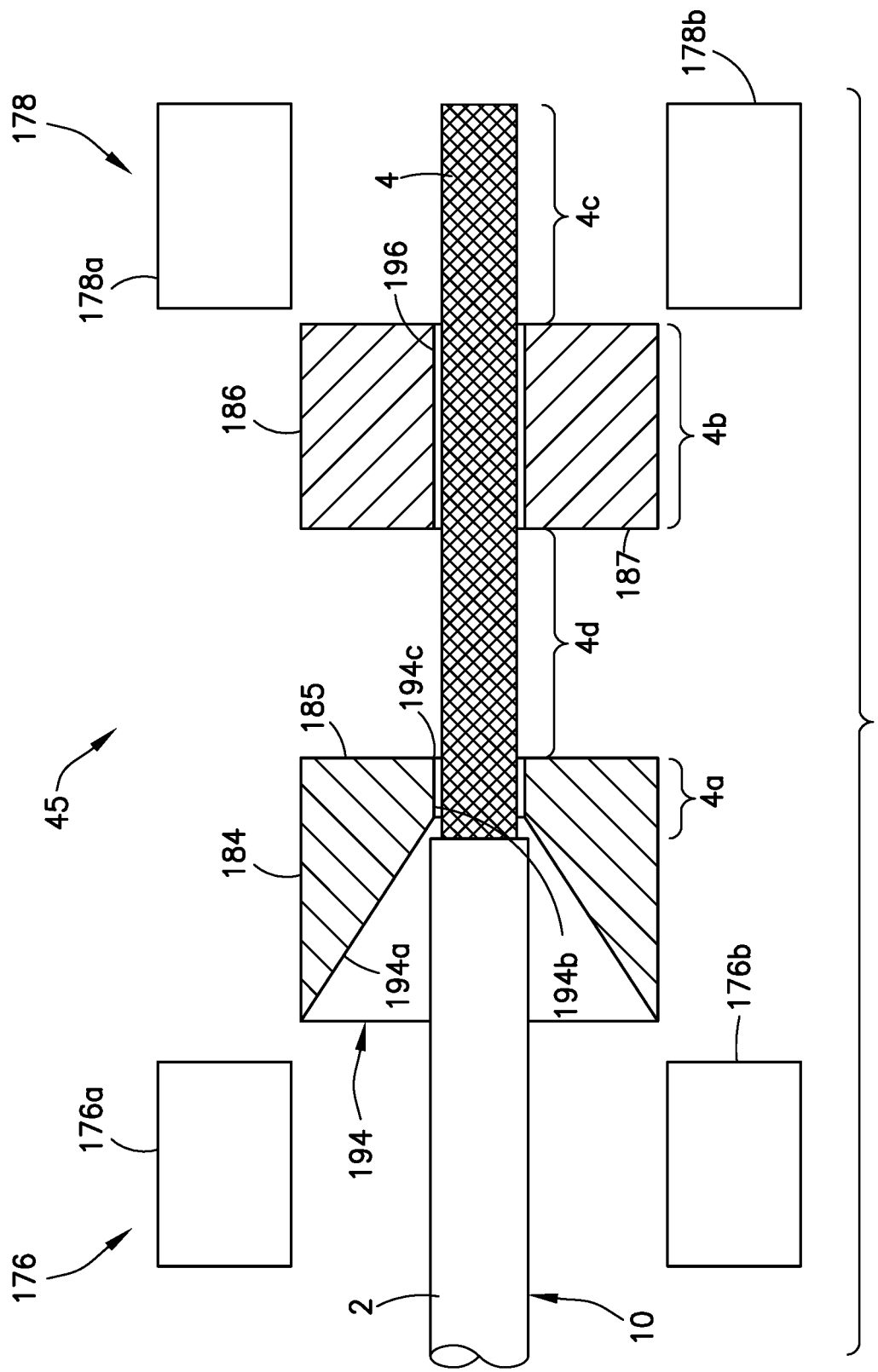
FIG. 6 is a diagram representing a partially sectional view of some components of a shield trimming apparatus in accordance with one embodiment.

FIG. 6 is a diagram representing a partially sectional view of some components of a shield trimming apparatus 45 in accordance with one embodiment. The shield trimming apparatus 45 includes a cable gripper 176, a first press die 184, a second press die 186 and a shield gripper 178. The dies are shown in section; the grippers are not. In accordance with one embodiment, the cable gripper 176 and first press die 184 are stationary; the second press die 186 and shield gripper 178 are translatable relative to the cable gripper 176 and first press die 184. In accordance with another embodiment, the cable gripper 176 may be movable relative to the first press die 184 (particularly when the shield trimmer is used as manually-loaded benchtop equipment).

In the case where the shield trimming apparatus 45 depicted in FIG. 6 is set up at a workstation in an automated production line of the type depicted in FIG. 1, the end 10*a* of the cable 10 may be fed by a drive roller 16 first into a funnel 22 (see FIG. 3) and then into shield trimming apparatus 45. Alternatively, the shield trimming apparatus 45 disclosed herein may be configured as benchtop equipment, in which case the unjacketed end 10*a* of the cable 10 may be fed to the correct entry point manually.

As seen in FIG. 6, the cable gripper 176 includes a pair of cable gripper fingers 176*a* and 176*b*; the shield gripper 178 includes a pair of shield gripper fingers 178*a* and 178*b*. The cable gripper fingers 176*a* and 176*b* are translatable in opposite directions to open or close the cable gripper 176. Similarly, the shield gripper fingers 178*a* and 178*b* are translatable in opposite directions to open or close the shield gripper 178. The cable gripper 176 is located on the front (entry) side of the shield trimming apparatus 45. When the cable gripper fingers 176*a* and 176*b* are closed, the cable gripper 176 maintains the position of the cable 10 during processing. The shield gripper 178 (which is movable) is located on the rear side of the shield trimming apparatus 45 and grips the exposed shield 4 of the cable 10.

In the scenario depicted in FIG. 6, the end of the cable 10 has been inserted into the holes 194 and 196 of the first and second press dies 184 and 186 (which are separated by a distance), but has not yet been gripped by the cable gripper 176 and shield gripper 178. In this positional state: (a) a first exposed shield portion 4*a* of shield 4 is disposed inside the first press die 184; (b) a second exposed shield portion 4*b* of shield 4 is disposed inside the second press die 186; (c) a third exposed shield portion 4*d* of shield 4 (connecting the first and second exposed shield portions 4a and 4b) is disposed in the space separating the first and second press dies 184 and 186; and (d) a fourth exposed shield portion 4c of shield 4 is disposed between shield gripper fingers 178a and 178b.

Figure 7:
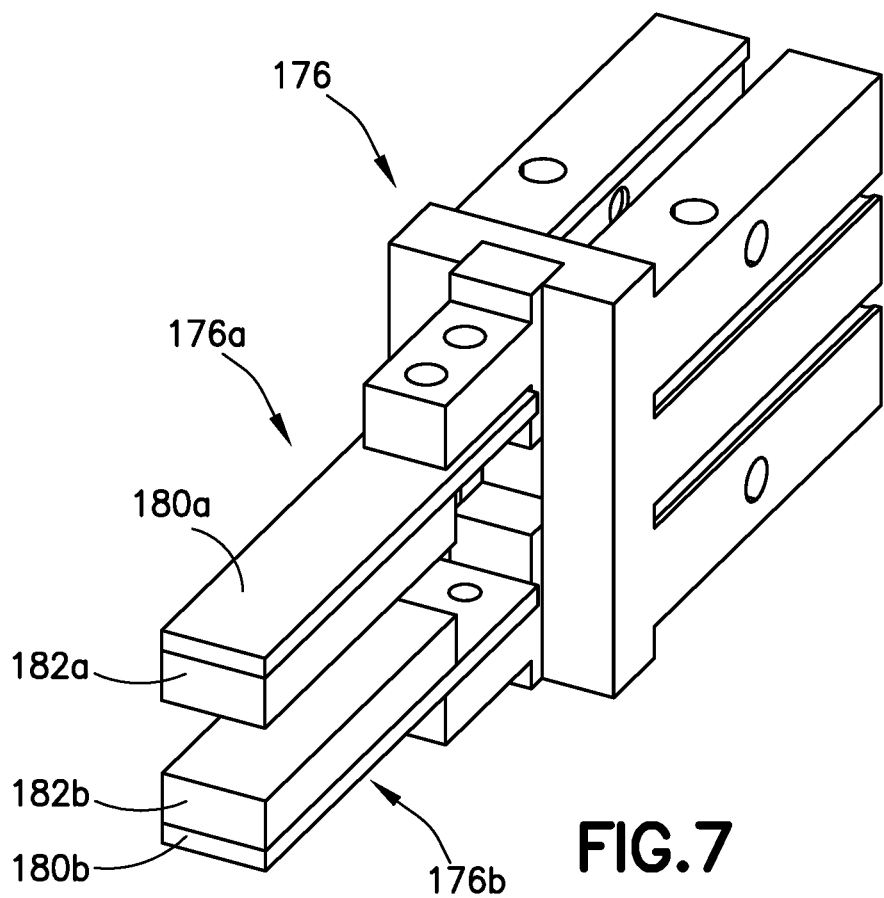
FIG. 7 is a diagram showing a view of a cable gripper in the form of a pneumatic pick-and-place gripper in accordance with one proposed implementation.

FIG. 7 is a diagram showing a view of a cable gripper 176 in the form of a pneumatic pick-and-place gripper in accordance with one embodiment. In accordance with an alternative embodiment, a servo-actuated gripper may be employed. In either case, the cable gripper fingers 176a and 176b are preferably lined with a compliant material that can conform around the profile of the cable in order to maximize the area of contact between the gripper pads and the cable, but does not damage the cable when the cable gripper 176 is actuated closed. Cables processed using the equipment disclosed herein may have many different cross-sectional profiles, depending on the number of wires within the cable, so it is important that the material be compliant enough to conform over different cable profiles while maintaining effective grip.

The embodiment of a cable gripper 176 depicted in FIG. 7 has two opposing cable gripper fingers 176a and 176b. The cable finger 176a includes a finger beam 180a made of a non-compliant material (e.g., steel) and a gripping pad 182a made of compliant material (e.g., rubber or silicone) attached to a bottom surface of the finger beam 180a. Similarly, the cable finger 176b includes a finger beam 180b made of a non-compliant material and a gripping pad 182b made of compliant material attached to the top surface of the finger beam 180b. The gripping pads 182a and 182b make contact with the cable when the cable gripper 176 is actuated. The gripping pads 182a and 182b do not necessarily have to contact each other. The cable gripper 176 should have uniform smooth surfaces and be devoid of any sharp edges or rough surfaces that could dig into, tear, or otherwise damage the outer jacket of the cable. The gripping pads 182a and 182b should be large enough to maintain an effective amount of grip on the cable. In one proposed implementation, the gripping pads 182a and 182b were oriented such that they made contact along 0.5 inch of the cable. The shield gripper 178 may have a construction identical to the cable gripper 176 depicted in FIG. 6.

The cable and shield grippers 176 and 178 may be pneumatically or servo actuated with force feedback. Suitable methods of force feedback include using modulated air pressure or using a load cell/strain gauge. The gripping force should not be so large that the cable risks becoming crushed; however, it should be large enough such that the cable does not slide or otherwise move during processing. The cable and shield grippers 176 and 178 should be able to open wide enough to allow cable to pass through/between without contacting the cable.

Referring again to FIG. 6, the first press die 184 is a plate that has been drilled through with at least one hole 194 for the cable 10 to pass through. The hole 194 includes a countersunk feature that acts as a guiding funnel during cable insertion. More specifically, the hole 194 includes a circular conical section 194a and a circular cylindrical section 194b that terminates at a hole edge 194c. Besides its guiding effect, another possible purpose of the circular conical section narrowing is to provide a circumferential surface that will stop the end of jacket 2 from entering circular cylindrical section 194b of hole 194. Possibly other mechanisms can be used to stop the cable 10 from further entering hole 194 or prevent the inserted portion of the cable 10 exceeding a specified length. The second press die 186 (also a plate) has a hole 196 through which the unjacketed portion of the cable 10 is passed. The hole 196 may be a circular cylindrical bore. The hole 196 of the second press die 186 is aligned or centered with the circular cylindrical section 194b of the hole 194 formed in the first press die 184. As used herein, the term "aligned", in the context of two circular cylindrical or conical holes, means that the center axes of the holes are coaxial or nearly coaxial.

The first press die 184 should be made of a material that produces a sharp edge along the hole edge 194c and is hard enough to maintain hole features without excessive wearing along the hole edges. An example suitable material is tool steel. Other examples include metals that have been heat treated, cold worked, or processed in some other way to increase the hardness of the metal (or change other properties associated with wear resistance). The second press die 186 may be made of a similar material.

The only portion of the first press die 184 that is at risk of wear is the hole edge 194c. The holes must be drilled through a hard, wear-resistant material. However, the entirety of the first press die 184 does not have to be made of wear-resistant material if there is a replaceable, internal "die" made of wear-resistant material. The internal die could be attached to the first press die 184 using fasteners or a slide-in track.

Figure 8:
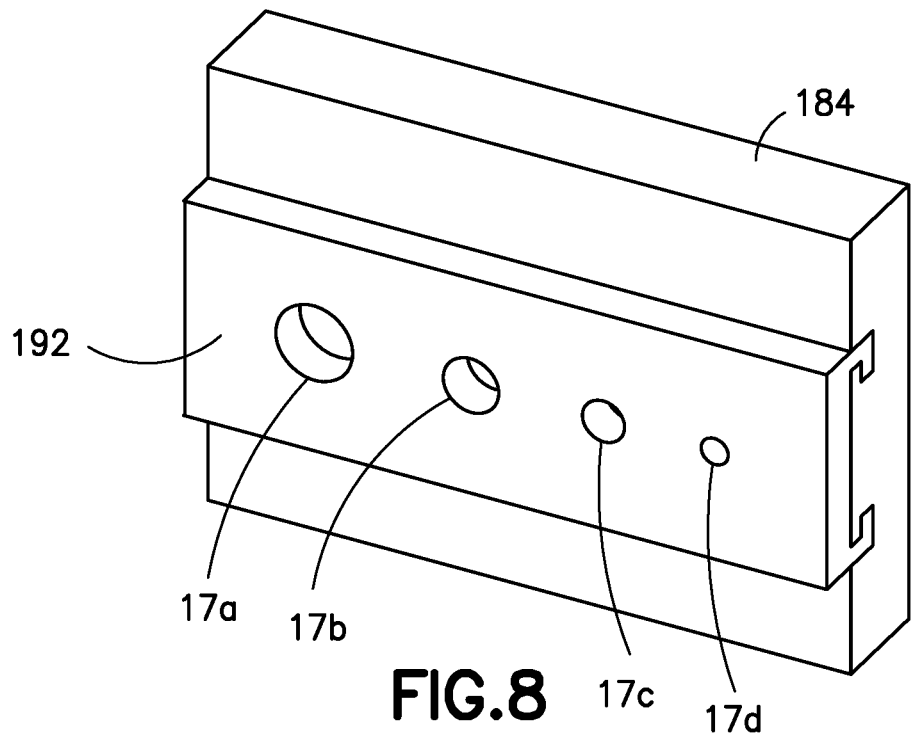
FIG. 8 is a diagram showing a view of a press die having a slide-in internal die with a multiplicity of holes of different sizes.

Optionally, the first press die 184 may have a cable entry hole system that includes a multiplicity of holes having different configurations, including different sizes and/or different shapes. Only one hole 194 is visible in FIG. 6 (but see FIG. 19A). The second press die 186 would also be constructed to have a multiplicity of holes which respectively align with multiplicity of holes of the first press die 184. FIG. 8 is a diagram showing a view of a first press die 184 having a slide-in internal die 192 with a multiplicity of holes 17a-17d of different sizes. The cable may be inserted into any one of the holes 17a-17d while the first press die 184 is stationary.

The holes 194 and 196 in the first and second press dies 184 and 186 respectively should be configured to permit passage of the cable based on the cable diameter. As will be explained in more detail below, during the automated shield trimming process, the exposed shield portion 4d (see FIG. 6) will expand radially outward, becoming bunched between the confronting surfaces 185 and 187 of the first and second press dies 184 and 186 respectively. it is important that the shield 4 become bunched between the confronting surfaces 185 and 187, not within the holes 194 and 196. This is because the trim occurs when the shield strands deflect radially outward past the hole edge 194c, and then tear across the hole edge 194c upon removal of the cable 10. To prevent shield strands from deflecting radially outward (bunching up?) outside of the intended area, i.e., the space that separates the first and second press dies 184 and 186, the diameter of the circular cylindrical section 194b of hole 194 and the diameter of hole 196 must be scaled based on the cable diameter. In accordance with one proposed implementation, the hole diameters exceeded the unjacketed cable diameter by less than 0.036 inch.

Figure 9:
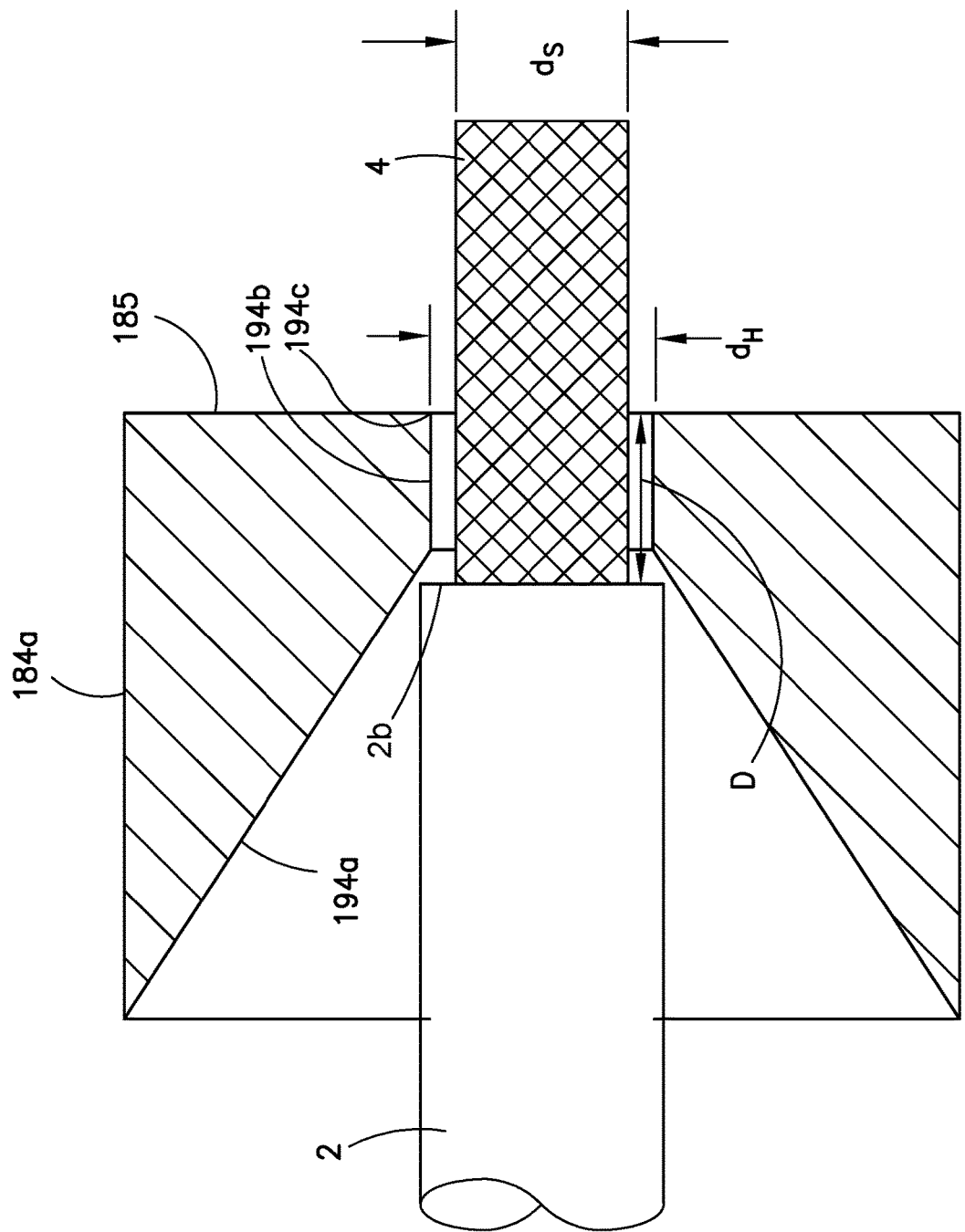
FIG. 9 is a diagram showing measurements which may be used to determine an optimal position of the end of the cable jacket relative to a hole edge of a press die (shown in section) where the shield will be torn.

FIG. 9 is a diagram showing a sectional view of a press die 184a in accordance with one embodiment. The press die 184a has a hole 194 that includes a circular conical section 194a and a circular cylindrical section 194b that terminates at a circular hole edge 194c. FIG. 9 also shows measurements which may be used to determine an optimal position of the end 2b of the cable jacket 2 relative to the hole edge 194c where the shield 4 will be torn. In order to produce, for example, a 0.25 inch shield trim, the end 2b of the cable jacket 2 must be located at a certain distance D away from the hole edge 194c. In one proposed implementation, the distance D is equal to the first exposed shield portion 4a of shield 4 as defined in FIG. 6. This distance D can be used to position cables in a repeatable location for processing, and can be determined as the length of the exposed shield in the hole 194. To obtain an exemplary length of 0.25" for the trimmed exposed shield, the portion of the shield bunch 188 that flares outward to the hole edge 194c should be taken into account. Accordingly, in accordance with the particular example being discussed here, the distance D between the end 2b of the cable jacket 2 and the hole edge 194c equals 0.25 inch minus half the difference between the diameter $d_H$ of the circular cylindrical section 194b of hole 194 and the diameter $d_S$ of the exposed shield 4 of the unjacketed portion of the cable 10, which relationship may be expressed as follows:

$$D=0.25-(d_H-d_S)/2$$

where $(d_H-d_S)/2$ represents the extent of the portion of the shield bunch 188 that flares outward to the hole edge 194c. Once a determination has been made regarding the optimal value of the distance D separating the end 2b of the cable jacket 2 from the hole edge 194c of the first press die 184a, this information may be used to design the hole 194 such that the narrowing of the circular conical section 194a prevents the impinging end 2b of the cable jacket 2 from moving further forward.

This concept could work for a benchtop apparatus used to process cables of a very similar outer diameter, which would be advantageous because the operator could just "bottom out" the cable in the hole. However, the system disclosed herein may be used to process cables of many different diameters and jacket thicknesses. For a fully automated system, a preferred arrangement would be to use a larger-than-jacket hole and use the drive wheel 16 and idler wheel 18 to properly position the cable 10 within the hole.

Figure 10:
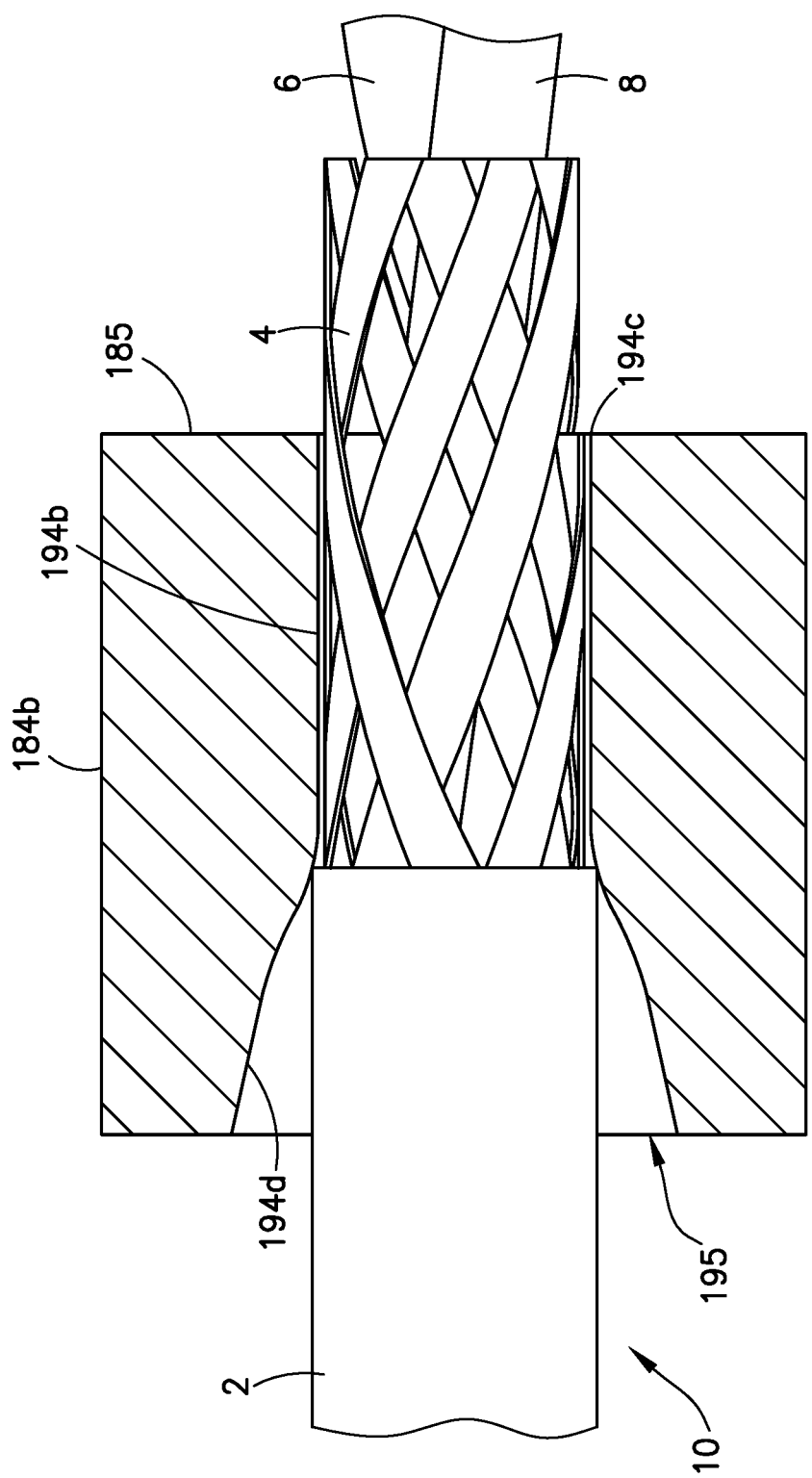
FIG. 10 is a diagram showing a sectional view of a press die in accordance with an alternative embodiment.

FIG. 10 is a diagram showing a sectional view of a press die 184b in accordance with an alternative embodiment regarding the shape of the hole 195. For the sake of illustration, FIG. 10 depicts a press die 184b having a portion of a twisted-pair shielded cable 10 inserted in a hole 195. However, a shield trimming apparatus having press die 184b could also be used to trim the shielding of cables containing other numbers and configurations of electrical wires.

Referring to FIG. 10, the hole 195 in press die 184b differs in shape from the hole 194 depicted in FIG. 6. The difference is that hole 195 has a funnel-shaped section 194d which is not a truncated circular cone. More specifically, the rate at which the diameter of the funnel-shaped section 194d decreases is not linear and decreases more rapidly in the region adjacent to the circular cylindrical section 194b. Again, in one embodiment, besides its guiding effect, one possible purpose of such narrowing is to provide a circumferential surface that will stop the end 2b of jacket 2 from entering circular cylindrical section 194b of hole 195.

Referring again to FIG. 6, the second press die 186 may have a construction similar to that of the first press die 184 and may be made of the same material. The second press die 186 includes a hole 196 that has a similar diameter (hole 196 may be slightly larger than hole 194 to ensure the cable does not snag when inserted) and is aligned with the circular cylindrical section 194b of hole 194 in the first press die 184. The second press die 186 is able to move (e.g., translate) relative to the first press die 184. In one embodiment, press die 184 is stationary. The second press die 186 may be displaced by a pneumatic or electrical linear actuator. For example, the linear actuator may take the form of a double-acting pneumatic cylinder having a piston, the end of the piston being coupled to the second press die 186. In another example, the linear actuator may take the form of a lead screw that threadably engages a nut attached to the linear actuator, the lead screw being driven to rotate by a servo motor. In any case, the second press die 186 may be mounted on a carriage that rides on a pair of linear tracks that allow only translation back and forth between two limit positions.

Still referring to FIG. 6, the shield gripper 178 may have a construction similar if not identical to the structure of the cable gripper 176 depicted in FIG. 7. The shield gripper 178 is located on the rear side of the apparatus and grips the exposed shield 4 of the cable 10. While gripping the shield 4, the shield gripper 178 moves with second press die 186; this causes the shield 4 to move over the wires 6 and 8 and bunch between the first and second press dies 184 and 186. The shield gripper fingers 178a and 178b should have gripping pads (similar to gripping pads 182a and 182b seen in FIG. 7) large enough to maintain an effective amount of grip on the cable shield 4. The shield gripper 178 may be pneumatically or servo actuated with force feedback. In the case of pneumatic actuation, the shield gripper 178 may be actuated using reduced pneumatic pressure compared to the pneumatic pressure used to actuate the cable gripper 176.

The gripping force exerted by the shield gripper 178 should be large enough to effectively grip the shield 4 and slide the shield over the underlying wires 6 and 8 to form the desired "bunching". It is important that the force not be so large that the shield 4 and/or wires 6, 8 are crushed or damaged. Additionally, if the force is so large that the underlying wires 6 and 8 are also gripped, the wires 6 and 8 could be bunched, deformed and squeezed and/or crushed between the mutually confronting surfaces 185 and 187 of the first and second press dies 184 and 186 when the second press die 186 is actuated, causing significant damage to the cable 10. Also, the shield gripper fingers 178a and 178b should be separable by a distance sufficient to allow the cable 10 to pass through/between without contacting the cable 10.

The operation of the shield trimming apparatus 45 depicted in FIG. 6 will now be described in further detail. FIGS. 11A through 11G are diagrams represent respective partially sectional views of a shield trimming apparatus 45 for trimming a portion of a shield 4 from the cable 10a at seven stages in an automated shield trimming operation.

Figure 11A:
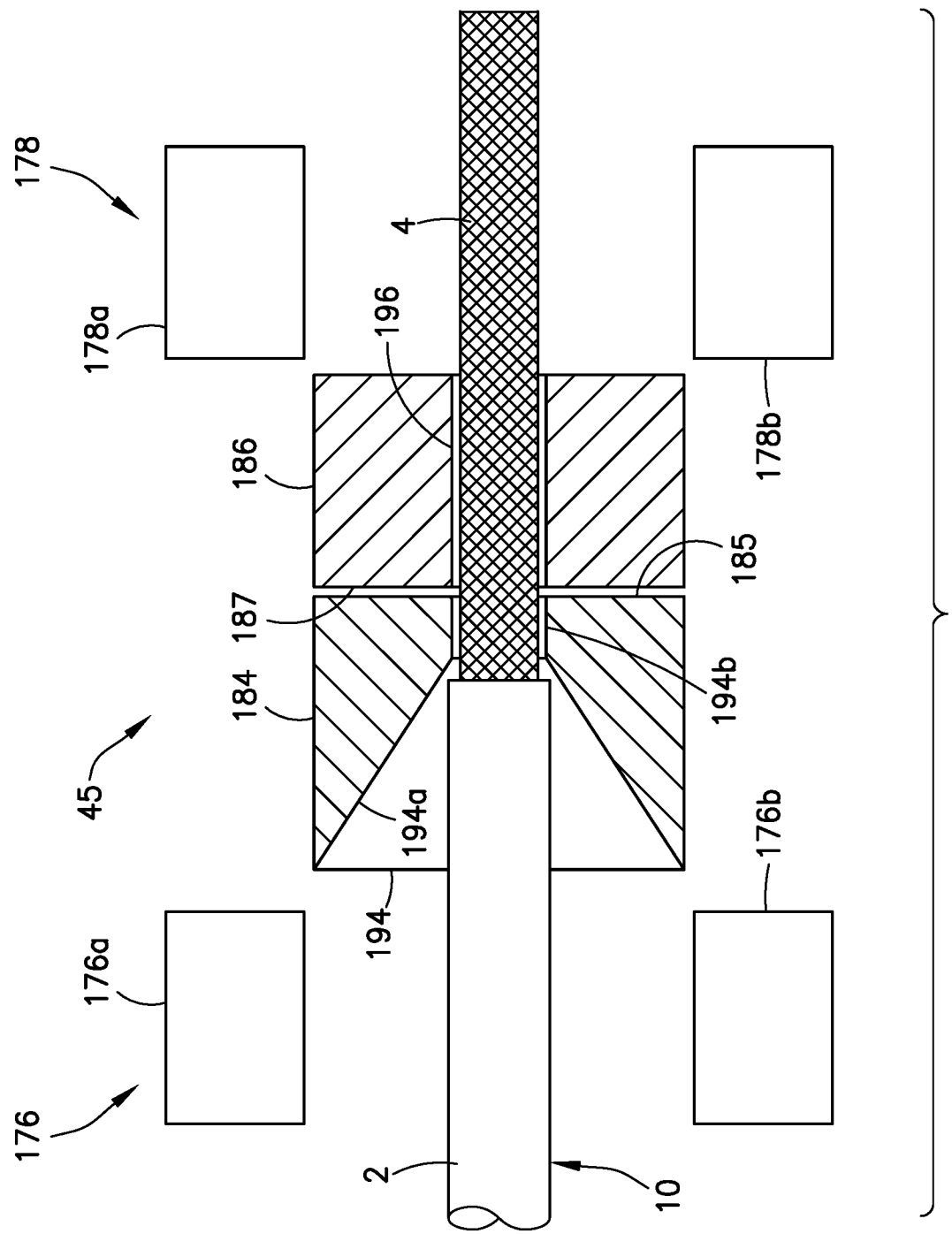
FIGS. 11A through 11G are diagrams representing respective partially sectional views of an apparatus for trimming a portion of a shield from the end of a cable at seven stages in an automated shield trimming operation.
Figure 11B:
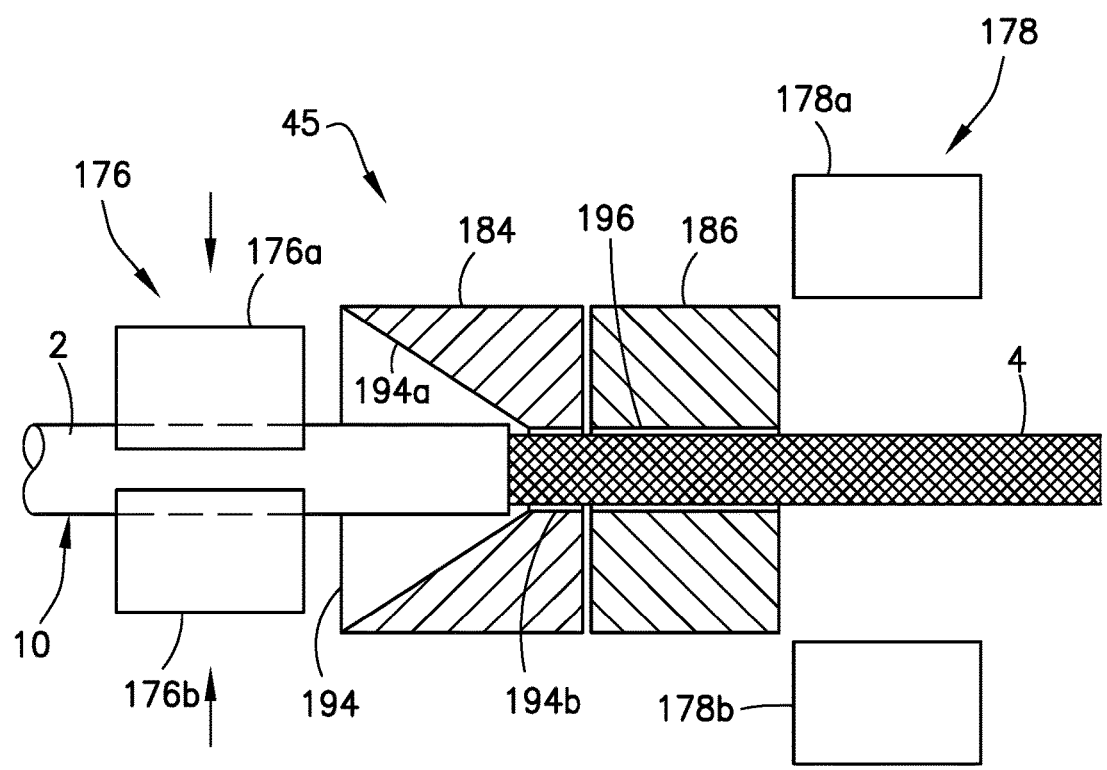
Figure 11C:
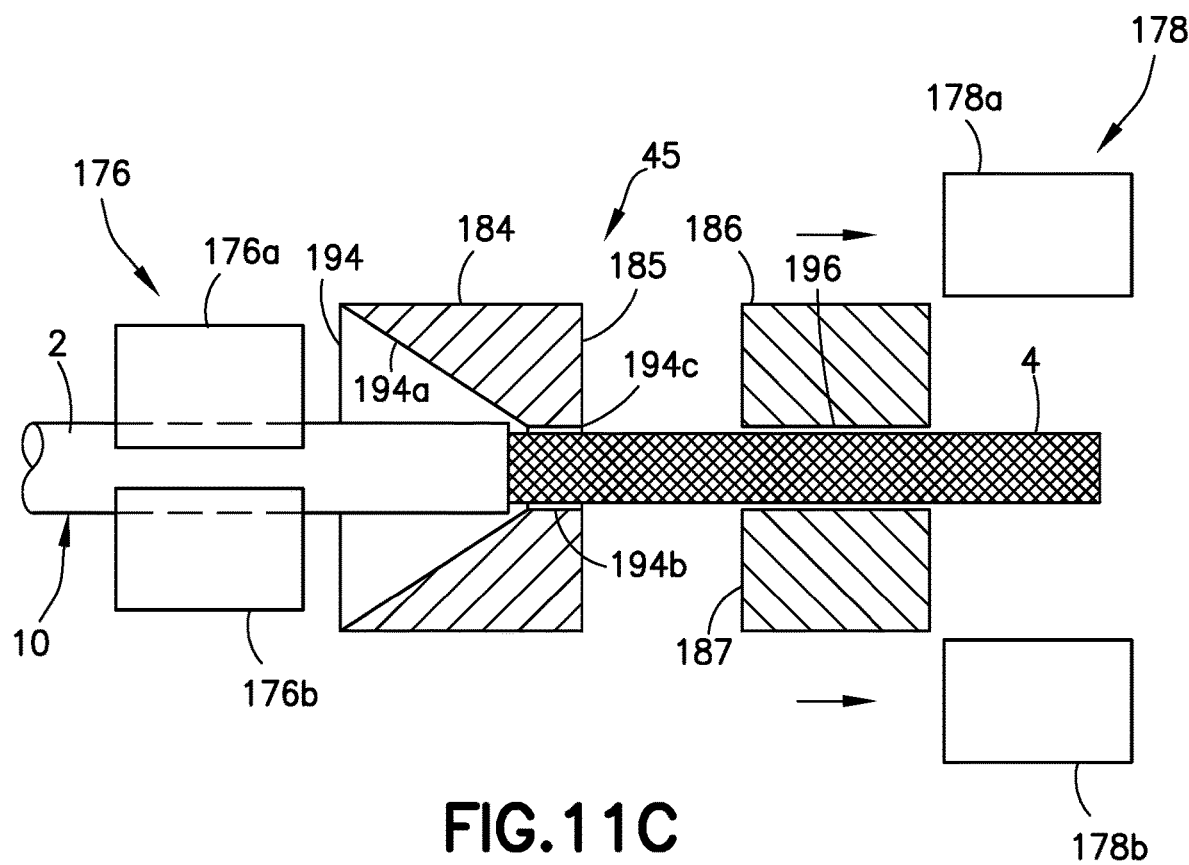

FIG. 11A is a partially sectional view of a shield trimming apparatus 45 previously described in some detail with reference to FIG. 6 The shield trimming apparatus 45 includes a cable gripper 176, a first press die 184, a second press die 186 and a shield gripper 178. The dies are shown in section; the grippers are not. The cable gripper 176 and first press die 184 are stationary; the second press die 186 and shield gripper 178 are translatable relative to the first press die 184 between the axial position shown in FIGS. 11A, 11B and 11E-11G and the axial position shown in FIGS. 11C and 11D.

Figure 11D:
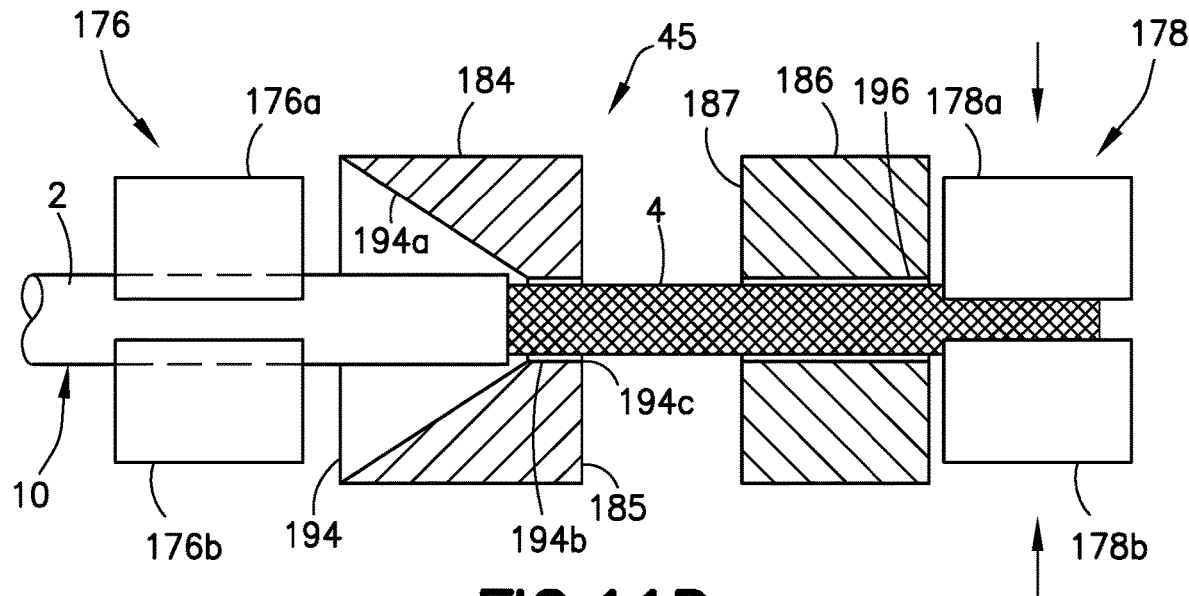
Figure 11E:
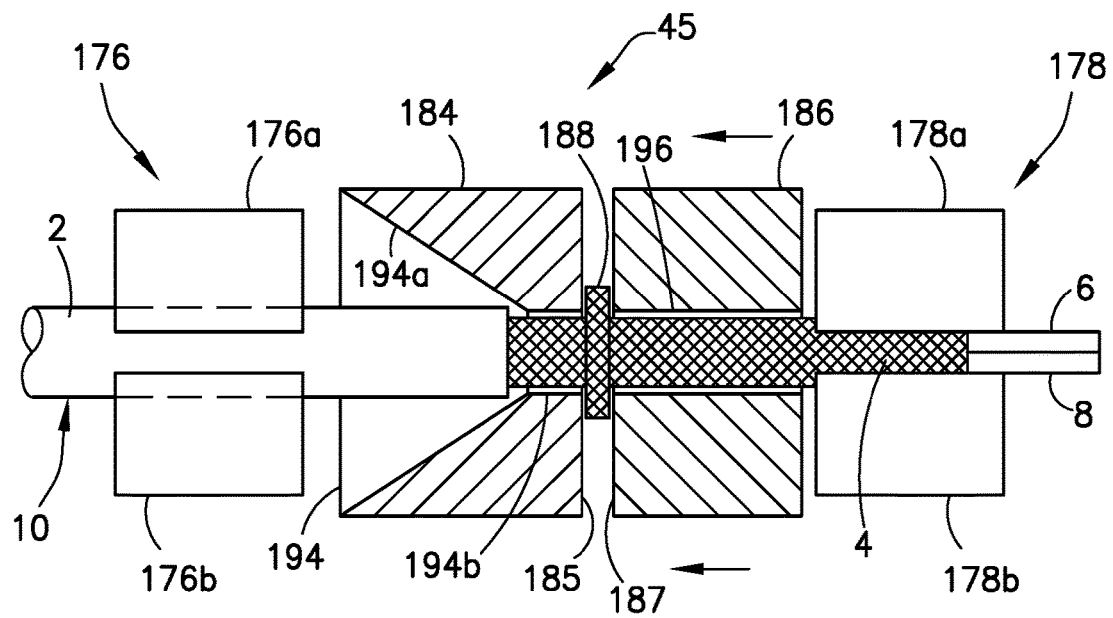
Figure 11F:
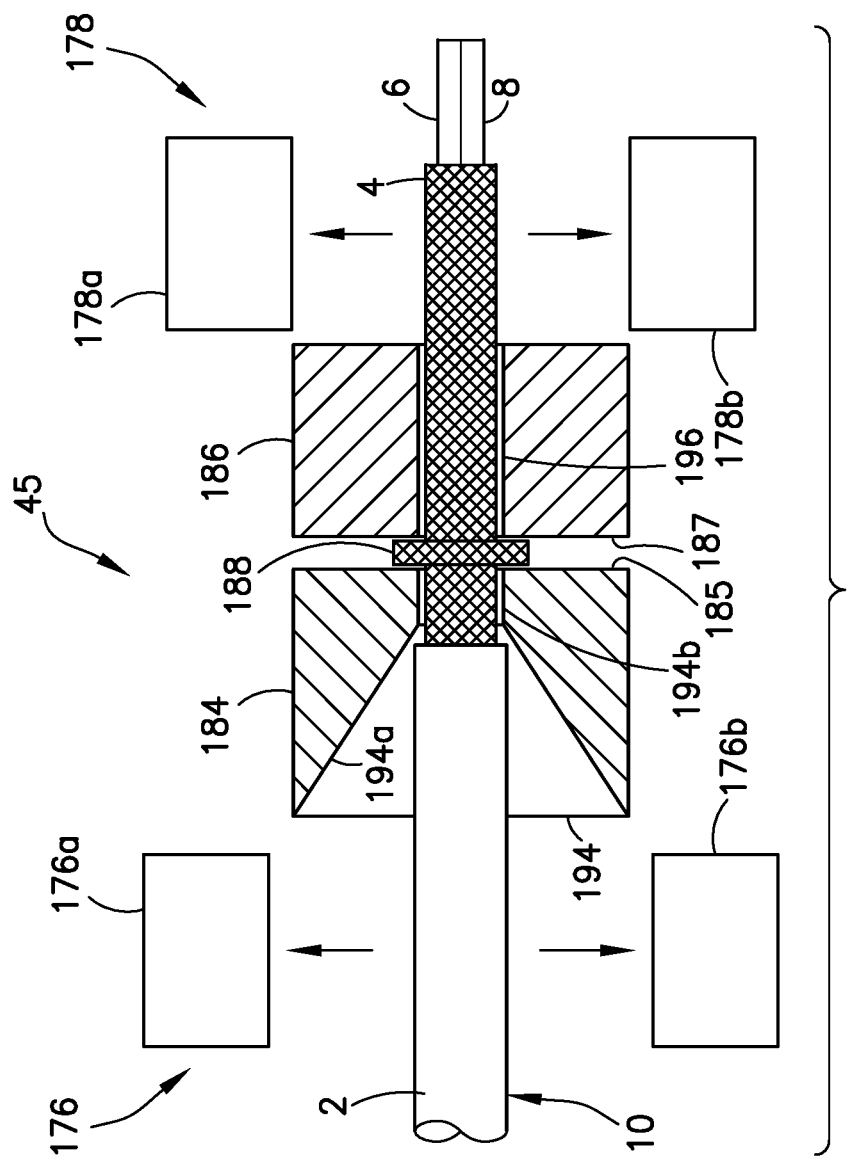
Figure 11G:
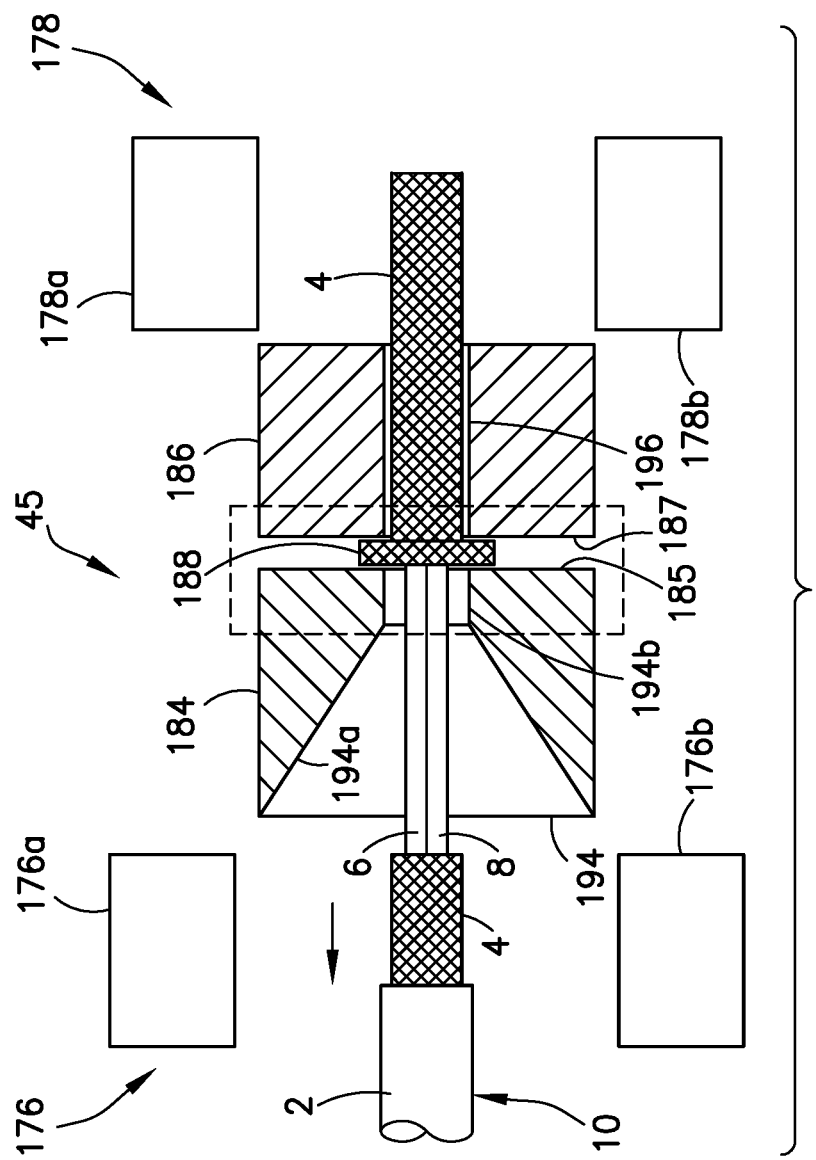

As seen in FIG. 11A, the cable gripper 176 includes a pair of cable gripper fingers 176a and 176b; the shield gripper 178 includes a pair of shield gripper fingers 178a and 178b. The cable gripper fingers 176a and 176b of the cable gripper 176 are translatable in opposite directions between respective open positions (as seen in FIGS. 11A, 11F and 11G) and respective closed positions (as seen in FIGS. 11B-11E). The shield gripper fingers 178a and 178b of the shield gripper 178 are translatable in opposite directions between respective open positions (as seen in FIGS. 11A-17C, 11F and 11G) and respective closed positions (as seen in FIGS. 11D and 11E). The cable gripper 176 is located on the front (entry) side of the shield trimming apparatus 45. When the cable gripper fingers 176a and 176b are closed, the cable gripper 176 maintains the position of the cable 10 during processing. The shield gripper 178 is located on the rear side of the shield trimming apparatus 45 and grips the exposed shield 4 of the cable 10.

The cable gripper 176 may be actuated to grip the cable 10 by respective double-acting pneumatic cylinders or electric motors with lead screws or other suitable means. Similarly, the shield gripper 176 may be actuated to grip the shield 4 by respective double-acting pneumatic cylinders or electric motors with lead screws or other suitable means. Preferably the grippers are pneumatically or servo actuated with force feedback. Suitable methods of force feedback include using modulated air pressure or a load cell/strain gauge.

In the first stage depicted in FIG. 11A, the second press die 186 is pushed against the first press die 184 to eliminate any gap that may allow the cable to pass through both dies without misalignment or snagging of the exposed shielding at the entrance of the hole 196 of the second press die 186. Both the cable gripper 176 and the shield gripper 178 are open. A cable 10 having an unjacketed cable end with exposed shield 4 is inserted through both of the first and second press dies 184 and 186. In the second stage depicted in FIG. 11B, the cable gripper 176 is closed to hold the cable 10 in place. In the third stage depicted in FIG. 11C, the second press die 186 is moved away from the first press die 184. In the fourth stage of depicted in FIG. 11D, the shield gripper 178 is closed to grip the shield 4. In the fifth stage depicted in FIG. 11E, the second press die 186 and the shield gripper 178 are moved in unison toward the first press die 184. This causes a portion 188 of the shield 4 to bunch (hereinafter "shield bunch 188") between the first and second press dies 184 and 186 and become pinched between the press dies. The shield gripper 186 causes portions 4b and 4c of the exposed shield 4 to slide over the wires 6 and 8 and the second press die 186 constrains portion 4b of the sliding portion from displacing radially outward. In the sixth stage depicted in FIG. 11F, the cable and shield grippers 176 and 178 both open to release the cable 10 while the shield bunch 188 of shield 4 remains pinched between the first and second press dies 184 and 186. In the seventh stage depicted in FIG. 11G, the cable 10 is removed from the shield trimming apparatus 45. When the cable 10 starts to retract in the direction indicated by the arrow in FIG. 11G, the shield strands connecting the shield bunch 188 to an adjacent unbunched portion of the shield 4 are torn across the stress concentration points created by the hole edge 194c (best seen in FIGS. 11C and 11D) of the first press die 184, resulting in a uniformly trimmed shield.

In a fully automated system, the cable 10 may be removed from the shield trimming apparatus 45 by activating the drive wheel 16 (see, for example, FIG. 3) to rotate in a cable pulling direction. In the case of a benchtop version, the cable 10 may be removed manually by pulling the cable out to break shield strands or by having cable gripper 176 move away from hole 194 to move the cable 10 out enough to break the shield strands.

Figure 12:
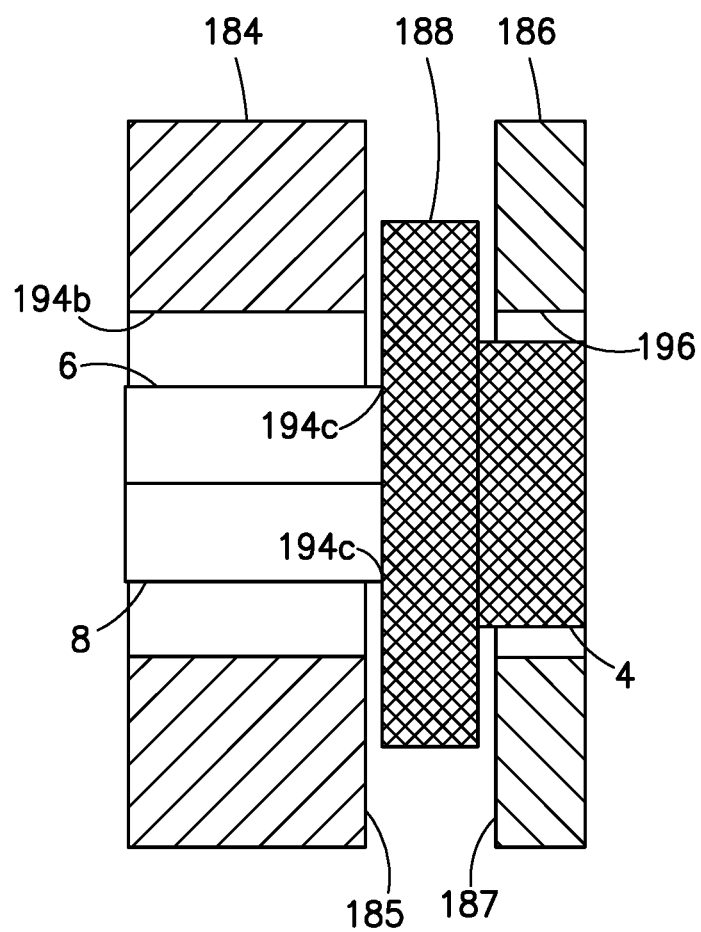
FIG. 12 is a diagram representing a magnified view of the portion of FIG. 11G inside the dashed rectangle indicated in FIG. 11G.

The portion of the shield 4 that has been trimmed off is partly depicted in FIG. 12, which shows a magnified view of the portion of FIG. 11G inside the dashed rectangle indicated in FIG. 11G. As seen in FIG. 12, the shield bunch 188 of the shield 4 remains momentarily pinched between the confronting surfaces 185 and 187 of the first and second press dies 184 and 186 as the wires 6 and 8 of the cable 10 are pulled out of the portion of the shield (hereinafter "shield debris") remaining in the second press die 186.

Various methods may be employed to remove the shield debris from the shield trimming apparatus 45 after each shield trim procedure. An air blast, air suction, pneumatic gripper, manual removal, or some combination of these solutions could be used. In addition, a removable tray may be provided. The shield debris could be funneled into the tray, which tray may be periodically removed and then emptied by the system operator.

After the shield trimming module 44 has trimmed the shield 4 of the cable 10, the pallet 64 moves to the shield trim inspection module 46 (see FIG. 1). The shield trim inspection module 46 performs a quality check of the trimmed shield using a vision inspection system.

Figure 13:
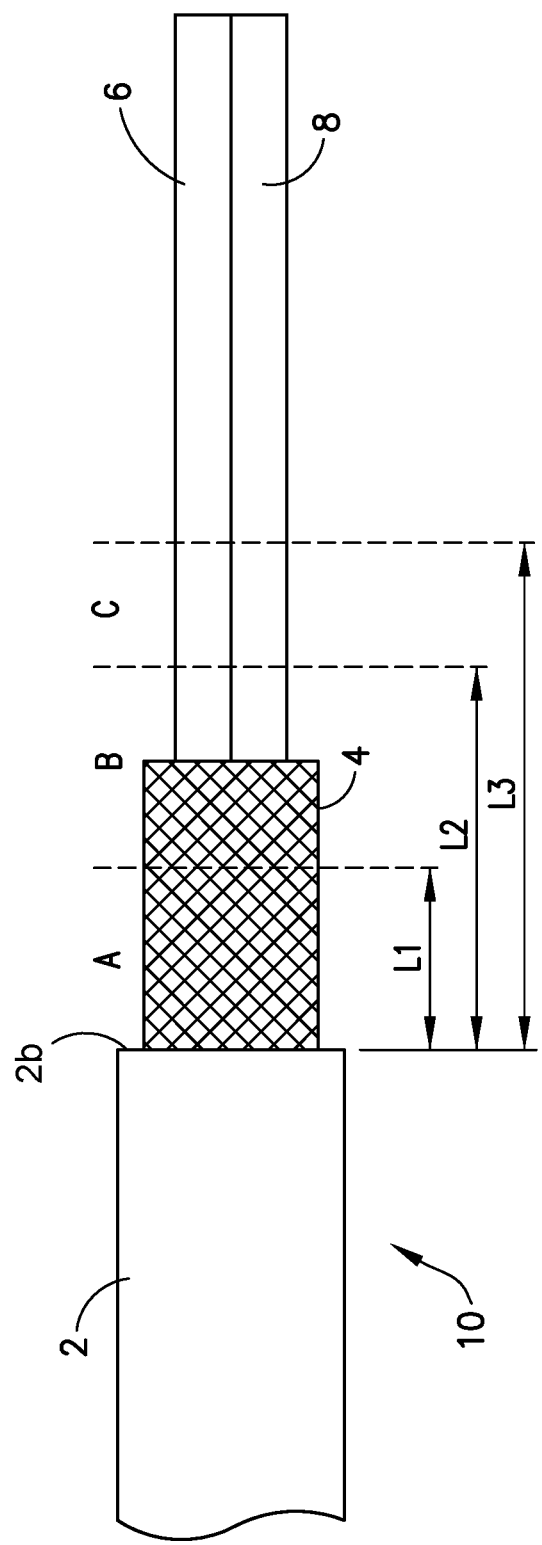
FIG. 13 is a diagram representing a side view of a portion of a cable having an unjacketed end with an exposed shield that has been trimmed.
Figure 16:
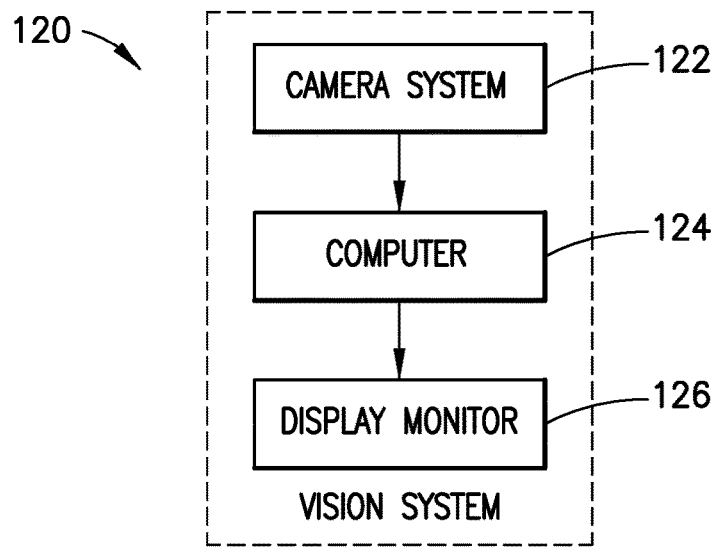
FIG. 16 is a block diagram identifying the component subsystems of a vision system for evaluating shield trims using image analysis in accordance with one embodiment.

FIG. 13 is a diagram representing a side view of a portion of a cable 10 having an unjacketed end with an exposed shield 4 that has been trimmed. The trimming of the shield 4 in turn exposes the wires 6 and 8 of the cable 10. FIG. 13 also includes dimensional graphics indicating various inspection criteria used by a vision system configured to perform the shield trim evaluation. An example of a vision system 120 is shown in FIG. 16. The example shown includes a computer 124, a camera system 122 in communication with computer 124, and a display monitor 126 having a graphics processor (not shown) in communication the computer 124. In another example, the inspection is carried out by the computer 124 without the use of a display monitor 126. The computer 124 receives pixel data acquired by the camera system 122 along a length of the cable 10 that includes the exposed shield 4. The computer 124 analyzes the images received from the camera system 122 by breaking the image up into three sections corresponding to Zones A through C depicted in FIG. 13. The computer 124 is configured to separately acquire pixel data that comprises image color information (e.g., for three primary colors) from each of the Zones A through C. The pixel data acquired from each zone may be reduced by filtering out pixel data representing the background behind the cable, each camera having a respective background. Alternatively, the cameras may be focused on an area having a height that is equal to or less than the diameter of the shield 4 and having a length that is equal to or less than the length of the zone from which the image data was acquired (hereinafter "inspection image area"). In both alternatives, an inspection image area is the area within or coextensive with a given zone whose pixel data is going to be processed for the purpose of inspecting the imaged portions of the cable. In accordance with some embodiments, the camera system 122 may include a multiplicity of (two or more) cameras with respective fields of view arranged to acquire pixel data from respective inspection image areas which are circumferentially distributed at angular intervals around a section of a cable. In one embodiment, the two or more cameras are circumferentially distributed at angular intervals (optionally equal) around the exposed shield portion of the cable with their focal axes intersecting the cable. In other embodiments, the focal axes of the two or more cameras intersect respective flat reflecting surfaces, such as mirrors which have each been positioned to ensure that the cable appears in the field of view of a respective camera. However, optical configurations may be designed which do not require a one-to-one correspondence between cameras and mirrors.

In accordance with other embodiments, a single camera may capture pixel data from circumferentially distributed inspection image areas. In one embodiment, a single camera may orbit around the cable intermittently, acquiring respective pixel data sets from respective inspection image areas which are circumferentially distributed around a zone of the cable. In another embodiment, a stationary single camera may acquire respective pixel data sets from respective inspection image areas which are circumferentially distributed around a zone of a cable that is rotated intermittently through respective angular intervals (each less than 360 degrees). Each time a different inspection image area on the cable is in the field of view of the stationary camera, the stationary camera captures a respective image, thereby acquiring a respective set of pixel data.

In accordance with some proposed implementations, the images (or the inspection image areas thereof) which are circumferentially distributed around a section of a cable, may be contiguous or partially overlapping, in which case the pixel data for a set of images or set of inspection image areas may be stitched together to provide a full 360-degree view around the cable. Whether the trimmed shield passes inspection or not will then depend on the results of comparing the color percentages of pixel data in the stitched image to the specified thresholds.

In accordance with other proposed implementations, the images (or the inspection image areas thereof) which are circumferentially distributed around a section of a cable may be neither contiguous nor partially overlapping, in which case the pixel data for each inspection image area may be processed independently. Whether the trimmed shield passes inspection or not will then depend on the results of comparing the color percentages of pixel data acquired from each inspection image area to the specified threshold.

In the example proposed implementation depicted in FIG. 13, the first section (Zone A) starts at the edge $2b$ of the cable jacket 2 (hereinafter "jacket edge $2b$") and extends to a distance L1 from the jacket edge $2b$. In accordance with one proposed implementation, the distance L1 is defined to be the minimum allowable trimmed shield length. The cable with trimmed shield will fail inspection if D<L1. L1 may be specified by application requirements based on cable characteristics. With respect to the pixel data acquired from the cable in Zone A, the vision system 120 is configured to determine whether excessive gaps are present in the shield 4 (e.g., caused by broken shield strands) or not. The evaluation system compares perceived gaps in the image with a maximum allowable gap value to ensure that the percentage of shield coverage is within the specified tolerance. Shield coverage percentages below a specified minimum percentage of coverage indicate to the evaluation system that an unacceptable number of shield strands may be broken, thus not meeting quality requirements.

Figure 14A:
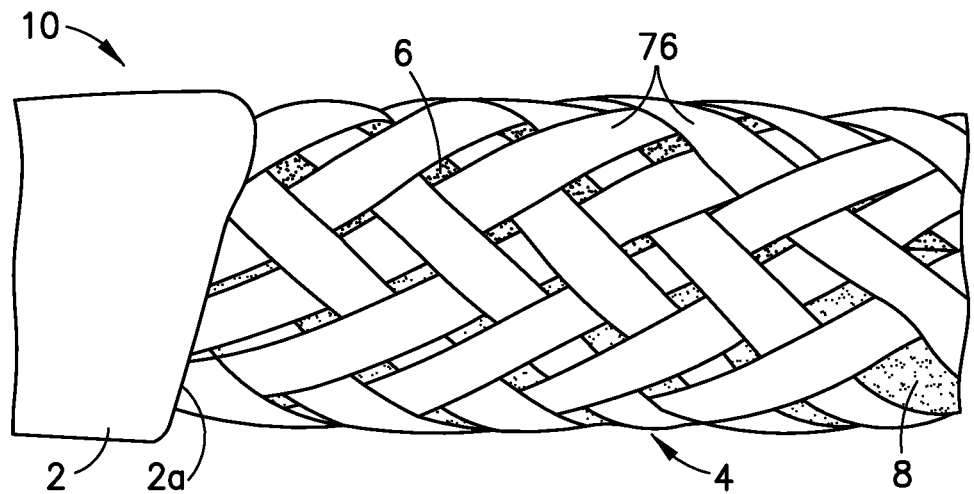
FIG. 14A is a diagram representing a side view of a portion of a cable having an exposed shield with intact shield strands.
Figure 14B:
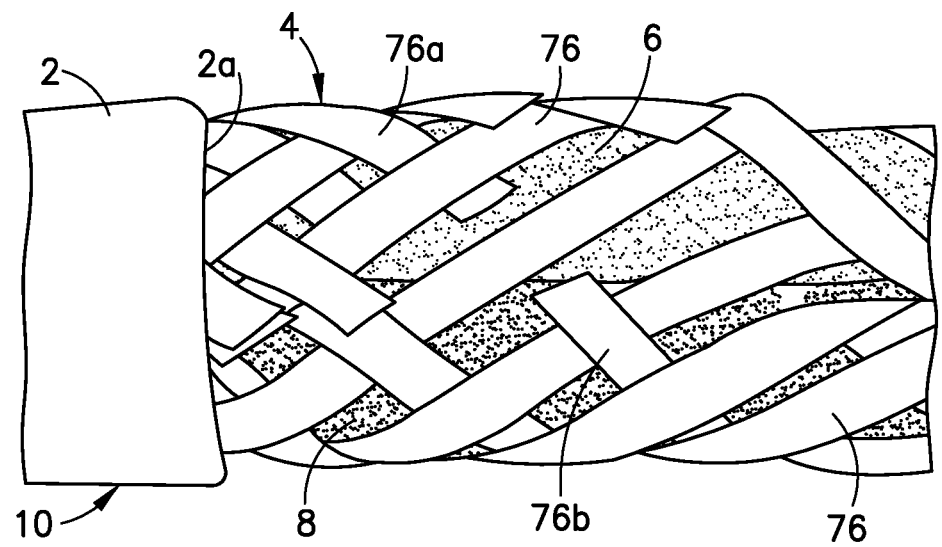
FIG. 14B is a diagram representing a side view of a portion of a cable having broken shield strands.

FIG. 14A is a diagram representing a side view of a portion of a cable 10 having an exposed shield 4 with intact shield strands 76. The percentage of shield coverage in Zone B is dependent in part on the number and size of gaps between the shield strands 76. When some of the shield strands 76 break (as depicted in FIG. 14B), there is usually a resulting gap between the two portions of the broken shield strand (see, e.g., portions $76a$ and $76b$ of a broken shield strand depicted in FIG. 14B).

Figure 13A:
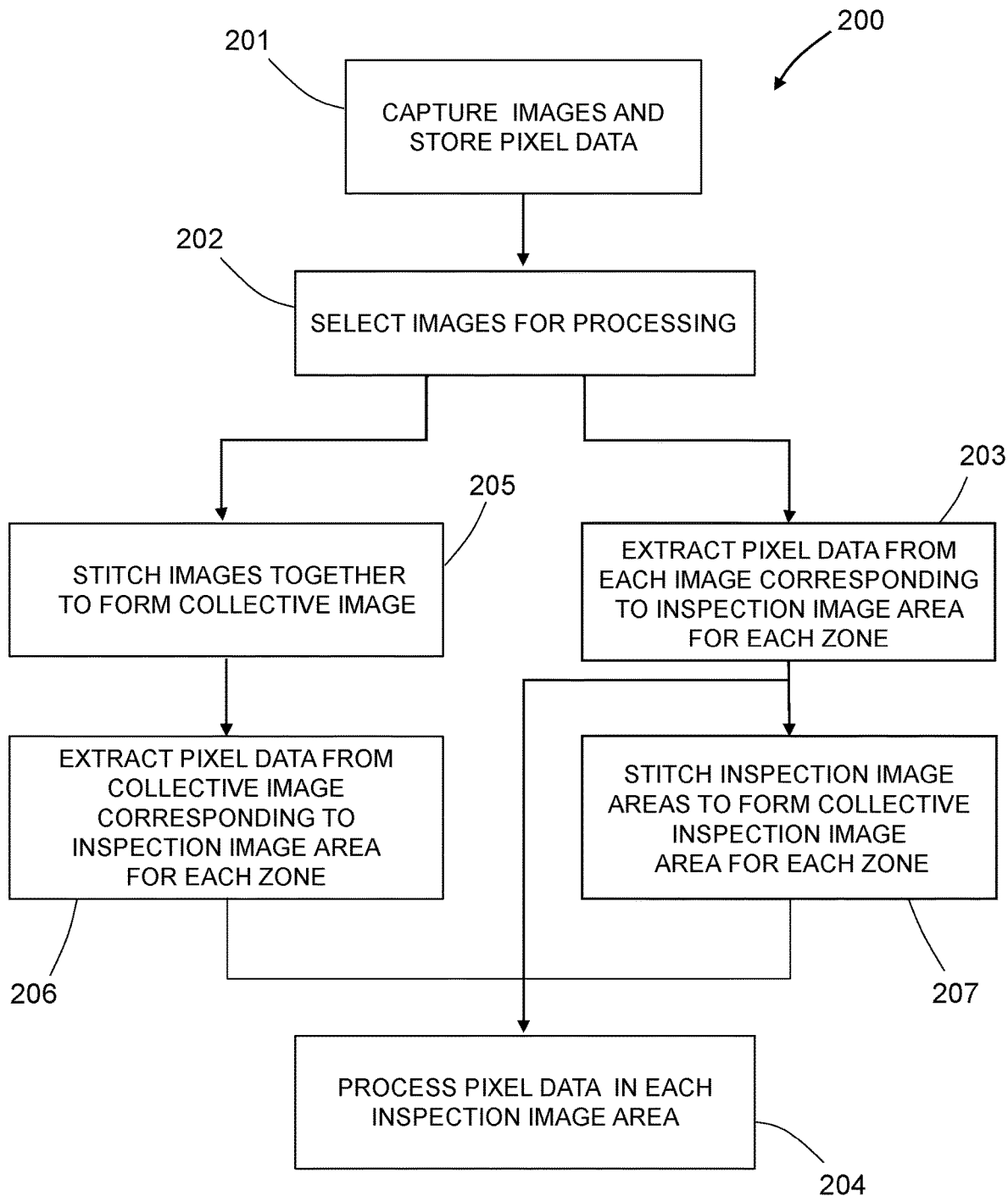
FIG. 13A is a flowchart identifying steps of alternative methods for using a vision system to inspect the trimmed shield on the end of a shielded cable.

FIG. 13A is a flowchart identifying steps of alternative methods 200 for using a vision system to inspect the trimmed shield on the end of a shielded cable. During inspection, the cameras are activated to capture images and then store the acquired pixel data in a non-transitory tangible computer-readable storage medium inside or connected to the computer 124 (step 201). Pixel data is a data representation of the images color information. Next, single images or multiple images are selected to be processed (step 202). The selection process can be achieved through various means, such as automatically using artificial intelligence (AI) or by a technician interacting manually with a user interface (not shown in FIG. 16) that communicates with the computer 124.

After the images have been selected for processing (step 202), the computer 124 is caused, through a command entered by a technician, AI, or a programmed software, to run an image processing application that extracts the pixel data of the selected image to define a jacket area in the image and to further define inspection image areas corresponding to the portions (e.g., zones) of the cable to be inspected. For example, the pixel data may be extracted by collecting the pixel data into respective histograms, each histogram having bins corresponding to the respective colors which are detectable. In accordance with one option, neutral colors are used for the background to focus the inspection process on only those colors which are indicative of the presence of shield and wires, discounting all background or other interfering colors. In accordance with another option, each camera is focused and zoomed on the area to be inspected such that colors indicative of the presence of shield and wires form the totality or near totality of the inspection image area.

FIG. 13A identifies three alternative methods for reducing the acquired images to desired image inspection areas representative of the color information contained in each zone of interest in the cable. In accordance with a first method, pixel data corresponding to respective inspection image areas within or coextensive with the zones of interest are extracted from each selected image (step 203). After the pixel data has been extracted, the computer 124 executes an image processing algorithm that processes the pixel data corresponding to the defined inspection image areas (step 204). The processing of pixel data may be initiated by a technician entering a command, by AI, or by a programmed software.

In accordance with a second method, the selected images are stitched together to form a collective image (step 205). For example, the collective image may provide a 360-degree view of the cable segment. The pixel data corresponding to respective collective inspection image areas within or coextensive with the zones of interest are extracted from the collective image (step 206). After the pixel data has been extracted, the computer 124 executes an image processing algorithm that processes the pixel data corresponding to the defined inspection image areas (step 204).

In accordance with a third method, the pixel data corresponding to respective inspection image areas within or coextensive with the zones of interest are extracted from each selected image (step 203). Then the inspection image areas for each zone of interest are stitched together to form a respective collective inspection image area for each zone (step 207). After the pixel data has been organized into respective collective inspection image areas, the computer 124 executes an image processing algorithm that processes the pixel data corresponding to the defined inspection image areas (step 204).

Figure 13B:
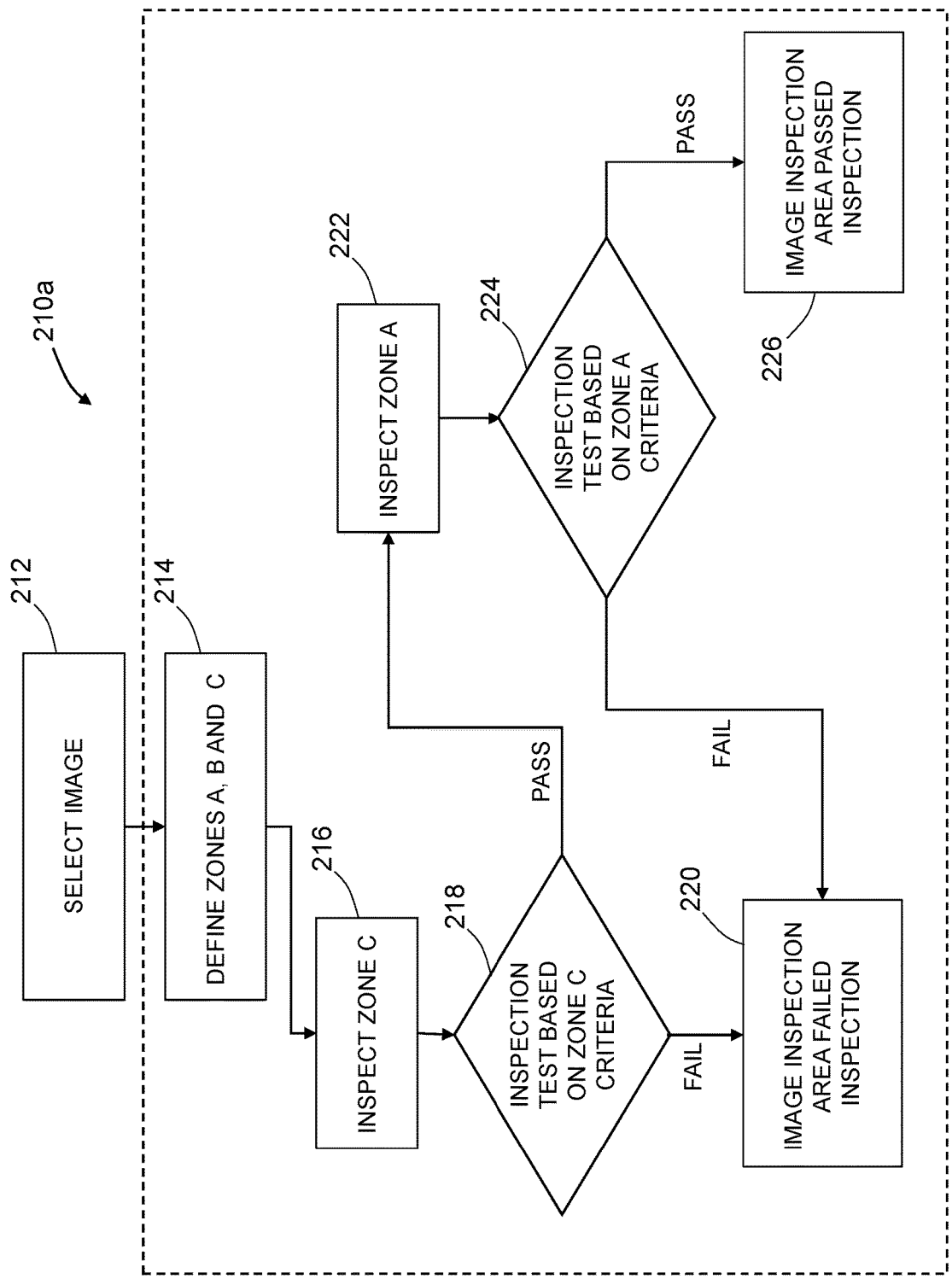
FIG. 13B is a flowchart identifying steps of a method for processing pixel data from an inspection image area to determine whether the trimmed shield on the end of a shielded cable meets quality control specifications or not in accordance with one embodiment.

FIG. 13B is a flowchart identifying steps of a method $210a$ in accordance with one embodiment for processing information associated with different zones of interest to determine whether the trimmed shield on the end of a shielded cable meets quality control specifications or not. First, an image is selected for processing (step 212). Then Zones A, B and C (as shown in FIG. 13) are defined by entering or instructing the computer 124 to retrieve from memory the distances L1 and L2 (step 214). Then the computer 124 processes the pixel data from the inspection image area associated with Zone C to inspect Zone C (step 216). The computer 124 is configured to perform an inspection test 218 based on Zone C criteria calling for the exclusion of shield colors in Zone C. If the Zone C criteria are not met in inspection test 218, then the computer 124 generates a message or alert signaling that the inspection image area has failed the inspection (step 220). If the Zone C criteria are met in inspection test 218, then the computer 124 processes pixel data from the inspection image area associated with Zone A to inspect Zone A (step 222). The computer 124 is configured to perform an inspection test 224 based on Zone A criteria calling for shield coverage of the wires equal to at least a minimum allowable shield coverage in Zone A. If the Zone A criteria are not met in inspection test 224, then the computer 124 generates a message or alert signaling that the inspection image area has failed the inspection (step 220). If the Zone A criteria are met in inspection test 224, then the computer 124 generates a message or alert signaling that the inspection image area passed the inspection (step 226).

Figure 13C:
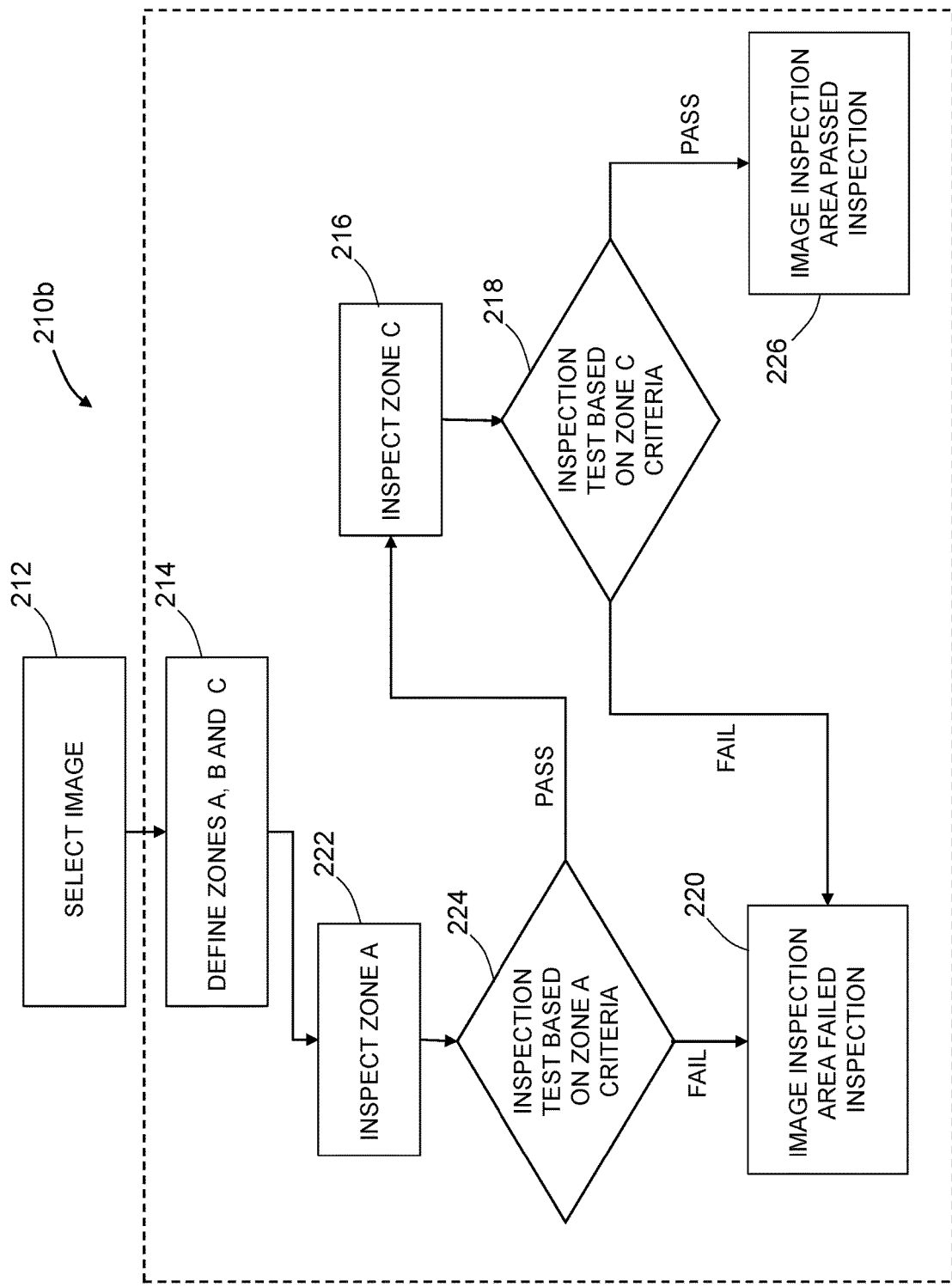
FIG. 13C is a flowchart identifying steps of a method for processing pixel data from an inspection image area to determine whether the trimmed shield on the end of a shielded cable meets quality control specifications or not in accordance with another embodiment.

FIG. 13C is a flowchart identifying steps of a method 210*b* for processing information associated with the different zones of interest to determine whether the trimmed shield on the end of a shielded cable meets quality control specifications or not in accordance with another embodiment. First, an image is selected for processing (step 212). Then Zones A, B and C (as shown in FIG. 13) are defined by entering or instructing the computer 124 to retrieve from memory the distances L1 and L2 (step 214). Then the computer 124 processes the pixel data from the inspection image area associated with Zone A to inspect Zone A (step 222). The computer 124 is configured to perform an inspection test 224 based on Zone A criteria calling for shield coverage of the wires equal to at least a minimum allowable shield coverage in Zone A. If the Zone A criteria are not met in inspection test 224, then the computer 124 generates a message or alert signaling that the inspection image area has failed the inspection (step 220). If the Zone A criteria are met in inspection test 222, then the computer 124 processes the pixel data from the inspection image area associated with Zone C to inspect Zone C (step 216). The computer 124 is configured to perform an inspection test 218 based on Zone C criteria calling for the exclusion of shield colors in Zone C. If the Zone C criteria are not met in inspection test 218, then the computer 124 generates a message or alert signaling that the inspection image area has failed the inspection (step 220). If the Zone C criteria are met in inspection test 224, then the computer 124 generates a message or alert signaling that the inspection image area passed the inspection (step 226).

Figure 13D:
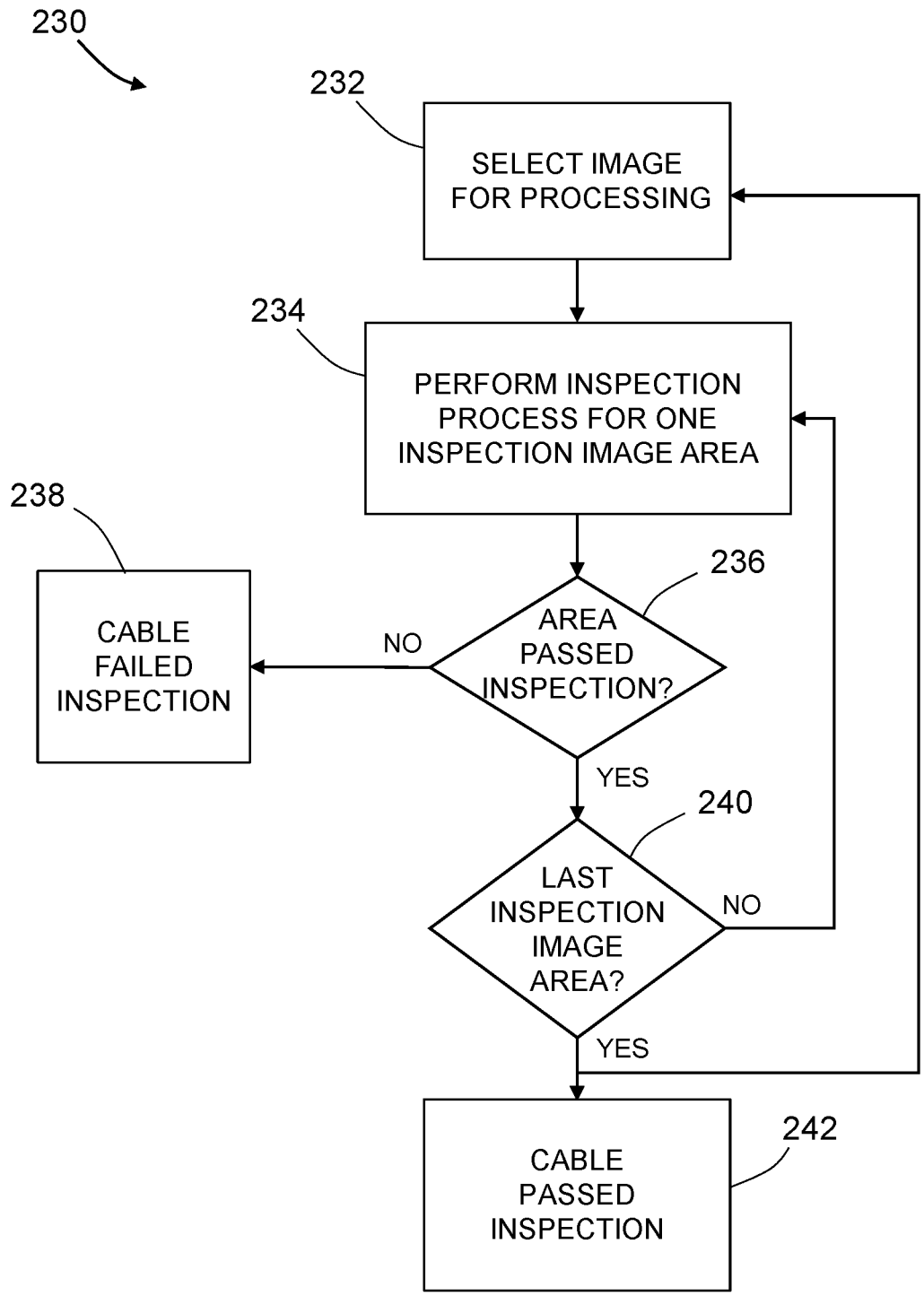
FIG. 13D is a flowchart identifying steps of an inspection method in which one or more inspection image areas in a zone may be processed to determine whether the trimmed shield on the end of a shielded cable meets quality control specifications or not.

FIG. 13D is a flowchart identifying steps of an inspection method 230 in which one or more inspection image areas in a zone may be processed to determine whether the trimmed shield on the end of a shielded cable meets quality control specifications or not. The inspection technician selects an image to be processed (step 232). Then the computer 124 performs the inspection process for one inspection image area in the selected image (step 234). The computer 124 then processes the pixel data to determine whether that inspection image area has passed inspection (step 26). If the inspection image area did not pass inspection, then the computer 124 generates a message or alert signaling that the cable has failed the inspection (step 238). If the inspection image area did pass inspection, then the computer 124 determines whether the most recently processed inspection image area is the last inspection image area to be processed or not (step 240). If the computer 124 determines that the most recently processed inspection image area is not the last inspection image area to be processed, then the computer 124 performs the inspection process for the next inspection image area in the selected image (step 234). If the computer 124 determines that the most recently processed inspection image area is the last inspection image area to be processed, then the computer 124 generates a message or alert signaling that the cable has passed the inspection (step 242). The inspection technician may then select the next image for processing (step 232). The quality control requirements specify that the shield in Zone A should cover at least a pre-specified percentage of the underlying wires in the inspection image area. This means that total number of pixels with colors of the shield divided by the total number of pixels in the inspection image area equals the percentage of wire coverage in the portion of the cable represented in the inspection image area. In accordance with one proposed implementation, 85% may be specified as the minimum acceptable percentage of wire coverage provided by the shield.

In accordance with one proposed implementation, the computer 124 is configured to verify that at least 85%, for example, of the pixel data in Zone A is the color of the shield strands (e.g., silver, gray or any other color indicative of the presence of shielding); if in Zone A, colors indicative of the presence of wire insulation or cable jacketing (these could be the same as the wire insulation colors such as white, red, blue, yellow, and green for up to Class 4 cables) are detected in a combined amount larger than 15%, in this example, then the shield 4 does not meet requirements. A calculated percentage of shield coverage in Zone A less than the specified minimum percentage of coverage triggers a "fail" for the inspection.

In the same implementation (partly described in the immediately preceding paragraph), the second section (Zone B) of the exposed shield 4 extends from the edge of Zone A to a distance L2 from the jacket edge 2*b* (L2>L1). It is acceptable for the shield 4 to be trimmed anywhere within Zone B. Therefore, the evaluation system does not perform an inspection or any checks related to trim quality in Zone B. L2 may be specified by application requirements based on cable characteristics.

In the same implementation, the third section (Zone C) extends from the edge of Zone B to a distance L3 from the jacket edge 2*b* (L3>L2). L3 may be specified by application requirements based on cable characteristics. With respect to the pixel data acquired from the third section (Zone C), the evaluation system is configured to validate that the shield 4 does not extend beyond length L2 and into Zone C. The evaluation is performed by verifying that the portion of the acquired image corresponding to the inspection image area in Zone C is free or nearly free of a color representative of the trimmed shield and is indicative of the absence of the shield from Zone C. In one proposed implementation, the color of the shield is silver or gray.

Figure 15A:
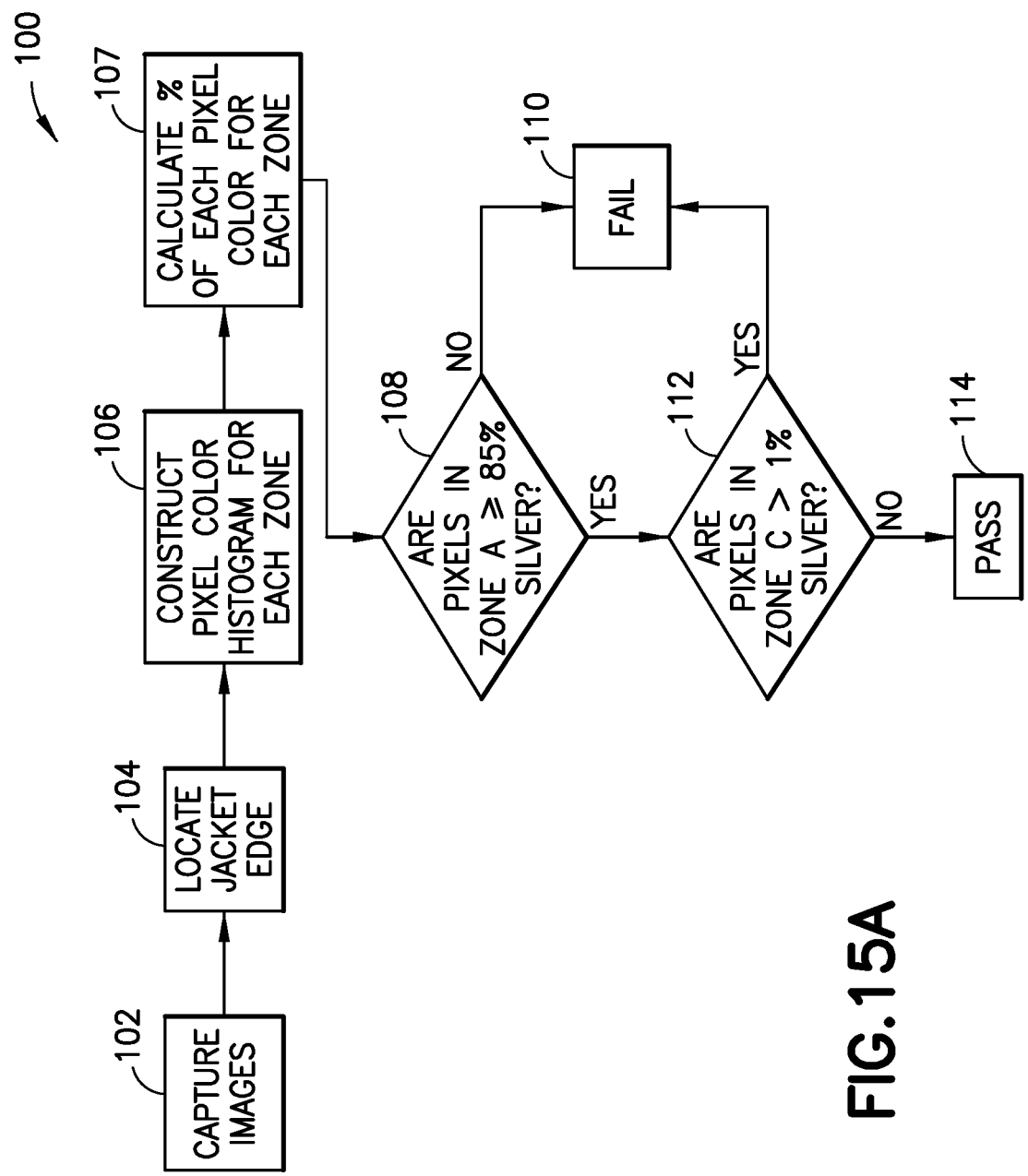
FIG. 15A is a flowchart identifying steps of a method for using a vision system to determine whether the trimmed shield on the end of a shielded cable meets quality control specifications or not in accordance with one proposed implementation.

FIG. 15A is a flowchart identifying steps of a method 100 for using a vision system 120 to determine whether the trimmed shield on the end of a shielded cable meets quality control specifications or not in accordance with one proposed implementation. First, the camera system 122 (see FIG. 16) captures a live video feed of a length of cable within the fields of view of a multiplicity of cameras (step 102). More specifically, each camera of the camera system 122 acquires pixel data representing the same length of cable 10 including exposed shield 4, but from different viewpoints. The computer 124 receives multiple live streams of pixel data from the camera system 122 and then analyzes that pixel data to evaluate the state of the shield trim.

Before the pixel data can be analyzed, the computer 124 receives information indicating the axial position of the jacket edge 2b relative to the region along the axis being imaged (step 104). In accordance with one option, the position of jacket edge 2b can be optically determined from either a discontinuity in cable diameter or from the appearance of a homogeneous white material (versus greater textured pattern of braided shield). In accordance with another option, the cable 10 can be mechanically positioned into the camera system 122 in a repeatable location, with Zone A (see FIG. 13) properly positioned for evaluation by the computer 124. For example, as disclosed in some detail above, each cable processing module 30 is equipped with a funnel 22 (or an open-top funnel not shown) and a photoelectric sensor 28 (see FIG. 5) for detecting the presence of the cable tip 10b in a scanning plane 11 (indicated by a dashed line in FIG. 3). More specifically, such a photoelectric sensor 28, placed in front of the camera system 122, may be configured to detect a change of diameter corresponding to the jacket edge 2b while the end of the cable 10 is being inserted inside the camera system 122. As previously described, the cable positioning apparatus includes a drive wheel 16, an idler wheel 18 and a stepper motor 72 for driving the cable 10 forward into the camera system 122 to a specified position in response to detection of the jacket edge 2b in the scanning plane 11.

In accordance with one embodiment of a shield trim evaluation method, the computer 124 analyzes the images received from the camera system. As mentioned above, the computer 124 is configured to analyze the pixel data acquired only from Zones A and C. The first step in the image analysis is to collect the pixel data acquired from Zones A and C into respective histograms, each histogram having bins corresponding to the respective colors which are detectable. A respective set of pixel color histograms (one for each inspection image area) may be constructed for Zones A and C (step 106). The respective percentages for the different pixel colors of interest are then calculated for each histogram (step 107).

The Zone A evaluation involves determining whether the pixel data acquired from Zone A includes at least a specified percentage of a color indicative of the presence of shielding in Zone A or not (step 108). For the purpose of illustration, the following description assumes that the specified percentage is 85% (other percentage may be used). On the one hand, if a determination is made in step 108 that less than 85% of the pixels for Zone A represent a color indicative of the presence of shielding, this triggers a "fail" for the inspection (step 110). More specifically, the computer 124 generates digital data indicating that the cable 10 has failed the inspection. On the other hand, if a determination is made in step 108 that at least 85% of the pixels for Zone A represent a color indicative of the presence of shielding, then the computer 124 initiates an evaluation to verify that the exposed shield 4 does not extend into Zone C.

The Zone C evaluation involves determining whether the pixel data acquired from Zone C includes a percentage of color indicative of the presence of shielding greater than a near-zero value (e.g., >1%) or not (step 112). On the one hand, if a determination is made in step 112 that more than a specified near-zero percentage of pixels for Zone C represent color indicative of the presence of shielding, this triggers a "fail" for the inspection (step 110). On the other hand, if a determination is made in step 112 that the percentage of Zone C pixels representing color indicative of the presence of shielding is not greater than the specified near-zero percentage, then the computer 124 generates digital data indicating that the cable 10 has passed the inspection (step 114). In another embodiment, Zone C inspection may take place first, followed by an inspection of Zone A if the inspection image area in Zone C passed inspection, as shown in FIG. 13C. "Near zero" in the context of a percentage of pixels having a color indicative of the presence of shielding means a threshold that would not be met by specular highlights reflected off of the colored wires. This can partially be resolved through cross-polarized lights/filters. In accordance with one proposed implementation, the "near zero" percentage is on the order of 0.5 to 1 percent. The precise threshold may be fine tuned by testing samples using the vision system.

Figure 15B:
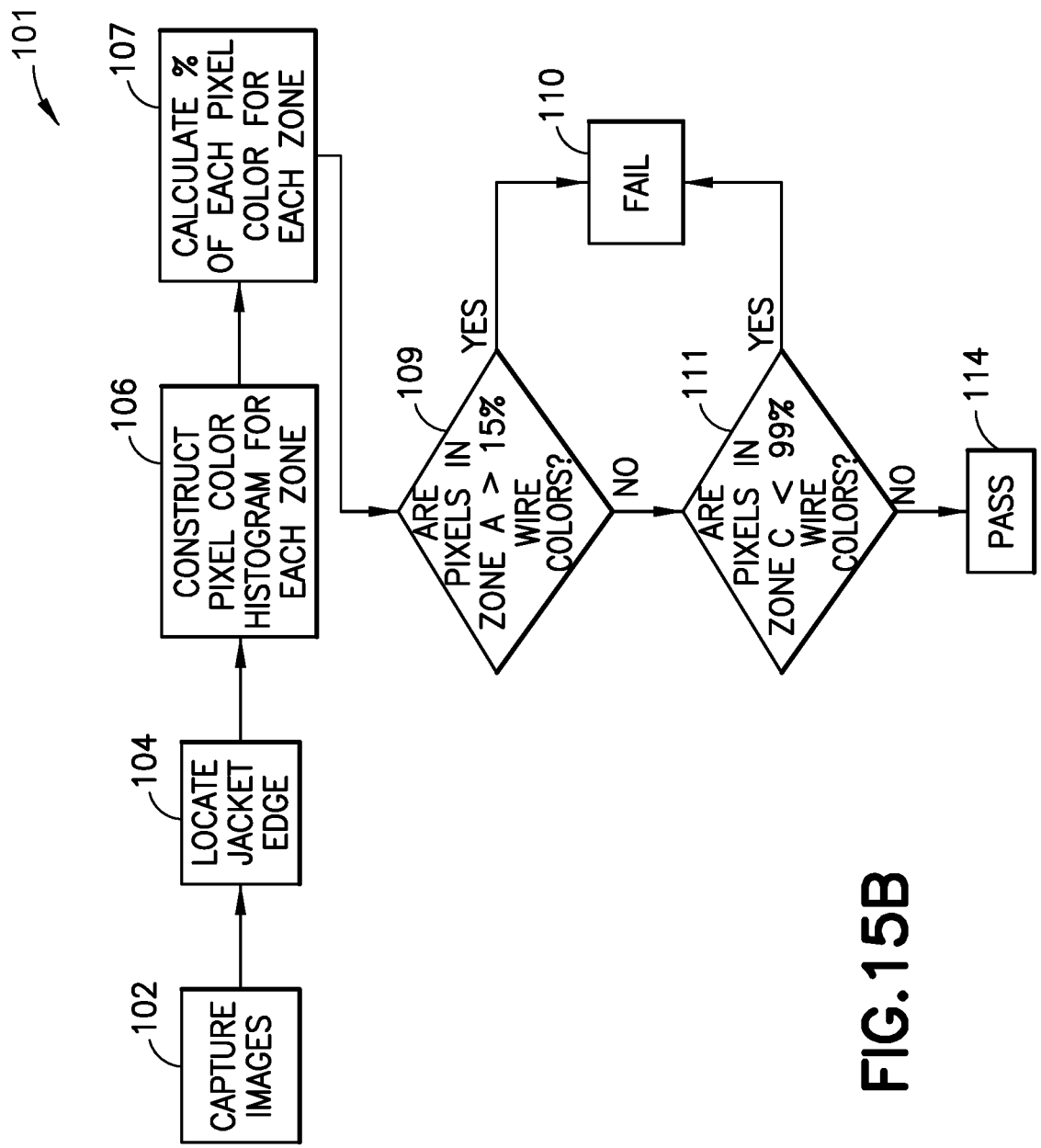
FIG. 15B is a flowchart identifying steps of a method for using a vision system to determine whether the trimmed shield on the end of a shielded cable meets quality control specifications or not in accordance with another proposed implementation.

FIG. 15B is a flowchart identifying steps of a method 101 for using a vision system 120 to determine whether the trimmed shield on the end of a shielded cable meets quality control specifications or not in accordance with an alternative proposed implementation. First, the camera system 122 (see FIG. 16) captures a live video feed of a length of cable within the fields of view of a multiplicity of cameras (step 102). Before the pixel data can be analyzed, the computer 124 receives information indicating the axial position of the jacket edge 2b relative to the region along the axis being imaged (step 104). The computer 124 then analyzes the images received from the camera system. As mentioned above, the computer 124 is configured to analyze the pixel data acquired only from Zones A and C. The first step in the image analysis is to break the image up into three sections corresponding to Zones A through C depicted in FIG. 13 and then construct a respective set of pixel color histograms for each zone (step 106). The respective percentages for the different pixel colors of interest are then calculated for each zone (step 107).

In accordance with the alternative proposed implementation depicted in FIG. 15B, the Zone A evaluation involves determining whether the pixel data acquired from Zone A representing the colors of wires 6 and 8 (e.g., red and blue) is, for example, greater than 15% (other percentages may be used) or not (step 109). On the one hand, if a determination is made in step 109 that greater than 15% of the pixels for Zone A represent wire colors, this triggers a "fail" for the inspection (step 110). On the other hand, if a determination is made in step 108 that less than or equal to 15% of the pixels for Zone A represent wire colors, then the computer 124 initiates an evaluation to verify that the exposed shield 4 does not extend into Zone C.

The Zone C evaluation involves determining whether the pixel data acquired from Zone C includes a percentage of pixels representing wire colors less than a specified threshold near 100% (e.g., 99%; other percentages may be used) or not (step 111). On the one hand, if a determination is made in step 111 that less than 99% of pixels for Zone C represent wire colors, this triggers a "fail" for the inspection (step 110). On the other hand, if a determination is made in step 111 that the percentage of Zone C pixels representing wire colors is equal to or greater than 99%, then the computer 124 generates digital data indicating that the cable 10 has passed the inspection (step 114).

For both of the implementations represented in FIGS. 15A and 15B respectively, multiple windows may be presented on the display monitor 126 (see FIG. 16), each window showing a respective stream of image data captured by a respective camera. In addition, multiple frames from the multiplicity of cameras can be stitched together to provide a 360-degree view of the exposed shield 4 and adjacent jacketed and unshielded portions of the cable 10 depicted in FIG. 13. That 360-degree view may also be presented for viewing on the display monitor 126. In another example, the images are processed separately and the determination of whether the cable passes inspection is made by analyzing the pixel data for each separate image inspection area. A fail in one processed image inspection area will trigger a fail for the cable. Only if all image inspection areas pass inspection will the cable be deemed to have passed inspection.

Figure 17:
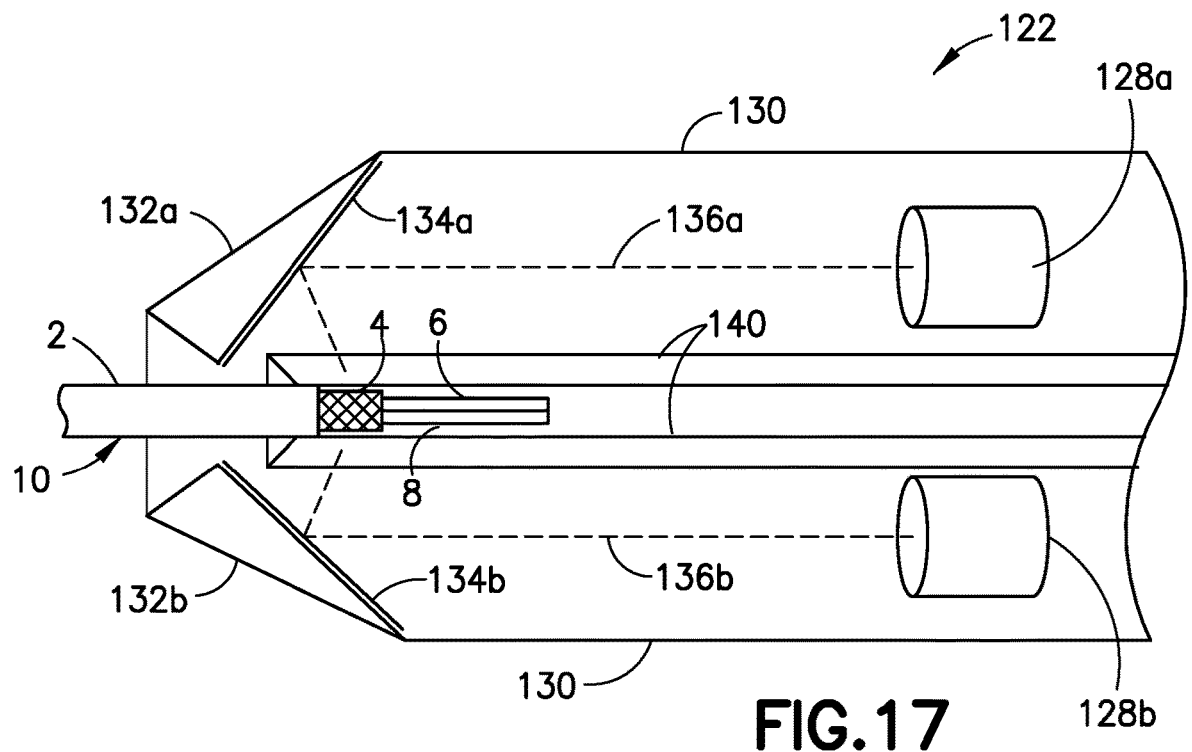
FIG. 17 is a diagram representing a cutaway view showing the positional relationships of two cameras and two mirrors of a vision system and an unjacketed end of a cable undergoing inspection in accordance with one embodiment.

FIG. 17 is a diagram representing a cutaway view of an enclosure 130 of a camera system 122 having interior surfaces that bound an interior volume having a central axis 5. The enclosure 130 supports a mirror assembly comprising at least two mirrors 134a and 134b oriented at axisymmetric oblique angles relative to the central axis 5 of the enclosure 130.

In accordance with one proposed implementation, the enclosure 130 includes a pair of mirror support surfaces 132a and 132b which respectively support a pair of mirrors 134a and 134b. The removal of a portion of the enclosure 130 in FIG. 17 reveals the presence of a corresponding pair of cameras 128a and 128b (more cameras may be employed). The camera 128a and mirror 134a are shown positioned to acquire images on one side of a portion of a cable 10 to be visually inspected, which portion includes exposed shield 4 and adjacent portions of a jacket 2 and wires 6 and 8. The camera 128b and mirror 134b are shown positioned to acquire images on the other side of the same portion of cable 10. The cameras 128a and 128b capture a stream of images, which are sent in real-time to the computer 124 (see FIG. 16) for image analysis.

To ensure that the computer 124 is able to accurately evaluate the cable 10, the computer 124 should be able to easily differentiate between the cable 10 and background objects. To enable cable recognition, the mirrors 134a and 134b are angled such that the cameras 128a and 128b capture images of the cable 10 with the interior of the enclosure 130 as the background. The enclosure interior should be, for example, colored with a color that is distinctly different from the colors of the cable jacket 2, shield strands 76, or insulation of wires 6 and 8.

A first beam of light having a centerline 136a (indicated by a dashed line in FIG. 17) is projected onto the mirror 134a and then reflected by the mirror 134a toward the portion of cable 10 to be inspected. Similarly, a second beam of light having a centerline 136b (indicated by a dashed line in FIG. 17) is projected onto the mirror 134b and then reflected by the mirror 134b toward the portion of cable 10 to be inspected. At least some of the light reflected or scattered by the cable 10 is reflected back into the lenses of the respective cameras 128a and 128b by the respective mirrors 134a and 134b.

In order to ensure that the cameras 128a and 128b have the clearest view possible of the cable 10, shield 4, and wires 6 and 8, the interior of the enclosure 130 is illuminated. Because the shield strands 76 are silver, it is possible that the shield strands 76 may reflect the color of the light within the enclosure 130. If the enclosure 130 is illuminated with white light and the shield strands 76 appear white due to the light reflection, this may confuse the system into thinking that the shield strands 76 are cable jacket 2 or wire insulation. It is possible to use a light that is a color distinctly different from the colors of the insulation of wires 6 and 8 and the color of cable jacket 2 in order to make the shield strands 76 easily distinguishable. It is also optional to use a white light that passes through a color filter in order to make the light a different color.

The camera system 122 is preferably equipped with an external funnel 22 (not shown in FIG. 17, but see funnel 22 in FIG. 19) through which the cable 10 is passed on its way to the axial position depicted in FIG. 17. The funnel 22 enables easy insertion of the cable 10 into the enclosure 130 and helps to center the cable 10 as the cable enters the enclosure 130. As previously described with reference to FIG. 3, the cable 10 may be fed into the enclosure 130 automatically by rotating a drive wheel 16 in a cable pushing direction. The amount of cable 10 to be fed into the enclosure 130 depends on the strip length of the cable 10. In a fully automated system, the overall control system would control whatever positioning mechanism is used to feed the cable 10.

The camera system 122 further includes an internal funnel passageway 140 which helps to maintain the exposed shield 4 in a central position inside the enclosure 130. The internal funnel passageway 140 may take the form of a circular cylindrical tube having an axis that is coaxial with the axis of the enclosure 130 and made of optically transparent material (e.g., glass). The forward end of the funnel passageway 140 has a circular conical entrance that acts as a funnel to guide the wires 6 and 8 into the circular cylindrical portion of funnel passageway 140. The external funnel 22 and internal funnel passageway 140 ensure that the cable 10 is in a repeatable, centered position during the visual inspection. The internal funnel passageway 140 provides space for cable wires 6 and 8 to pass through while also providing support to the wires (preventing drooping of the wires/cable). The internal funnel passageway 140 should be long enough to accommodate up to a known maximum strip length. The optical transparency of the internal funnel passageway 140 enables the cameras to acquire images of the cable segment even when constrained by a surrounding tube.

Although FIG. 17 depicts a one-to-one correspondence between cameras and mirrors, other camera/mirror configurations are possible. As disclosed above: two or more stationary cameras may be used in conjunction with a movable mirror; or one movable camera may be used in conjunction with two or more stationary mirrors. Optionally, the camera system may include a multiplicity of cameras surrounding the cable end and having respective viewpoints such that their respective fields of view encompass different image inspection areas on the exposed shield portion of the cable. One such embodiment with diametrically opposed cameras will be described below with reference to FIG. 22.

In accordance with alternative embodiments, the camera system may include a mirror assembly including more than two cameras and more than two mirrors arranged to form a regular pyramid structure configured to direct light onto a cable segment from different angles in order to achieve a full 360-degree view. Respective light sources may be attached directly to the cameras. Each light source projects light onto a corresponding mirror, which light is reflected toward the cable segment. Returning light from the cable segment impinges on the same mirror, which returned light is reflected back to the corresponding camera. Each mirror has a corresponding digital camera imaging its reflection.

In accordance with some embodiments, the camera system and the mirror assembly are designed to provide an n-sided view of the cable segment, where n is a positive integer. In the example shown in FIG. 17, n=2. In the example described below, n=6.

Figure 18A:
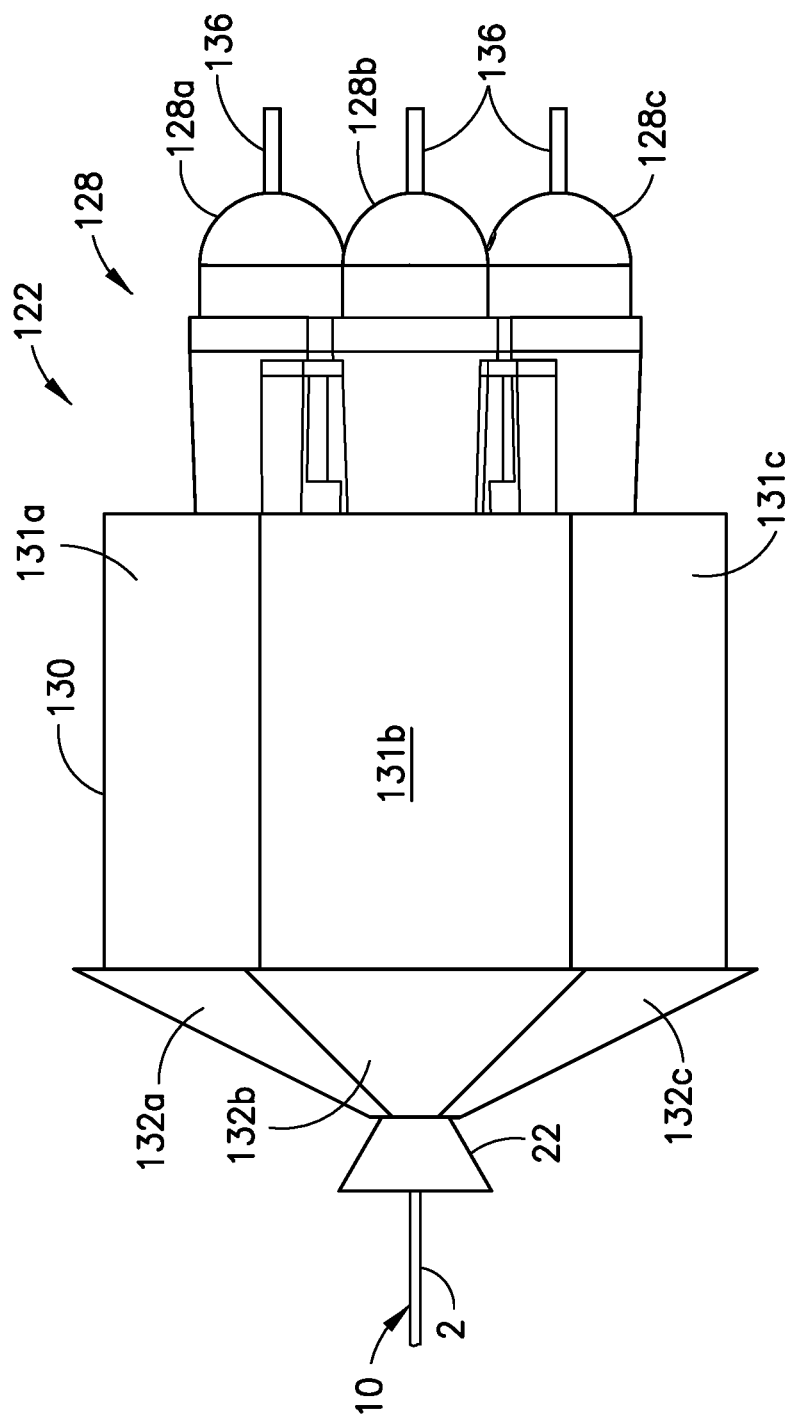
FIG. 18A is a diagram representing a side view of a camera system in accordance with one embodiment.
Figure 18B:
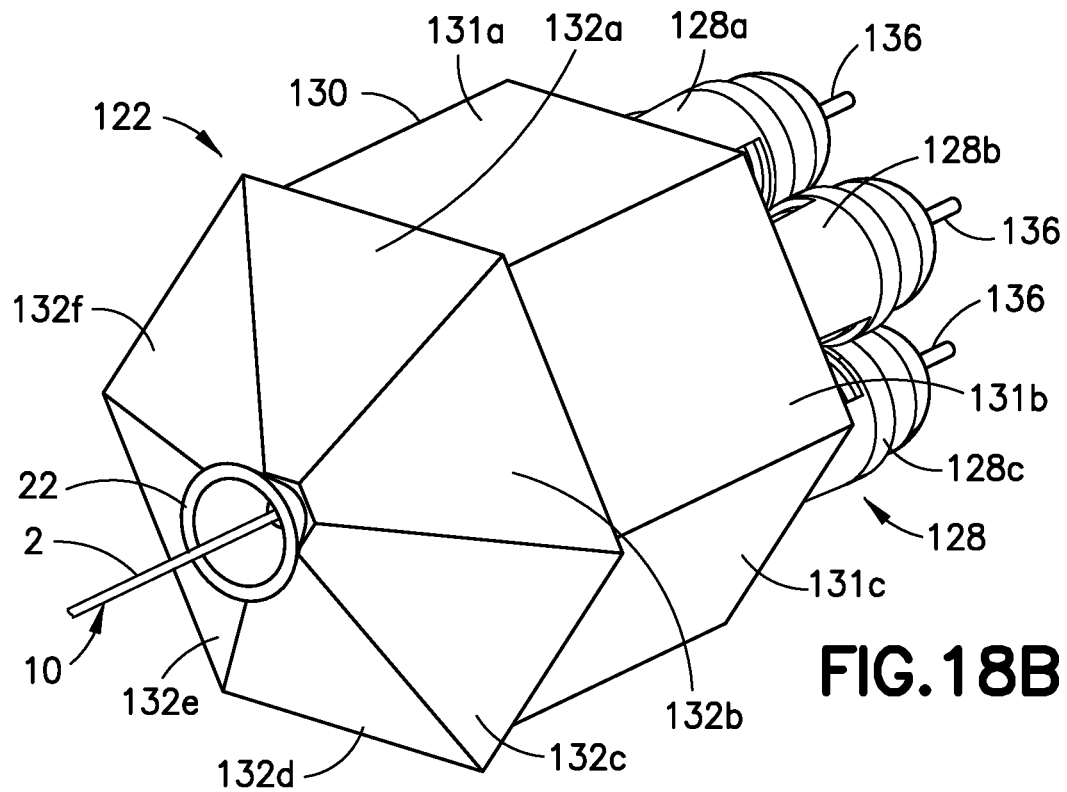
FIGS. 18B and 18C are diagrams representing front and rear three-dimensional views respectively of the camera system depicted in FIG. 18A.
Figure 18C:
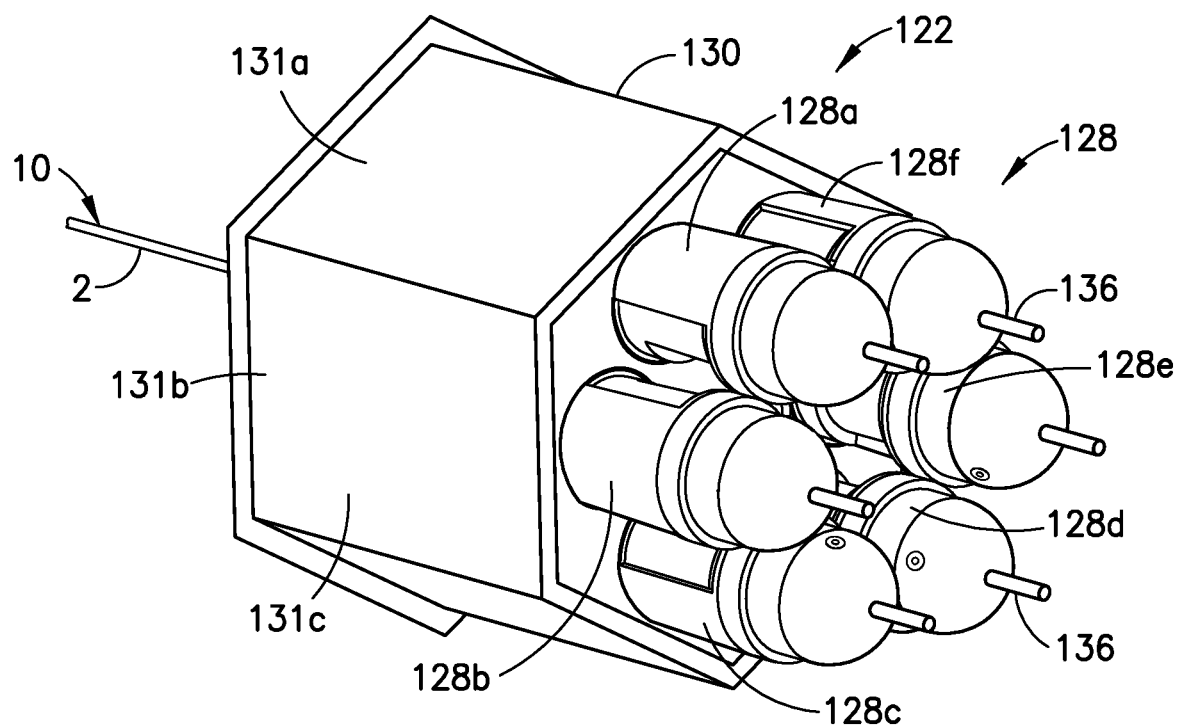
Figure 18E:
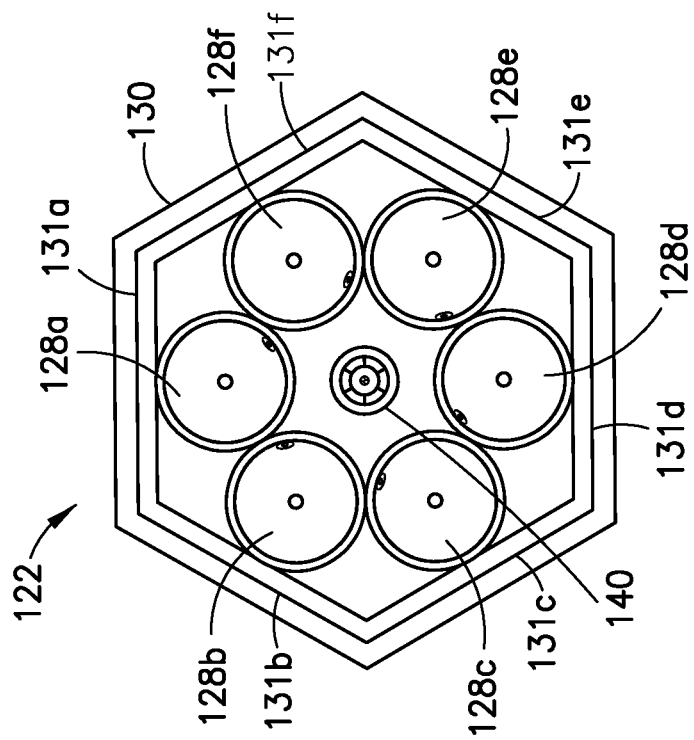
FIGS. 18D and 18E are diagrams representing front and rear end views respectively of the camera system depicted in FIG. 18A.
Figure 18D:
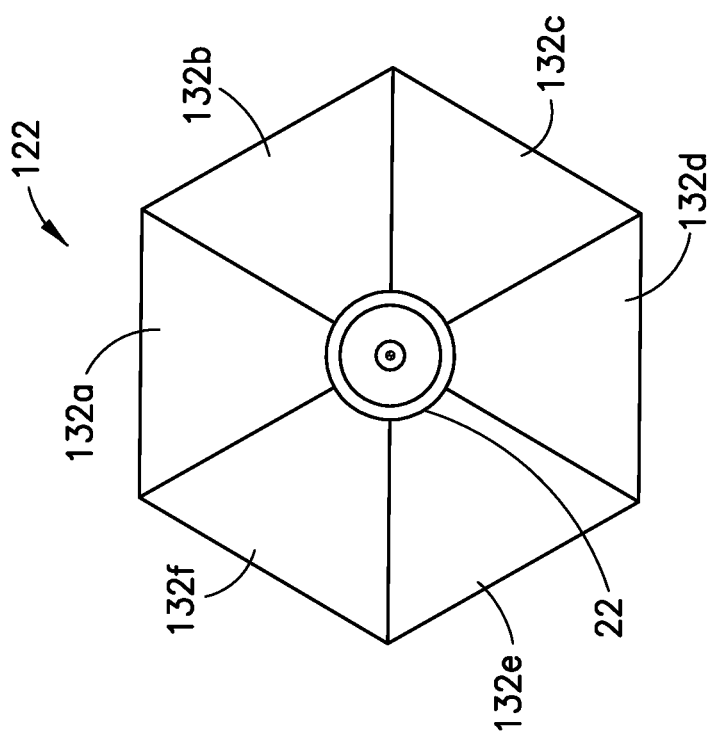
Figure 19:
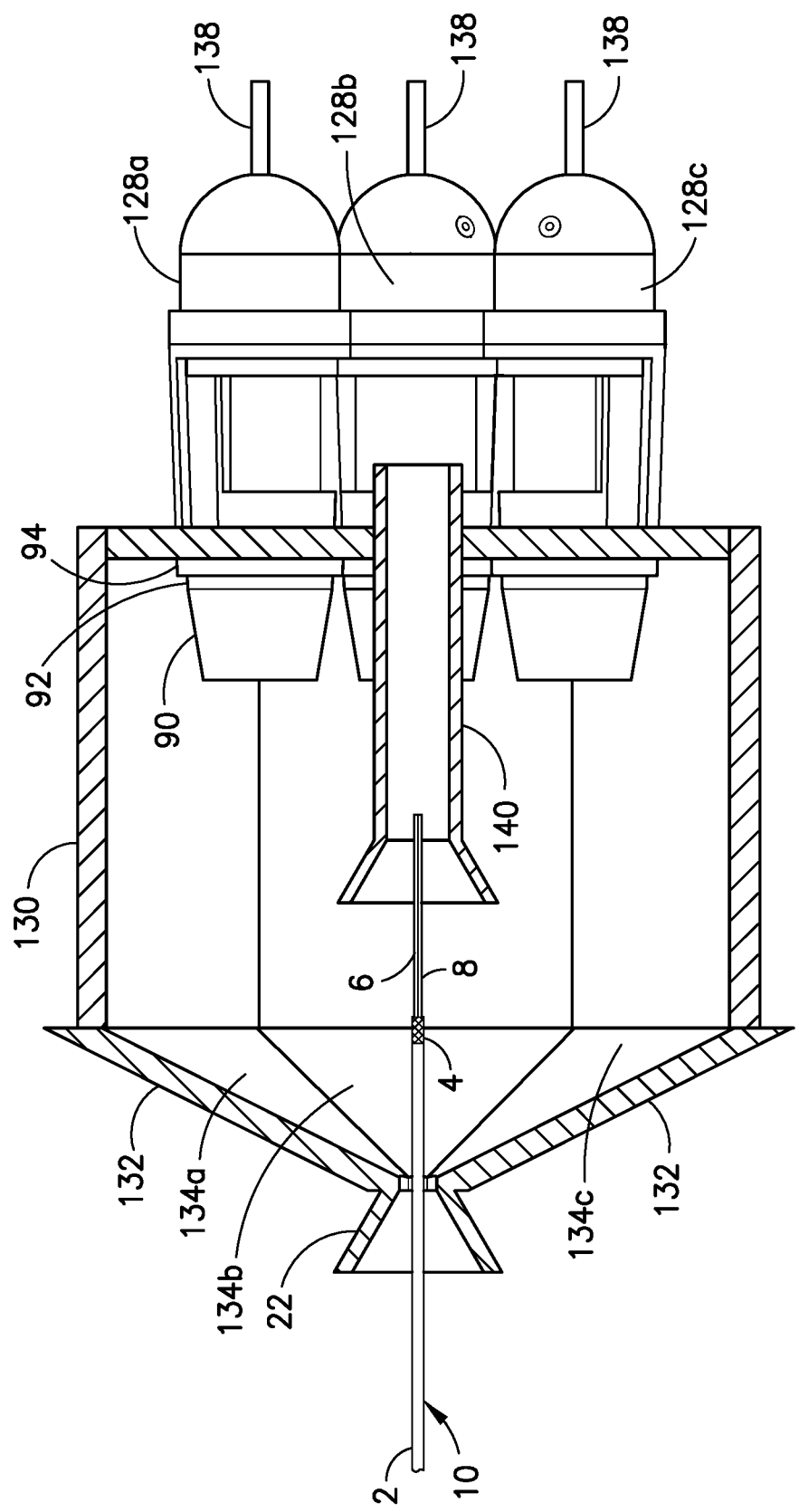
FIG. 19 is a diagram representing a sectional view of the camera system depicted in FIG. 18A.

In one proposed implementation, six mirrors and six cameras are used to create a six-sided view of the cable segment. In this particular example, the six mirrors form a regular hexagonal pyramid structure. A camera system 122 configured to provide a six-sided view of a cable segment is shown in FIGS. 18A-18E and 19. FIG. 18A is a diagram representing a side view of camera system 122 in accordance with one embodiment. FIGS. 18B and 18C show front and rear three-dimensional views respectively of the camera system 122, while FIGS. 18D and 18E show front and rear end views respectively. FIG. 19 shows a sectional view of the camera system 122 depicted in FIGS. 18A-18E.

The camera system 122 depicted in FIGS. 18A-18E includes an enclosure 130 comprising six walls 131a-131f which are connected to form a hexagonal prism in which the base is a regular six-sided polygon. The enclosure 130 further includes six mirror supports 132a-132f (see FIG. 18D) which are connected to form a regular hexagonal pyramid structure which is open at its apex to allow entry of the end of a cable 10. The hexagonal prism is connected to the hexagonal pyramid to form a portion of the enclosure 130. A multiplicity of mirrors 134a-134f (only mirrors 134a-134c are visible in FIG. 19) are attached to respective mirror supports 132a-132f.

The camera system 122 depicted in FIGS. 18A-18E further includes a multiplicity of six cameras 128, the six cameras being visible and separately identified as cameras 128a-128f in FIGS. 18C and 18E. As shown in FIG. 18E, the cameras 128a-128f are preferably arranged with their focal axes located at the vertices of a regular hexagon. In accordance with the proposed implementation depicted in FIGS. 18A-18E, the cameras 128 are digital microscopes. Each camera 128a-128f essentially views a respective single mirror of a multiplicity of mirrors 134a-134f (only mirrors 134a-134c are visible in

FIG. 19).

The enclosure 130 may further include fans and filters (not shown in the drawings) for providing positive air pressure that enables clean air flow around the camera(s) 128 for cooling purposes, and across mirror surfaces to keep the surfaces relatively dust-free or relatively free of other debris that may block or blur the view of the cable. As shown in FIGS. 18A-18E, in the exemplary implementation, enclosure 130 packages camera system 122 separate from computer 124. The cameras 128a-128f are communicatively coupled to the computer 124 (see FIG. 20) by means of respective electrical cables 136 (e.g., USB cables).

FIG. 19 is a diagram representing a sectional view of the camera system 122 depicted in FIGS. 18A-18F. In this interior view, it can be seen that camera 128a includes a lens cover 90, LED array 92 and lenses 94. The other cameras 128b-128f have similar components. Cameras 128a-128c (the only cameras visible in this sectional view) capture images returned from mirrors 134a-134c respectively. The enclosure 130 further includes an internal funnel passageway 140 which helps to maintain the exposed shield 4 in a central position inside the enclosure 130.

Figure 20:
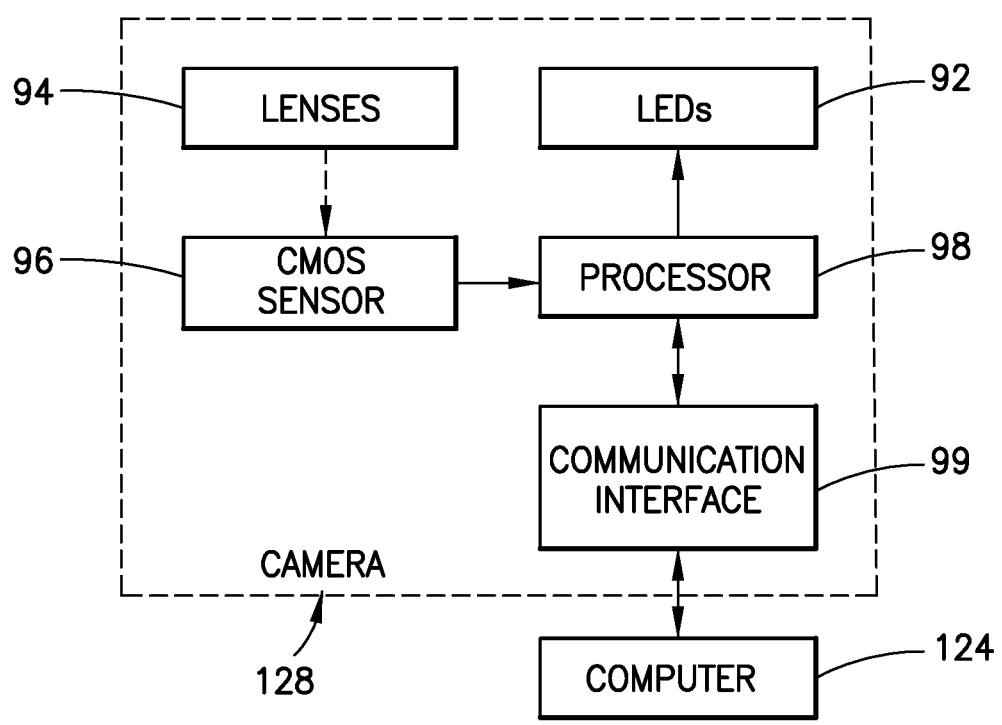
FIG. 20 is a block diagram identifying some components of a digital microscope of the type incorporated in the camera system depicted in FIGS. 18A-18E.

FIG. 20 is a block diagram identifying some components of a digital microscope of a type suitable for use in the camera system 122. The components identified in FIG. 20 include a ring of light-emitting diodes 92 (hereinafter "LED array 92), a combination of objective and ocular lenses 94 (hereinafter "lenses 94"), and a complementary metal-oxide-semiconductor (CMOS) image sensor 96 (hereinafter "CMOS sensor 96"). Light returned from a mirror passes through the lenses 94 and impinges on the CMOS sensor 96. The CMOS sensor 96 is an active-pixel sensor in the form of an array of sensor elements (hereinafter "pixel elements"). Each pixel element has a photodetector and an active amplifier. The CMOS sensor 96 converts the impinging light into a multiplicity of streams of electrical signals representing pixel data from respective pixel elements of the array. Different sides of the cable 10 are imaged by different digital microscopes. To align the images seen by each digital microscope, the CMOS sensor 96 for each digital microscope may comprise a rectangular array of pixel elements, the arrays being oriented such that each array is oriented at approximately 60 degrees with respect to adjacent arrays.

The camera 128 further includes a processor 98 that coordinates the operation of the other camera components. For example, the processor 98 is configured to activate the LED array 92 and then receive pixel data from the CMOS sensor 96. The processor 98 formats the pixel data to comply with the requirements of a communication interface 99 (e.g., a universal serial bus (USB) interface) and then sends that pixel data to the computer 124 via the communication interface 99. The computer 124 includes machine vision algorithms for automatically inspecting the images acquired by the camera(s) 128 and outputting quality information for the cable segments based on the inspection.

Figure 22:
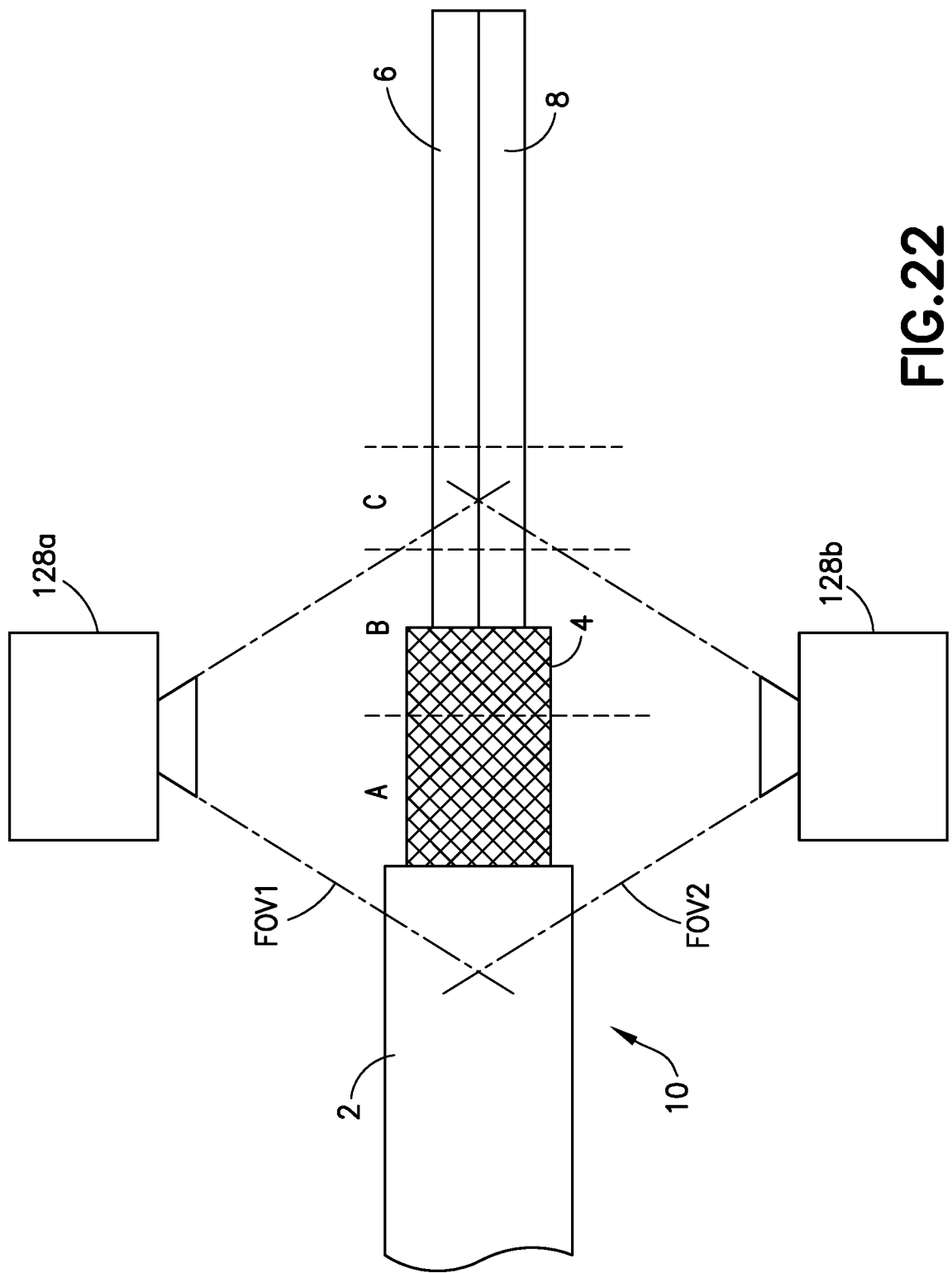
FIG. 22 is a diagram representing a side view of a camera system without mirrors in accordance with another embodiment.

FIG. 22 is a diagram representing a side view of a camera system without mirrors in accordance with another embodiment. The camera system includes light sources (not shown) and at least two cameras 128a and 128b having respective fields of view FOV1 and FOV2. One side of the portion of cable 10 that includes the exposed shield 4 is within the field of view FOV1, while the other side of the same portion of the cable 10 is within the field of view FOV2. FOV1 and FOV2, in combination, provide a nearly full peripheral view of the shield 4 for inspection. Although FIG. 22 shows two cameras 128a and 128b disposed on opposite sides of the exposed shield 4, more than two cameras or an enough number of cameras may be distributed following a predetermined pattern such as equi-angular intervals around the exposed shield 4, to capture images at different FOVs of the shield 4, wherein a full peripheral view of the shield 4 is captured by the totality of the combined images captured by the different FOVs. Such a system may use either one of the two of the pixel-based image analysis algorithms depicted in FIGS. 15A and 15B.

In the case of the algorithm depicted in FIG. 15B, which looks for the colors of the insulation of the wires 6 and 8, the cameras 128a and 128b should not have exteriors that include the same colors to avoid confusing pixels acquired from an opposing camera with pixels acquired from a wire, if they happen to show same or similar colors.

Steps may be taken to prevent the light sources from directly illuminating the opposing cameras. Thus the cameras should be poorly lit compared to the light reflecting from the wires. If the lights for a given camera are within the field of view of other cameras, then the cameras could each take pictures at different times and only flash on one set of lights for each camera. Or, the lights may be located out of the field of view of all cameras.

In addition, the vision system may be restricted to only analyze the portions of the image that are near the center of the cable (e.g., the central 80% of the cable diameter or width). In the alternative, the cameras 128a and 128b may be positioned such that one camera cannot see the other camera in the region where the wires 6 and 8 are exposed, or other backgrounds Further, in some implementations, polarizing filters may be used with the light sources and/or cameras described herein to facilitate minimizing direct reflections off of relatively shiny surfaces. For example, in some implementations, a light source and/or camera may include a pair of polarizing filters arranged normal with respect to each other such that spectral highlights reflected from relatively shiny wire and/or contact surfaces on a cable segment are cross polarized and canceled out before an image is acquired by the camera. Polarizers may be used to cross polarize spectral highlights for each camera/light source/mirror optical path.

Figure 21:
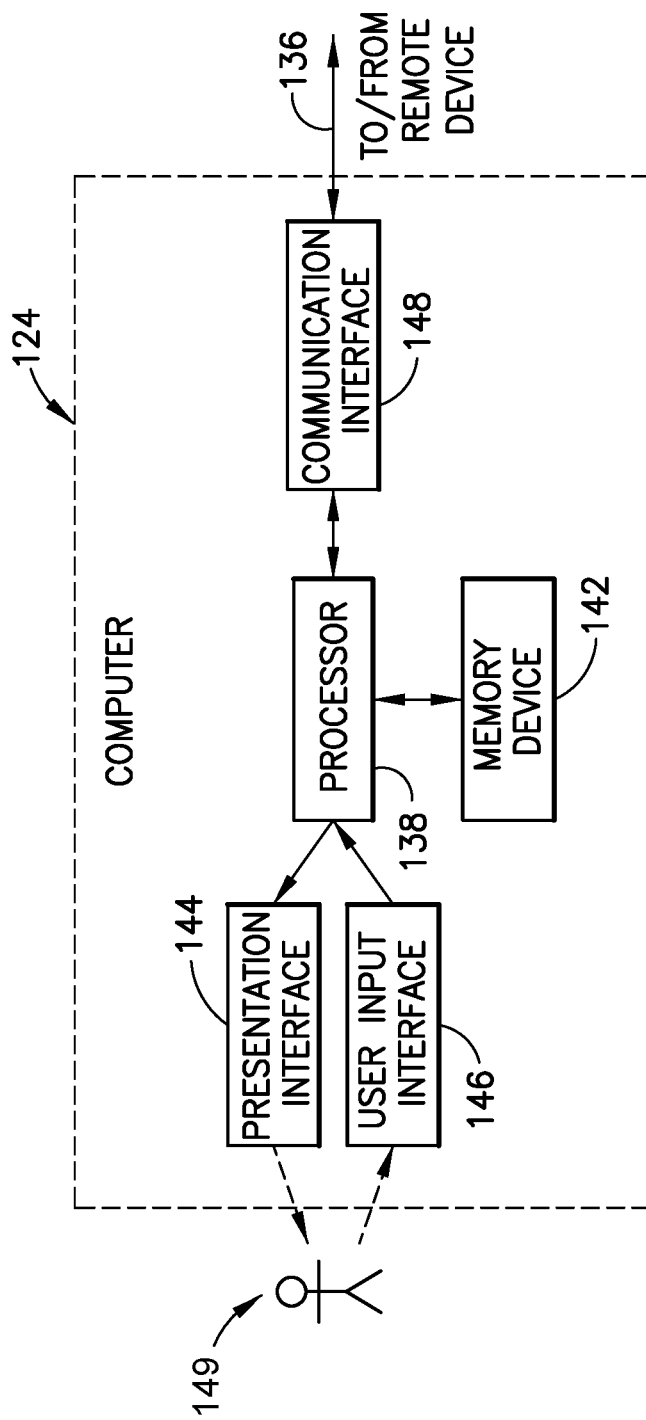
FIG. 21 is a block diagram identifying some components of a computing device that may be used to perform the shield trim evaluation functions (including image analysis) disclosed herein.

FIG. 21 is a block diagram of a computer 124 that may be used with the implementations described herein. The computer 124 includes at least one memory device 142 and a processor 138 that is coupled to memory device 142 for executing instructions. In some implementations, executable instructions are stored in memory device 142. In the example implementation, computer 124 may be configured to perform one or more operations described herein by programming processor 138. For example, processor 138 may be programmed by encoding an operation as one or more executable instructions and by providing the executable instructions in memory device 142.

Processor 138 may include one or more processing units (e.g., in a multi-core configuration). Further, processor 138 may be implemented using one or more heterogeneous processor systems in which a main processor is present with secondary processors on a single chip. In another illustrative example, processor 138 may be a symmetric multi-processor system containing multiple processors of the same type. Further, processor 138 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein.

In the example implementation, memory device 142 is one or more devices that enable information such as executable instructions and/or other data to be stored and retrieved. Memory device 142 may include one or more computer readable media, such as, without limitation, dynamic random access memory (DRAM), static random access memory (SRAM), a solid state disk, and/or a hard disk. Memory device 142 may be configured to store, without limitation, application source code, application object code, source code portions of interest, object code portions of interest, configuration data, execution events and/or any other type of data.

In the example implementation, computer 124 includes a presentation interface 144 that is coupled to processor 138. Presentation interface 144 presents information to an operator 149. For example, presentation interface 144 may include a display adapter (not shown) that may be coupled to a display device, such as a cathode ray tube (CRT), a liquid crystal display (LCD), an organic LED (OLED) display, and/or an "electronic ink" display. In some implementations, presentation interface 144 includes one or more display devices.

In the example implementation, computer 124 includes a user input interface 146. User input interface 146 is coupled to processor 138 and receives input from operator 149. User input interface 146 may include, for example, a keyboard, a pointing device, a mouse, a stylus, a touch sensitive panel (e.g., a touch pad or a touch screen), a gyroscope, an accelerometer, a position detector, and/or an audio user input interface. A single component, such as a touch screen, may function as both a display device of presentation interface 144 and user input interface 146.

Computer 124, in the example implementation, includes a communication interface 148 coupled to processor 138. Communication interface 148 communicates with one or more remote devices, e.g., digital microscopes. To communicate with remote devices, communication interface 148 may include, for example, a wired network adapter, a wireless network adapter, and/or a mobile telecommunications adapter.

In accordance with one embodiment, the method for evaluating a shield trim on a shielded cable includes the following steps: inserting the end of the cable 10 into the enclosure 130; illuminating the portion of cable 10 to be inspected using a light source, and acquiring a plurality of images using digital microscopes. The acquired images are analyzed using a computing device, such as computer 124, using machine vision algorithms. Specifically, in the exemplary implementation, the images are analyzed to assess the quality of the shield trim. To analyze the acquired images, any suitable image analysis technique may be implemented. In the exemplary implementation, each image is analyzed separately.

For example, in one implementation, the computing device may identify portions of the image that have a silver color (or pixel data representing light reflected by a shield) and categorize those portions as corresponding to an exposed shield. By determining the portions of the image that include a silver coloration, the dimensions (e.g., length and diameter) of the exposed shield can be calculated to determine whether the exposed shield has the appropriate length, diameter, etc.

In another implementation, the computing device may analyze the image to determine whether portions of the wire segment fall outside of a predetermined boundary, or perimeter. This may facilitate identifying stray portions. In yet another implementation, the computing device compares the acquired image to a reference image to assess the shield trim quality. In some embodiments, based on the analysis, the computing device outputs a notification indicating whether or not the shield trim quality is satisfactory.

Figure 23:
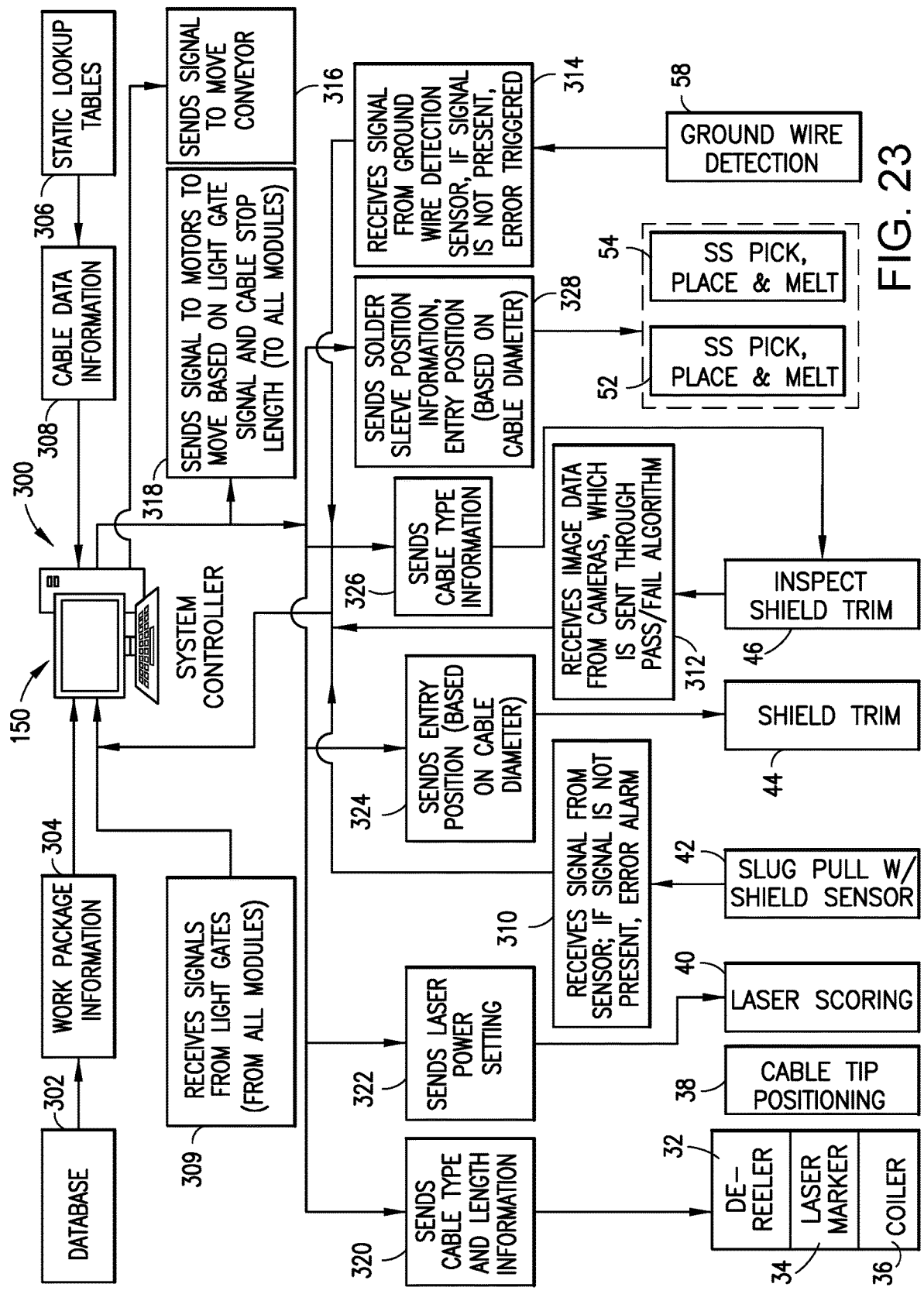
FIG. 23 is a flowchart identifying steps of a method for controlling a system having a plurality of workstations for performing a sequence of operations for installing a solder sleeve on an end of a cable in accordance with one embodiment.

The system depicted in FIG. 1 may be operated under the control of a system controller 150 (shown in FIG. 23). FIG. 23 is a flowchart identifying steps of a method 300 for controlling a system having a plurality of workstations for performing a sequence of operations for installing a solder sleeve 12 on an end of a cable 10 in accordance with one embodiment. The system controller 150 receives work packages and information 304 from a database 302 and also receives cable information 308 from static look-up tables 306. The system controller 150 parses the data and uses the information to run the system. Cables in a work package are organized by airplane effectivity, bundle number, wire type, and then group code.

The system controller 150 sends signals for controlling movements of the various components of the cable delivery system 60 (step 316). The system controller 150 also receives signals representing the states of the light gates from all modules (step 309). The system controller 150 also calculates how far the cable positioning mechanism 19 should drive the cable 10 into each module based on cable strip length information. The cable strip length is used to calculate the length of the cable that needs to be driven into each module such that the cable is processed at the correct location. The system controller 150 sends control signals to the various motor controllers (or computer in command of the motor controller) to cause the motors to move based on signals received from the various light gates and the cable strip length (step 318).

Still referring to FIG. 23, cables are sent one at a time to the de-reeler module 32 to be cut and loaded onto the system. The system controller 150 sends cable type and length information to the de-reeler module 32 (step 320). The de-reeler module 32 de-reels a continuous length of cable of the specified type and then cuts the cable to the specified length. For each length of cable 10, the laser marker 34 laser marks the outer jacket 2 of the cable 10 with pertinent information (bundle number, wire number, gauge).

In addition, the system controller 150 uses cable insulation information to select the appropriate laser setting and send it to the laser scoring module 40 (step 322). The system controller 150 also uses the cable type information to determine the correct type of solder sleeve or dead end sleeve and then sending commands to the solder sleeve installation modules 52 and 54 specifying which open-top funnel should be used (based on cable diameter) and where the solder sleeve 12 should be positioned after its removal from the prong (step 328). The same signals specifying which funnel should be used are sent to the shield trimming module 44 (step 324). In addition, the system controller sends cable type information to the shield trim inspection module 46 (step 326). Such cable information may include the distances L1 and L2 described above and the specified threshold to be used when determining whether the trimmed shield of the cable is acceptable or not (e.g., by comparing the percentage of a particular pixel color in a particular zone of the cable to such threshold as described above).

The system controller 150 is also configured to monitor the system for errors. For example, the system controller 150 receives signals from the shield sensor in the jacket slug pulling module 42 (step 310). If the signal is not present, the system controller 150 issues an error alarm. Also, the system controller 150 receives image data from cameras at the shield trim inspection module 46, which image data is processed using a pass/fail algorithm (step 312). In addition, the system controller 150 receives signals from the ground wire detection module 58 (step 314). If the signal is not present, the system controller 150 generates an error message.

The systems, methods and apparatus disclosed above may be employed in an aircraft manufacturing or maintenance method. During production, component and subassembly manufacturing and system integration of the aircraft takes place. While in service by a customer, the aircraft is scheduled for routine maintenance (which may also include modification, reconfiguration, refurbishment, and so on).

The cable processing methods disclosed herein may be performed or carried out by a system integrator, a third party, and/or an operator (e.g., a customer). For the purposes of this description, a system integrator may include without limitation any number of aircraft manufacturers and major-system subcontractors; a third party may include without limitation any number of venders, subcontractors, and suppliers; and an operator may be an airline, leasing company, military entity, service organization, and so on.

The aircraft may include an airframe (comprising, e.g., a fuselage, frames, stiffeners, wing boxes, etc.) with a plurality of systems and an interior. Examples of high-level systems include one or more of the following: a propulsion system, an electrical system, a hydraulic system, and an environmental control system. Any number of other systems having cables may be included. Although an aerospace example is shown, the principles disclosed herein may be applied to other industries, such as the automotive industry.

Apparatus and methods embodied herein may be employed during any one or more of the stages of production or maintenance. For example, cable components or subassemblies may be fabricated and/or assembled during the production process or during maintenance. Also, one or more apparatus embodiments, method embodiments, or a combination thereof may be utilized during the production stages to substantially expedite assembly of or reduce the cost of an aircraft. Similarly, one or more of apparatus embodiments, method embodiments, or a combination thereof may be utilized while the aircraft in service, for example and without limitation, during maintenance or retrofitting operations.

The implementations described herein facilitate automated inspection of cable ends having exposed shields for shield trim quality. The implementations described herein are not limited to use with cable inspection systems, but may also be used for other applications that involve optical inspection of objects from multiple directions. Further, the systems and methods described herein facilitate inspecting cable segments of multiple cable types, and can be used in conjunction any type of shield trimming apparatus.

While vision systems and methods for using a vision system to evaluate shield trims on shielded cables have been described with reference to various embodiments, it will be understood by those skilled in the art that various changes may be made and equivalents may be substituted for elements thereof without departing from the scope of the teachings herein. In addition, many modifications may be made to adapt the teachings herein to a particular situation without departing from the scope thereof. Therefore it is intended that the claims not be limited to the particular embodiments disclosed herein.

The embodiments disclosed above use one or more computer systems. As used in the claims, the term "computer system" comprises a single processing or computing device or multiple processing or computing devices that communicate via wireline or wireless connections. Such processing or computing devices typically include one or more of the following: a processor, a controller, a central processing unit, a microcontroller, a reduced instruction set computer processor, an application-specific integrated circuit, a programmable logic circuit, a field-programmable gated array, a digital signal processor, and/or any other circuit or processing device capable of executing the functions described herein. The above examples are exemplary only, and thus are not intended to limit in any way the definition and/or meaning of the term "computer system".

The methods described herein may be encoded as executable instructions embodied in a non-transitory tangible computer-readable storage medium, including, without limitation, a storage device and/or a memory device. Such instructions, when executed by a processing or computing system, cause the system device to perform at least a portion of the methods described herein.

The process claims set forth hereinafter should not be construed to require that the steps recited therein be performed in alphabetical order (any alphabetical ordering in the claims is used solely for the purpose of referencing previously recited steps) or in the order in which they are recited unless the claim language explicitly specifies or states conditions indicating a particular order in which some or all of those steps are performed. Nor should the process claims be construed to exclude any portions of two or more steps being performed concurrently or alternatively unless the claim language explicitly states a condition that precludes such an interpretation.

The invention claimed is:

1. A method for inspecting a cable segment having exposed shielding extending beyond a jacket edge and exposed wires extending beyond the exposed shielding, the method comprising:
   (a) capturing an image of the cable segment, the image including pixel data representing color information acquired from the cable segment;
   (b) processing the pixel data to extract color information from first and second inspection image areas in the image by collecting the pixel data into respective histograms having bins corresponding to respective colors of the shielding and the wires, which first and second inspection image areas correspond to Zones A and C respectively of the cable segment, wherein Zone A starts at the jacket edge of the cable segment and extends to a minimum allowable trimmed shield length which is a distance from the jacket edge and Zone C is separated from an edge of Zone A by a Zone B that extends from the minimum allowable trimmed shield length to a maximum allowable trimmed shield length;
   (c) calculating a percentage of the pixel data in the histogram for the first inspection image area which represent a color of the shielding; and
   (d) determining whether the percentage of the pixel data in the histogram for the first inspection image area which represent the color of the shielding is greater than a first specified threshold or not.

2. The method as recited in claim 1, further comprising triggering an indication that the cable segment has failed inspection if a determination is made in step (d) that the percentage of the pixel data in the histogram for the first inspection image area which represent the color of the shielding is less than the first specified threshold.

3. The method as recited in claim 1, further comprising triggering an indication that Zone A of the cable segment has passed inspection if a determination is made in step (d) that the percentage of the pixel data in the histogram for the first inspection image area which represent the color of the shielding is greater than the first specified threshold.

4. The method as recited in claim 1, further comprising:
   (e) calculating a percentage of the pixel data in the histogram for the second inspection image area which represent the color of the shielding; and
   (f) determining whether the percentage of the pixel data in the histogram for the second inspection image area which represent the color of the shielding is greater than a second specified threshold or not.

5. The method as recited in claim 4, wherein steps (e) and (f) are performed only if a determination is made in step (d) that the percentage of the pixel data in the histogram for the first inspection image area which represent the color of the shielding is greater than the first specified threshold.

6. The method as recited in claim 5, further comprising triggering an indication that the cable segment has passed inspection if a determination is made in step (f) that the percentage of the pixel data in the histogram for the second inspection image area which represent the color of the shielding is less than the second specified threshold.

7. The method as recited in claim 4, wherein the second specified threshold has a near-zero value.

8. The method as recited in claim 1, the first specified threshold has a maximum allowable gap value.

9. The method as recited in claim 1, wherein steps (a) through (d) are performed multiple times with different views of the cable segment, the method further comprising triggering an indication that the cable segment has failed inspection if a determination is made in any one of the multiple steps (d) that the percentage of the pixel data in the histogram for the first inspection image area which represent the color of the shielding is less than the first specified threshold.

10. The method as recited in claim 1, wherein the image captured in step (a) is formed by stitching together multiple images captured with different views of the cable segment.

11. A system for processing a cable comprising:
   a cable delivery system for delivering a cable segment having exposed shielding and wires that pass through the exposed shielding;
   a shield trimming apparatus configured to automatically trim the exposed shielding;
   a camera situated downstream from the shield trimming apparatus and having a field of view which encompasses a zone of the cable segment; and
   a computer system communicatively coupled for receiving images from the camera and configured to perform the following operations:
   (a) receiving an image of the cable segment from the camera, the image including pixel data representing color information acquired from the cable;
   (b) processing the pixel data to extract color information from first and second inspection image areas in the image by collecting the pixel data into respective histograms having bins corresponding to respective colors of the shielding and the wires, which first and second inspection image areas correspond to Zones A and C respectively of the cable segment, wherein Zone A starts at the jacket edge of the cable segment and extends to a minimum allowable trimmed shield length which is a distance from the jacket edge and Zone C is separated from an edge of Zone A by a Zone B that extends from the minimum allowable trimmed shield length to a maximum allowable trimmed shield length;
   (c) calculating a percentage of the pixel data in the histogram for the first inspection image area which represent a color of the shielding; and
   (d) determining whether the percentage of the pixel data in the histogram for the first inspection image area which represent the color of the shielding is greater than a first specified threshold or not.

12. A method for inspecting a cable segment having exposed shielding and wires that pass through the exposed shielding, the method comprising:
   (a) capturing an image of the cable segment, the image including pixel data representing color information acquired from the cable segment;
   (b) processing the pixel data to extract color information from first and second inspection image areas in the image by collecting the pixel data into respective histograms having bins corresponding to respective colors of the shielding and the wires, which first and second inspection image areas correspond to Zones A and C respectively of the cable segment, wherein Zone A starts at the jacket edge of the cable segment and extends to a minimum allowable trimmed shield length which is a distance from the jacket edge and Zone C is separated from an edge of Zone A by a Zone B that extends from the minimum allowable trimmed shield length to a maximum allowable trimmed shield length;
   (c) calculating a percentage of the pixel data in the histogram for the first inspection image area which represent colors of the wires; and
   (d) determining whether the percentage of the pixel data in the histogram for the first inspection image area which represent the colors of the wires is greater than a first specified threshold or not.

13. The method as recited in claim 12, further comprising triggering an indication that the cable segment has failed inspection if a determination is made in step (d) that the percentage of the pixel data in the histogram for the first inspection image area which represent the colors of the wires is greater than the first specified threshold.

14. The method as recited in claim 12, further comprising triggering an indication that Zone A of the cable segment has passed inspection if a determination is made in step (d) that the percentage of the pixel data in the histogram for the first inspection image area which represent the colors of the wires is less than the first specified threshold.

15. The method as recited in claim 12, further comprising:
(e) calculating a percentage of the pixel data in the histogram for the second inspection image area which represent the colors of the wires; and
(f) determining whether the percentage of the pixel data in the histogram for the second inspection image area which represent the colors of the wires is greater than a second specified threshold or not.

16. The method as recited in claim 15, wherein steps (e) and (f) are performed only if a determination is made in step (d) that the percentage of the pixel data in the histogram for the first inspection image area which represent the colors of the wires is less than the first specified threshold.

17. The method as recited in claim 16, further comprising triggering an indication that the cable segment has passed inspection if a determination is made in step (f) that the percentage of the pixel data in the histogram for the second inspection image area which represent the colors of the wires is greater than the second specified threshold.

18. The method as recited in claim 14, wherein the first specified threshold has a maximum allowable gap value.

19. The method as recited in claim 12, wherein steps (a) through (d) are performed multiple times with different views of the cable segment, the method further comprising triggering an indication that the cable segment has failed inspection if a determination is made in any one of the multiple steps (d) that the percentage of the pixel data in the histogram for the first inspection image area which represent the colors of the wires is greater than the first specified threshold.

20. The method as recited in claim 12, wherein the image captured in step (a) is formed by stitching together multiple images captured with different views of the cable segment.

21. A system for processing a cable comprising:
a cable delivery system for delivering a cable segment having exposed shielding and wires that pass through the exposed shielding;
a shield trimming apparatus configured to automatically trim the exposed shielding;
a camera situated downstream from the shield trimming apparatus and having a field of view which encompasses a zone of the cable segment; and
a computer system communicatively coupled for receiving images from the camera and configured to perform the following operations:
(a) receiving an image of the cable segment from the camera, the image including pixel data representing color information acquired from the cable;
(b) processing the pixel data to extract color information from first and second inspection image areas in the image by collecting the pixel data into respective histograms having bins corresponding to respective colors of the shielding and the wires, which first and second inspection image areas correspond to Zones A and C respectively of the cable segment, wherein Zone A starts at the jacket edge of the cable segment and extends to a minimum allowable trimmed shield length which is a distance from the jacket edge and Zone C is separated from an edge of Zone A by a Zone B that extends from the minimum allowable trimmed shield length to a maximum allowable trimmed shield length;
(c) calculating a percentage of the pixel data in the histogram for the first inspection image area which represent colors of the wires; and
(d) determining whether the percentage of the pixel data in the histogram for the first inspection image area which represent the colors of the wires is greater than a specified threshold or not.

22. The system as recited in claim 21, further comprising an optically transparent tube located in to receive at least a portion of the cable segment.

23. The system as recited in claim 21, further comprising an optically transparent tube located in the field of view of the camera and configured to receive and hold at least a portion of the cable segment during an inspection procedure.

24. The method as recited in claim 12, further comprising inserting at least a portion of the cable segment to be inspected in an optically transparent tube located in the field of view of the camera.

* * * * *